US008612835B2

(12) United States Patent
Yokokawa

(10) Patent No.: US 8,612,835 B2
(45) Date of Patent: Dec. 17, 2013

(54) CYCLIC SHIFT DEVICE, CYCLIC SHIFT METHOD, LDPC DECODING DEVICE, TELEVISION RECEIVER, AND RECEPTION SYSTEM

(75) Inventor: Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 424 days.

(21) Appl. No.: 13/119,352

(22) PCT Filed: Oct. 8, 2009

(86) PCT No.: PCT/JP2009/067529
§ 371 (c)(1),
(2), (4) Date: Mar. 16, 2011

(87) PCT Pub. No.: WO2010/041700
PCT Pub. Date: Apr. 15, 2010

(65) Prior Publication Data
US 2011/0191650 A1  Aug. 4, 2011

(30) Foreign Application Priority Data

Oct. 8, 2008 (JP) ................ P2008-261504

(51) Int. Cl.
*H03M 13/00* (2006.01)
(52) U.S. Cl.
USPC ........................................ 714/781; 714/758
(58) Field of Classification Search
USPC ................................................. 714/781, 758
See application file for complete search history.

(56) References Cited

U.S. PATENT DOCUMENTS

| 7,299,397 | B2* | 11/2007 | Yokokawa et al. | 714/752 |
| 7,318,186 | B2* | 1/2008 | Yokokawa et al. | 714/758 |
| 2005/0240853 | A1* | 10/2005 | Yokokawa et al. | 714/752 |
| 2005/0278604 | A1* | 12/2005 | Yokokawa et al. | 714/758 |
| 2007/0001981 | A1 | 1/2007 | Tahata | |
| 2008/0198843 | A1 | 8/2008 | Lee et al. | |
| 2008/0243974 | A1 | 10/2008 | Paumier et al. | |
| 2010/0131819 | A1* | 5/2010 | Graef | 714/752 |

FOREIGN PATENT DOCUMENTS

| JP | 2004-343170 | 12/2004 |
| JP | 2007-10894 | 1/2007 |
| JP | 2009-100423 | 5/2009 |

OTHER PUBLICATIONS

Apr. 25, 2013, Japanese Office Action for related application No. JP 2008-261504.
Rovini et al., A Minimum-Latency Block-Serial Architecture of a Decoder for IEEE 802.11N LDPC Codes, Department of Information Engineering, University of Pisa, Pisa, Italy, 2007.
Liu et al, Multi-Mode Message Passing Switch Networks Applied for QC-LDPC Decoder, Department of Electrical Engineering, National Tsing-Hua University/Department of Electronics Engineering, National Chiao-Tung University, Taiwan, ROC, 2008.
Oh et al., Area Efficient Controller Design of Barrel Shifters for Reconfigurable LDPC Decoders, Department of Electrical and Computer Engineering, University of Minnesota, Minneapolis, MN, 2008.
Liu et al., An LDPC Decoder Chip Based on Self-Routing Network for IEEE 802.16E Applications IEEE Journal of Solid-State Circuits, vol. 43, No. 3, Mar. 2008.
Feb. 1, 2013, EPO Communication for related application No. EP 09 81 9234.

* cited by examiner

*Primary Examiner* — Joseph D Torres
(74) *Attorney, Agent, or Firm* — Sherr & Jiang, PLLC

(57) ABSTRACT

The present invention relates to using a barrel shifter in a cyclic shift device for an LDPC decoding device, a television receiver, and/or a reception system, whereby reduction in size of the device can be realized.

12 Claims, 24 Drawing Sheets

FIG. 4

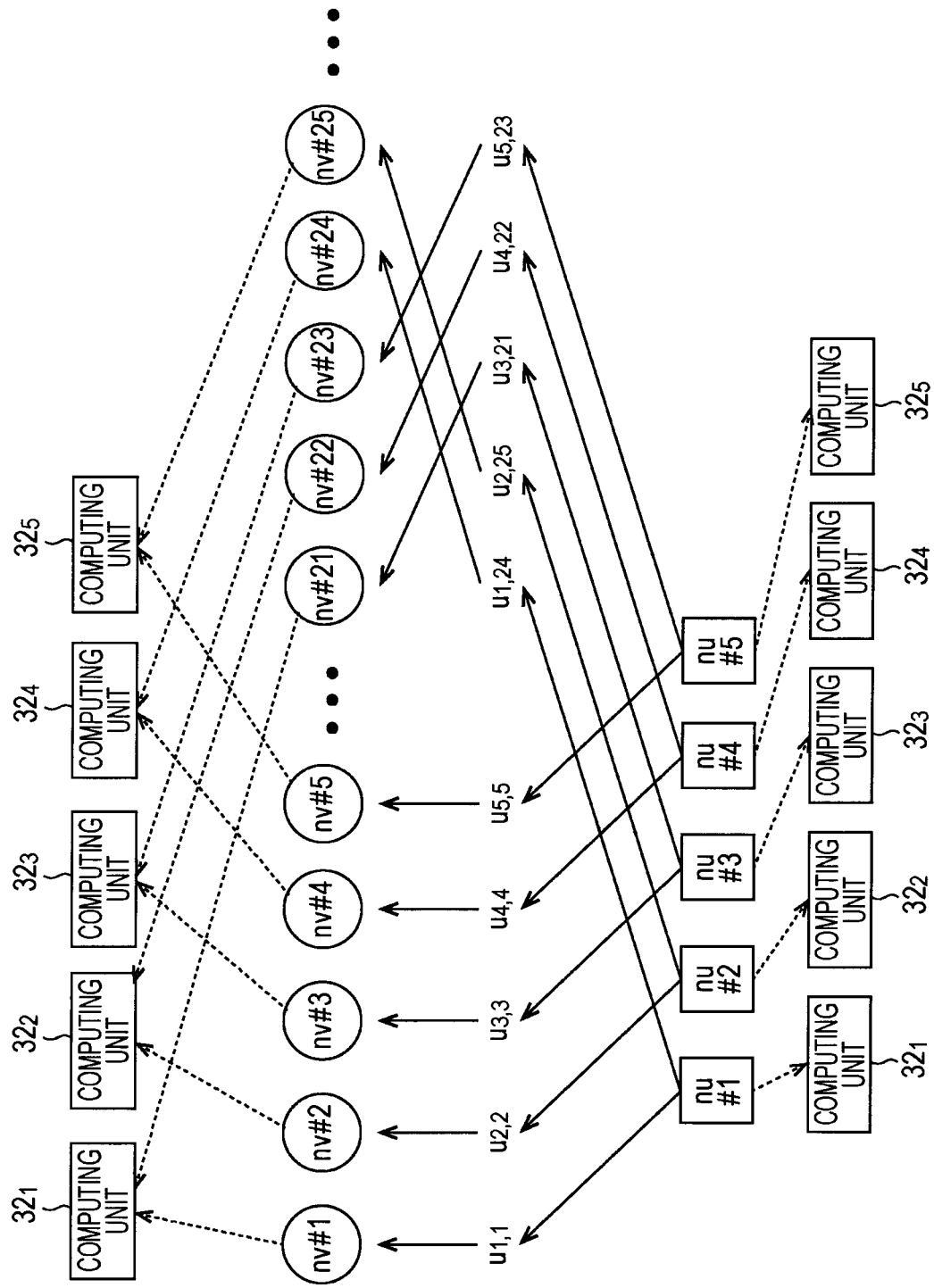

FIG. 6

| | P | NUMBER OF BITS OF MESSAGE | NUMBER OF BITS OF ONE WORD | MAXIMUM NUMBER OF BRANCHES | NUMBER OF WORDS OF ALL MESSAGES OBTAINED AT NODE CALCULATION WHEN THE NUMBER OF BRANCHES IS THE MAXIMUM | MAXIMUM CODE LENGTH | NUMBER OF WORDS OF ONE CODE WORTH OF RECEIVED VALUES WHEN CODE LENGTH IS THE MAXIMUM | NUMBER OF WORDS OF DATA NEEDED FOR DECODING |
|---|---|---|---|---|---|---|---|---|
| DVB-S2 | 360 | 5 BITS | 1800 (=360 X 5) BITS | 360 X 792 – 1 BRANCHES | 792 WORDS | 64800 BITS | 180 (= 64800 X 5 / 1800) WORDS | 972 (= 792 + 180) WORDS |
| HIGHLY ADVANCED BS | 374 | 5 BITS | 1870 (=374 X 5) BITS | 374 X 435 – 1 BRANCHES | 435 WORDS | 44880 BITS | 120 (= 44800 X 5 / 1870) WORDS | 555 (= 435 + 120) WORDS |

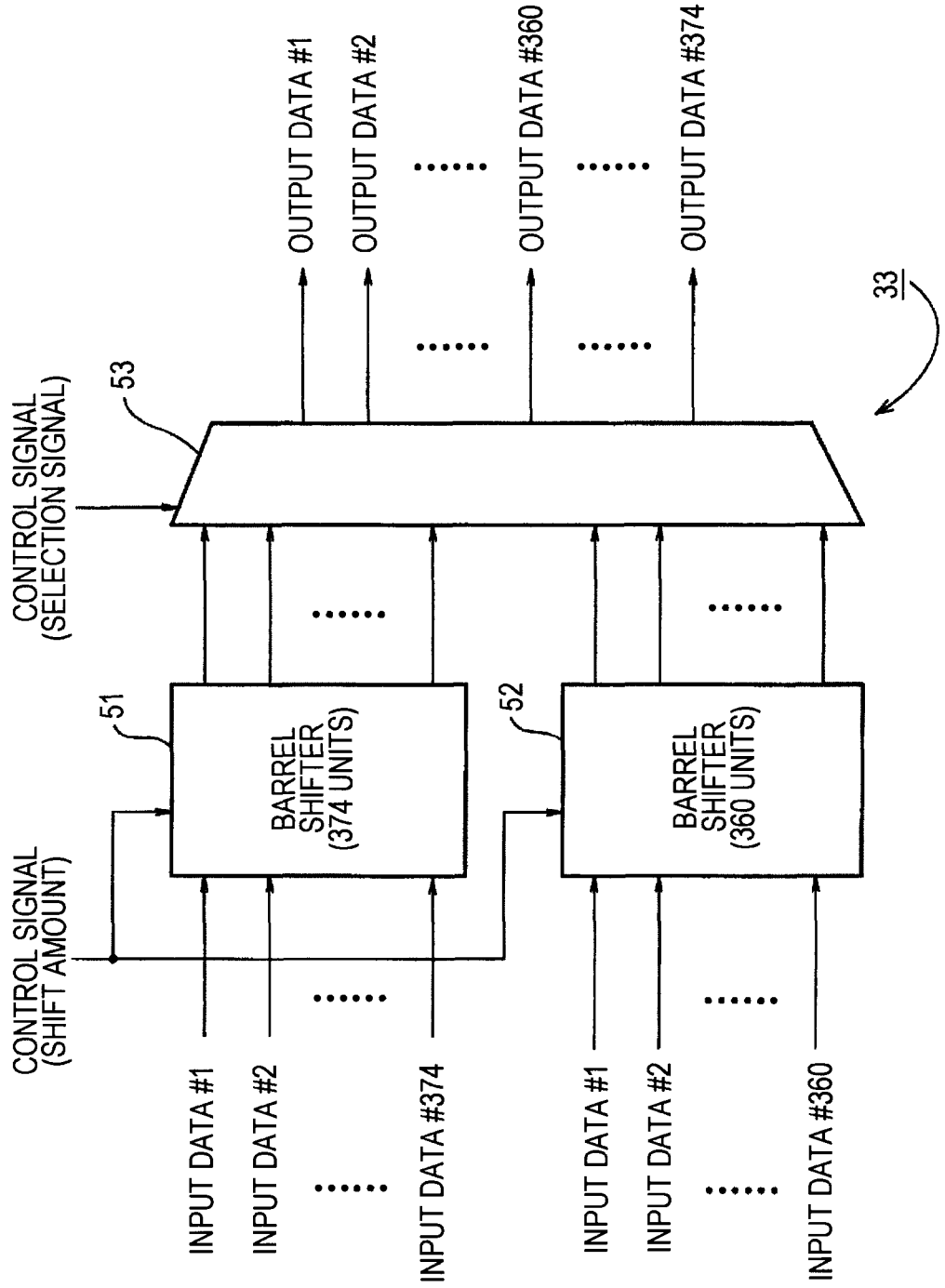

FIG. 13

| | 0 | 1 | 2 | 3 | 4 | ... | N-5 | N-4 | N-3 | N-2 | N-1 |
|---|---|---|---|---|---|---|---|---|---|---|---|
| b2 | 0 | 0 | 0 | 0 | 0 | ... | 0 | 0 | 0 | 0 | 1 |
| b3 | 0 | 0 | 0 | 0 | 0 | ... | 0 | 0 | 0 | 1 | 1 |
| b4 | 0 | 0 | 0 | 0 | 0 | ... | 0 | 0 | 1 | 1 | 1 |
| b5 | 0 | 0 | 0 | 0 | 0 | ... | 0 | 1 | 1 | 1 | 1 |
| b6 | 0 | 0 | 0 | 0 | 0 | ... | 1 | 1 | 1 | 1 | 1 |
| ... | ... | ... | ... | ... | ... | ... | ... | ... | ... | ... | ... |
| $b_{N-4}$ | 0 | 0 | 0 | 0 | 0 | ... | 1 | 1 | 1 | 1 | 1 |
| $b_{N-3}$ | 0 | 0 | 0 | 0 | 1 | ... | 1 | 1 | 1 | 1 | 1 |
| $b_{N-2}$ | 0 | 0 | 0 | 1 | 1 | ... | 1 | 1 | 1 | 1 | 1 |
| $b_{N-1}$ | 0 | 0 | 1 | 1 | 1 | ... | 1 | 1 | 1 | 1 | 1 |
| $b_N$ | 0 | 1 | 1 | 1 | 1 | ... | 1 | 1 | 1 | 1 | 1 |

SELECTION CONTROL SIGNAL (N − 1 BITS)

SHIFT AMOUNT k

CONVERSION TABLE

FIG. 20

A SHIFT AMOUNT k

SELECTION CONTROL SIGNAL

| k | $c\_2$ | $c\_3$ | $c\_4$ | $c\_5$ | $c\_6$ |
|---|---|---|---|---|---|
| 0 | 0 | 0 | 0 | 0 | 0 |
| 1 | 0 | 0 | 0 | 0 | 1 |
| 2 | 0 | 0 | 0 | 1 | 1 |
| 3 | 0 | 0 | 1 | 1 | 1 |
| 4 | 0 | 1 | 1 | 1 | 1 |
| 5 | 1 | 1 | 1 | 1 | 1 |

B SHIFT AMOUNT k

SELECTION CONTROL SIGNAL

| k | $c\_2$ | $c\_3$ | $c\_4$ | $c\_5$ | $c\_6$ |
|---|---|---|---|---|---|
| 0 | 0 | 0 | 0 | 0 | × |
| 1 | 0 | 0 | 0 | 2 | × |
| 2 | 0 | 0 | 2 | 2 | × |
| 3 | 0 | 2 | 2 | 2 | × |
| 4 | 2 | 2 | 2 | 2 | × |

C SHIFT AMOUNT k

SELECTION CONTROL SIGNAL

| k | $c\_2$ | $c\_3$ | $c\_4$ | $c\_5$ | $c\_6$ |
|---|---|---|---|---|---|
| 0 | 0 | 0 | 0 | × | × |
| 1 | 0 | 0 | 3 | × | × |
| 2 | 0 | 3 | 3 | × | × |
| 3 | 3 | 3 | 3 | × | × |

|   | ① | ② | ③ | ④ | ⑤ | ⑥ |
|---|---|---|---|---|---|---|
| 1 | 0 | 1 | 0 | 0 | 0 | 0 |
| 2 | 0 | 0 | 1 | 0 | 0 | 0 |
| 3 | 0 | 0 | 0 | 1 | 0 | 0 |
| 4 | 0 | 0 | 0 | 0 | 1 | 0 |
| 5 | 0 | 0 | 0 | 0 | 0 | 1 |
| 6 | 1 | 0 | 0 | 0 | 0 | 0 |

B

|   | ① | ③ | ⑤ | ② | ④ | ⑥ |
|---|---|---|---|---|---|---|
| 1 | 0 | 0 | 0 | 1 | 0 | 0 |
| 3 | 0 | 0 | 0 | 0 | 1 | 0 |
| 5 | 0 | 0 | 0 | 0 | 0 | 1 |
| 2 | 0 | 1 | 0 | 0 | 0 | 0 |
| 4 | 0 | 0 | 1 | 0 | 0 | 0 |
| 6 | 1 | 0 | 0 | 0 | 0 | 0 |

C

|   | ① | ④ | ② | ⑤ | ③ | ⑥ |
|---|---|---|---|---|---|---|
| 1 | 0 | 0 | 1 | 0 | 0 | 0 |
| 4 | 0 | 0 | 0 | 1 | 0 | 0 |
| 2 | 0 | 0 | 0 | 0 | 1 | 0 |
| 5 | 0 | 0 | 0 | 0 | 0 | 1 |
| 3 | 0 | 1 | 0 | 0 | 0 | 0 |
| 6 | 1 | 0 | 0 | 0 | 0 | 0 |

US 8,612,835 B2

CYCLIC SHIFT DEVICE, CYCLIC SHIFT METHOD, LDPC DECODING DEVICE, TELEVISION RECEIVER, AND RECEPTION SYSTEM

TECHNICAL FIELD

The present invention relates to a cyclic shift device, a cyclic shift method, an LDPC decoding device, a television receiver, and a reception system, and specifically relates to a cyclic shift device, a cyclic shift method, an LDPC decoding device, a television receiver, and a reception system, whereby reduction in size of a device can be realized.

BACKGROUND ART

There is a barrel shifter serving as a cyclic shift device which is hardware for performing cyclic shift (rotation) to cyclically shift parallel data made up of a plurality of data.

Now, data making up parallel data serving as an object of cyclic shift will be referred to as input data, and data that the barrel shifter outputs by cyclically shifting a plurality of data making up the parallel data will be referred to as shift data.

For example, with a barrel shifter for performing cyclic shift of M units that is a predetermined integer, parallel data serving as M pieces of input data #1, 2, . . . , #M is cyclically shifted by shift amount k specified from the outside or the like, and M pieces of shift data #1, 2, . . . , #M are output as a result of cyclic shift thereof.

Specifically, now, if we say that, with the barrel shifter, cyclic shift is performed in the direction of the head of the input data #1, 2, . . . #M, according to the cyclic shift of the shift amount k, input data #k+1, . . . , #M, 1, 2, . . . , #k are output as shift data #1, 2, . . . , #M.

Cyclic shift such as described above is needed for decoding of LDPC (Low Density Parity Check) code (e.g., see PTL 1), variable length decoding, and so forth, for example.

Also, in the event that input data #m is one bit, according to cyclic shift, bit operations such as multiplication, and others can be performed with M-bit data as an object.

CITATION LIST

Patent Literature

PTL 1: Japanese Unexamined Patent Application Publication No. 2004-343170

SUMMARY OF INVENTION

Technical Problem

As described above, in the event of performing cyclic shift of the M pieces of the input data #1 through #M, a barrel shifter for performing cyclic shift of M units (hereafter, also referred to as "barrel shifter of M units") is needed.

Accordingly, in the event of performing cyclic shift of N pieces of input data #1, 2, . . . #N with the N pieces differing from the M pieces, a barrel shifter of N units is needed.

As described above, in the event of performing cyclic shift of the M pieces of the input data #1 through #M (hereafter, also referred to as "cyclic shift of M units"), and cyclic shift of the N pieces of the input data #1 through #N, separate barrel shifters are needed. Accordingly, in order to perform both of cyclic shift of the M pieces of the input data #1 through #M, and cyclic shift of the N pieces of the input data #1 through #N, a cyclic shift device is needed to be configured of a barrel shifter of M units, and a barrel shifter of N units, so the device increases in size.

The present invention has been made in light of such a situation, and its object is to realize reduction in size of a device.

Solution to Problem

A cyclic shift device or cyclic shift method serving as a first aspect of the present invention is a cyclic shift device or cyclic shift method, with the cyclic shift device including: a barrel shifter configured to perform cyclic shift of M units for cyclically shifting parallel data made up of M pieces of input data to output M pieces of shift data; and a selecting circuit configured to select the M pieces of shift data that the barrel shifter outputs, as M pieces of output data obtained by cyclically shifting the M pieces of input data; with a case of cyclically shifting the parallel data made up of N pieces of the input data smaller than the M pieces of input data by shift amount k less than the N, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

With the first aspect as described above, a barrel shifter performs cyclic shift of M units for cyclically shifting parallel data made up of M pieces of input data to output M pieces of shift data, and a selecting circuit selects the M pieces of shift data that the barrel shifter outputs, as M pieces of output data obtained by cyclically shifting the M pieces of input data. In the event of cyclically shifting the parallel data made up of N pieces of the input data smaller than the M pieces of input data by shift amount k less than the N, the selecting circuit selects and outputs the first through N−k'th shift data from the head in the direction of cyclic shift that the barrel shifter performs, as the first through N−k'th output data, and selects and outputs the N−k+1+(M−N) through N+(M−N)'th shift data from the head in the direction of cyclic shift that the barrel shifter performs, as N−k+1 through N'th output data.

An LDPC decoding device serving as a second aspect of the present invention is an LDPC decoding device including: M computing means configured to simultaneously perform, regarding Q multiple nodes with the M being equal to or greater than the Q, the computation of a check node and the computation of a variable node for decoding LDPC (Low Density Parity Check) code; and cyclic shift means configured to cyclically shift the Q messages corresponding the Q branches obtained as a result of one of the computation of the Q check nodes, and the computation of the Q variable nodes for the other computation to be performed next; with the cyclic shift means including a barrel shifter configured to perform cyclic shift of M units for cyclically shifting parallel data made up of M pieces of input data to output M pieces of shift data, and a selecting circuit configured to select the M pieces of shift data that the barrel shifter outputs, as M pieces of output data obtained by cyclically shifting the M pieces of input data; with a case where the Q is equal to the M, the computing means output the M messages, and the parallel data made up of the M pieces of the input data is cyclically shifted with the M messages as the M pieces of the input data, the selecting circuit selecting and outputting the first through M'th shift data from the head in the direction of cyclic shift that the barrel shifter performs, as the first through M'th output data; with a case where the Q is equal to N smaller than the M, the computing means output the N messages, and the parallel data made up of the N pieces of the input data is cyclically shifted by shift amount k less than N as the N pieces of the input data, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

A television receiver serving as a third aspect of the present invention is a television receiver including: obtaining means configured to obtain transmission data including LDPC code obtained by subjecting the data of a program to at least LDPC (Low Density Parity Check) coding; and LDPC decoding means configured to decode LDPC code included in the transmission data; with the LDPC decoding means including M computing means configured to simultaneously perform, regarding Q multiple nodes with the M being equal to or greater than the Q, the computation of a check node and the computation of a variable node for decoding LDPC (Low Density Parity Check) code, and cyclic shift means configured to cyclically shift the Q messages corresponding the Q branches obtained as a result of one of the computation of the Q check nodes, and the computation of the Q variable nodes for the other computation to be performed next; with the cyclic shift means including a barrel shifter configured to perform cyclic shift of M units for cyclically shifting parallel data made up of M pieces of input data to output M pieces of shift data, and a selecting circuit configured to select the M pieces of shift data that the barrel shifter outputs, as M pieces of output data obtained by cyclically shifting the M pieces of input data; with a case where the Q is equal to the M, the computing means output the M messages, and the parallel data made up of the M pieces of the input data is cyclically shifted with the M messages as the M pieces of the input data, the selecting circuit selecting and outputting the first through M'th shift data from the head in the direction of cyclic shift that the barrel shifter performs, as the first through M'th output data; with a case where the Q is equal to N smaller than the M, the computing means output the N messages; and the parallel data made up of the N pieces of the input data is cyclically shifted by shift amount k less than N as the N pieces of the input data, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

A reception system serving as a fourth aspect of the present invention is a reception system including: a transmission path decoding processing unit configured to subject a signal obtained via a transmission path to transmission path decoding processing including at least processing for correcting an error caused at the transmission path; and an information source decoding processing unit configured to subject a signal subjected to the transmission path decoding processing to information source decoding processing including at least processing for decompressing compressed information to obtain the original information; with the signal obtained via the transmission path being a signal obtained by performing at least compression encoding for compressing information, and error correction encoding for correcting an error caused at the transmission path; with the error correction encoding including LDPC (Low Density Parity Check) coding; with the transmission path decoding processing unit including M computing means configured to simultaneously perform, regarding Q multiple nodes with the M being equal to or greater than the Q, the computation of a check node and the computation of a variable node for decoding LDPC (Low Density Parity Check) code, and cyclic shift means configured to cyclically shift the Q messages corresponding the Q branches obtained as a result of one of the computation of the Q check nodes, and the computation of the Q variable nodes for the other computation to be performed next; with the cyclic shift means including a barrel shifter configured to perform cyclic shift of M units for cyclically shifting parallel data made up of M pieces of input data to output M pieces of shift data, and a selecting circuit configured to select the M pieces of shift data that the barrel shifter outputs, as M pieces of output data obtained by cyclically shifting the M pieces of input data; with a case where the Q is equal to the M, the computing means output the M messages, and the parallel data made up of the M pieces of the input data is cyclically shifted with the M messages as the M pieces of the input data, the selecting circuit selecting and outputting the first through M'th shift data from the head in the direction of cyclic shift that the barrel shifter performs, as the first through M'th output data; with a case where the Q is equal to N smaller than the M, the computing means output the N messages, and the parallel data made up of the N pieces of the input data is cyclically shifted by shift amount k less than N as the N pieces of the input data, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

A reception system serving as a fifth aspect of the present invention is a reception system including: a transmission path decoding processing unit configured to subject a signal obtained via a transmission path to transmission path decoding processing including at least processing for correcting an error caused at the transmission path; and an output unit configured to output an image or audio based on the signal subjected to the transmission path decoding processing; with the signal obtained via the transmission path being a signal obtained by performing at least error correction encoding for correcting an error caused at the transmission path; with the error correction encoding including LDPC (Low Density Parity Check) coding; with the transmission path decoding processing unit including M computing means configured to simultaneously perform, regarding Q multiple nodes with the M being equal to or greater than the Q, the computation of a check node and the computation of a variable node for decoding LDPC (Low Density Parity Check) code, and cyclic shift means configured to cyclically shift the Q messages corresponding the Q branches obtained as a result of one of the computation of the Q check nodes, and the computation of the Q variable nodes for the other computation to be performed next; with the cyclic shift means including a barrel shifter configured to perform cyclic shift of M units for cyclically shifting parallel data made up of M pieces of input data to output M pieces of shift data, and a selecting circuit configured to select the M pieces of shift data that the barrel shifter outputs, as M pieces of output data obtained by cyclically shifting the M pieces of input data; with a case where the Q is equal to the M, the computing means output the M messages, and the parallel data made up of the M pieces of the input data is cyclically shifted with the M messages as the M pieces of the input data, the selecting circuit selecting and outputting the first through M'th shift data from the head in the direction of cyclic shift that the barrel shifter performs, as the first through M'th output data; with a case where the Q is equal to N smaller than the M, the computing means output the N messages, and the parallel data made up of the N pieces of the input data is cyclically shifted by shift amount k less than N as the N pieces of the input data, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

A reception system serving as a sixth aspect of the present invention is a reception system including: a transmission path decoding processing unit configured to subject a signal obtained via a transmission path to transmission path decoding processing including at least processing for correcting an error caused at the transmission path; and a recording unit configured to record the signal subjected to the transmission path decoding processing; with the signal obtained via the transmission path being a signal obtained by performing at least error correction encoding for correcting an error caused at the transmission path; with the error correction encoding including LDPC (Low Density Parity Check) coding; with the transmission path decoding processing unit including M computing means configured to simultaneously perform, regarding Q multiple nodes with the M being equal to or greater than the Q, the computation of a check node and the computation of a variable node for decoding LDPC (Low Density Parity Check) code, and cyclic shift means configured to cyclically shift the Q messages corresponding the Q branches obtained as a result of one of the computation of the Q check nodes, and the computation of the Q variable nodes for the other computation to be performed next; with the cyclic shift means including a barrel shifter configured to perform cyclic shift of M units for cyclically shifting parallel data made up of M pieces of input data to output M pieces of shift data, and a selecting circuit configured to select the M pieces of shift data that the barrel shifter outputs, as M pieces of output data obtained by cyclically shifting the M pieces of input data; with a case where the Q is equal to the M, the computing means output the M messages, and the parallel data made up of the M pieces of the input data is cyclically shifted with the M messages as the M pieces of the input data, the selecting circuit selecting and outputting the first through M'th shift data from the head in the direction of cyclic shift that the barrel shifter performs, as the first through M'th output data; with a case where the Q is equal to N smaller than the M, the computing means output the N messages, and the parallel data made up of the N pieces of the input data is cyclically shifted by shift amount k less than N as the N pieces of the input data, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

A reception system serving as a seventh aspect of the present invention is a reception system including: obtaining means configured to obtain a signal via a transmission path; and a transmission path decoding processing unit configured to subject a signal obtained via the transmission path to transmission path decoding processing including at least processing for correcting an error caused at the transmission path; with the signal obtained via the transmission path being a signal obtained by performing at least error correction encoding for correcting an error caused at the transmission path; with the error correction encoding including LDPC (Low Density Parity Check) coding; with the transmission path decoding processing unit including M computing means configured to simultaneously perform, regarding Q multiple nodes with the M being equal to or greater than the Q, the computation of a check node and the computation of a variable node for decoding LDPC (Low Density Parity Check) code, and cyclic shift means configured to cyclically shift the Q messages corresponding the Q branches obtained as a result of one of the computation of the Q check nodes, and the computation of the Q variable nodes for the other computation to be performed next; with the cyclic shift means including a barrel shifter configured to perform cyclic shift of M units for cyclically shifting parallel data made up of M pieces of input data to output M pieces of shift data, and a selecting circuit configured to select the M pieces of shift data that the barrel shifter outputs, as M pieces of output data obtained by cyclically shifting the M pieces of input data; with a case where the Q is equal to the M, the computing means output the M messages, and the parallel data made up of the M pieces of the input data is cyclically shifted with the M messages as the M pieces of the input data, the selecting circuit selecting and outputting the first through M'th shift data from the head in the direction of cyclic shift that the barrel shifter performs, as the first through M'th output data; with a case where the Q is equal to N smaller than the M, the computing means output the N messages, and the parallel data made up of the N pieces of the input data is cyclically shifted by shift amount k less than N as the N pieces of the input data, the selecting circuit selecting and outputting the first through N−k'th shift data from the head in the direction of cyclic shift that the barrel shifter performs, as the first through N−k'th output data, and selecting and outputting the N−k+1+(M−N) through N+(M−N)'th shift data from the head in the direction of cyclic shift that the barrel shifter performs, as N−k+1 through N'th output data.

With the second through seventh aspects as described above, in the event that the Q is equal to the M, the computing means output the M messages, and the parallel data made up of the M pieces of the input data is cyclically shifted with the M messages as the M pieces of the input data, at the selecting circuit the first through M'th shift data from the head in the direction of cyclic shift that the barrel shifter performs are selected and output as the first through M'th output data. In the event that the Q is equal to N smaller than the M, the computing means output the N messages, and the parallel data made up of the N pieces of the input data is cyclically shifted by shift amount k less than N as the N pieces of the input data, at the selecting circuit the first through N−k'th shift data from the head in the direction of cyclic shift that the barrel shifter performs are selected and output as the first through N−k'th output data, and the N−k+1+(M−N) through N+(M−N)'th shift data from the head in the direction of cyclic shift that the barrel shifter performs are selected and output as N−k+1 through N'th output data.

Advantageous Effects of Invention

According to the first through seventh aspects of the present invention, reduction in size of a device can be realized.

BRIEF DESCRIPTION OF DRAWINGS

FIG. 4 is a diagram illustrating an example of a parity check matrix of LDPC code.

FIG. 5 is a diagram for describing a reason why cyclic shift of a message obtained by node calculation is needed.

FIG. 6 is a diagram for describing the specifications of DVB-S2 and highly advanced BS.

FIG. 7 is a block diagram illustrating a first configuration example of a cyclic shift device 33.

FIG. 13 is a diagram illustrating a conversion table.

FIG. 20 is a diagram illustrating a conversion table in the event that the N is 6, and the $N_1$, $N_2$, and $N_3$ are 6, 5, and 4 respectively.

FIG. 21 is a diagram illustrating P×P configuration matrices, and P'×P' configuration matrices obtained by dividing the configuration matrices thereof.

DESCRIPTION OF EMBODIMENTS

Figure 1:
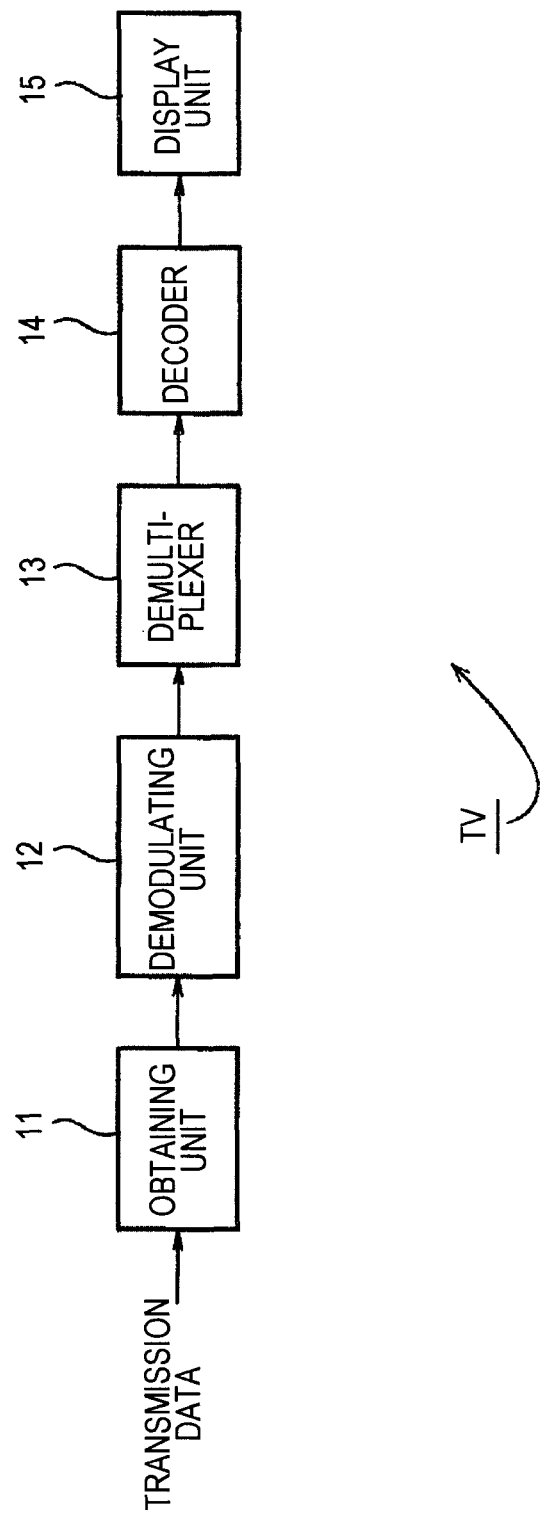
FIG. 1 is a block diagram illustrating a configuration example of an embodiment of a TV to which the present invention has been applied.

FIG. 1 is a block diagram illustrating a configuration example of an embodiment of a TV (television receiver) to which the present invention has been applied.

In FIG. 1, the TV is configured of an obtaining unit 11, a demodulating unit 12, a demultiplexer 13, a decoder 14, a display unit 15, and so forth.

The obtaining unit 11 obtains transmission data including LDPC code obtained by the data of a program being subjected to at least LDPC (Low Density Parity Check) coding, and supplies to the demodulating unit 12.

That is to say, transmission data is arranged to be transmitted at an unshown broadcast station or web server, and the obtaining unit 11 obtains the transmission data thereof.

Now, in the event that the transmission data is broadcast from a broadcast station via, for example, land broadcasts, satellite waves, a CATV (Cable Television) network, or the like, the obtaining unit 11 is configured of a tuner, STB (Set Top Box), and so forth. Also, in the event that the transmission data is transmitted, for example, by multicast from a web server such as an IPTV (Internet Protocol Television), the obtaining unit 11 is configured of a network I/F (Interface), for example, such as an NIC (Network Interface Card) or the like.

The demodulating unit 12 subjects the transmission data from the obtaining unit 11 to necessary processing such as demodulation or the like. Here, the transmission data includes LDPC code obtained by subjecting the data of a program to at least LDPC coding, as described above, so necessary processing to be performed at the demodulating unit 12 includes processing for decoding LDPC code.

The demodulating unit 12 subjects the transmission data from the obtaining unit 11 to necessary processing such as demodulation or the like to obtain, for example, a TS (Transport Stream), and supplies the TS thereof to the demultiplexer 13.

The demultiplexer 13 extracts, from the TS from the demodulating unit 12, for example, a TS packet where image data and audio data serving as the data of a program selected by a user are disposed, and supplies to the decoder 14.

The decoder 14 subjects the image data and audio data disposed in the TS packet from the demultiplexer 13 to MPEG (Moving Picture Experts Group) decoding, for example. The image data obtained as results of MPEG decoding at the decoder 14 is supplied to the display unit 15, and the audio data is supplied to an unshown speaker, and the corresponding audio is output.

The display unit 15 is configured of, for example, a liquid crystal panel or organic EL (Electro Luminescence) panel or the like, and displays an image corresponding to the image data from the decoder 14.

Next, decoding of LDPC code to be performed at the demodulating unit 12 in FIG. 1 will be described with reference to FIG. 2.

Decoding of LDPC code (LDPC decoding) is an algorithm that Gallager has named as probabilistic decoding and proposed, and can be performed by a message passing algorithm according to probability propagation (belief propagation) on what we might call a Tanner graph made up of a variable node (also referred to as "message node") and a check node. Now, hereafter, a variable node and a check node will simply be referred to as a node.

Now, the received value of each code of LPDC code of one code length will be represented as $u_{0i}$, a message output from a check node (check node message) will be represented as $u_j$, and a message output from a variable node (variable node message) will be represented as $v_i$.

Note that the received value $u_{0i}$, and messages $u_j$ and $v_i$ are real values that express "0" (or "1")-likelihood of a value using a log likelihood ratio.

Also, the suffix i of the received value $u_{0i}$, and the variable node message $v_i$ is a parameter representing a column of a parity check matrix of LDPC code (parity check matrix that defines LDPC code). Further, the suffix j of the check node message $u_j$ is a parameter representing a row of the parity check matrix of LDPC code.

With LDPC decoding, the variable node message $v_i$ is obtained by performing the calculation of a variable node (variable node calculation) shown in Expression (1) using the received value $u_{0i}$ and check node message $u_j$. Further, the check node message $u_j$ is obtained by performing the calculation of a check node (check node calculation) shown in Expression (2) using the variable node message $v_i$ obtained in Expression (1).

[Expression 1]

$$v_i = u_{0i} + \sum_{j=1}^{d_v-1} u_j \qquad (1)$$

[Expression 2]

$$\tanh\left(\frac{u_j}{2}\right) = \prod_{i=1}^{d_c-1} \tanh\left(\frac{v_i}{2}\right) \qquad (2)$$

Here, the check node message $u_j$ used for the variable node calculation of Expression (1) is initialized to "0" at the time of start of LDPC decoding of LDPC code of one code length.

Also, $d_v$ and $d_c$ in Expression (1) and Expression (2) are arbitrary selectable parameters that indicate the number of "1" (weight) equivalent to branches in the vertical direction (column direction) and the horizontal direction (row direction) of the parity check matrix respectively, and for example, in the case of (3, 6) code, $d_v=3$ and $d_c=6$ hold.

Further, with the variable node calculation of Expression (1), the message (check node message) input from a branch (edge) from which a message (variable node message) will be output is not used as the object of a sum operation ($\Sigma$ in Expression (1)), and accordingly, the range of the sum operation results in 1 through $d_v-1$.

Similarly, with the check node calculation of Expression (2), the message (variable node message) input from a branch (edge) from which a message (check node message) will be output is not used as the object of a product computation ($\Pi$ in Expression (2)), and accordingly, the range of the product computation results in 1 through $d_c-1$.

The check node calculation shown in Expression (2) can be performed by creating the table of a function $R(v1, v2)$ shown in Expression (3) that returns 1 output as to the two inputs $v1$ and $v2$ beforehand, and consecutively (recursively) using this as shown in Expression (4).

[Expression 3]

$$x = 2\tan h^{-1}\{\tan h(v_1/2)\tan h(v_2/2)\} = R(v_1, v_2) \qquad (3)$$

[Expression 4]

$$u_j = R(v_1, R(v_2, R(v_3, \ldots R(v_{d_c-2}, v_{d_c-1})))) \qquad (4)$$

With LDPC decoding, repetitive decoding is performed wherein the variable node calculation of Expression (1), and the check node calculation of Expression (2) (Expression (4)) are repeatedly performed, and when the number of times of repetition reaches a predetermined number of times, a message v serving as a decoding result finally output is obtained by performing the calculation shown in Expression (5)

[Expression 5]

$$v_i = u_{0i} + \sum_{j=1}^{d_v} u_j \qquad (5)$$

Here, the calculation of Expression (5) differs from the variable node calculation of Expression (1), and is performed using the check node messages $u_j$ from all of the branches connected to the variable node.

Figure 2:
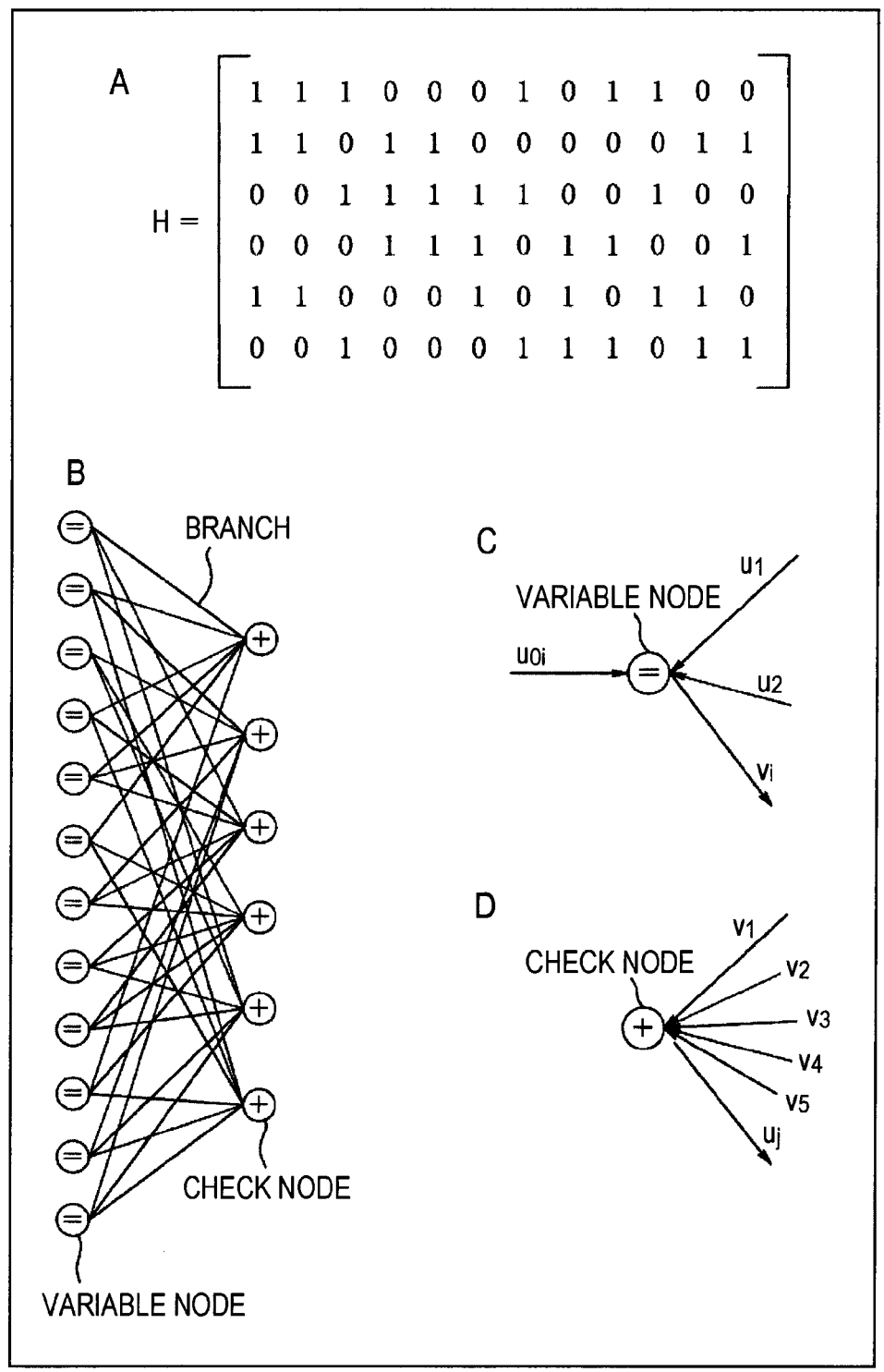
FIG. 2 is a diagram for describing LDPC decoding.

A in FIG. 2 illustrates an example of a parity check matrix of (3, 6) LDPC code (coding rate 1/2, code length 12).

The parity check matrix of LDPC code can be represented using a Tanner graph.

B in FIG. 2 illustrates the Tanner graph of the parity check matrix H in A in FIG. 2.

In B in FIG. 2, plus marks ("+") represent check nodes, and equal marks ("=") represent variable nodes.

The check nodes and variable nodes correspond to the rows and columns of the parity check matrix H, respectively. A wire connection between a check node and a variable node is a branch (edge), and is equivalent to "1" of the parity check matrix H.

Specifically, in the event that the component of the j'th row the i'th column of the parity check matrix H is 1, in B in FIG. 2, the i'th variable node from the top (node of "=") and the j'th check node from the top (node of "+") are connected by an edge. The edge represents that the code bit corresponding to the variable node has a restraint condition corresponding to the check node.

With a sum product algorithm that is one of the algorithms for LDPC decoding, as described above, the variable node calculation and the check node calculation are repeatedly performed.

C in FIG. 2 is a diagram for describing how to obtain the variable node message at a variable node.

With a variable node, the variable node message $v_i$ corresponding to a certain edge connected to the variable node thereof is obtained in accordance with Expression (1) using the check node messages $u_1$ and $u_2$ from the remaining edges connected to the variable node thereof, and the received value $u_{0i}$. The variable node message corresponding to another edge is obtained in the same way.

D in FIG. 2 is a diagram for describing how to obtain the check node message at a check node.

Expression (2) representing the check node calculation can be rewritten with Expression (6) using the relation of Expression $a \times b = \exp\{1n(|a|) + 1n(|b|)\} \times \text{sign}(a) \times \text{sign}(b)$. Note that $\text{sign}(x)$ is 1 when $x \geq 0$, and $-1$ when $x < 0$.

[Expression 6]

$$\begin{aligned}
u_j &= 2\tanh^{-1}\left(\prod_{i=1}^{d_c-1} \tanh\left(\frac{v_i}{2}\right)\right) \\
&= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\
&= 2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \text{sign}(v_i)
\end{aligned} \qquad (6)$$

With $x \geq 0$, upon $\Phi(x) = 1n(\tan h(x/2))$ being defined, $\Phi^{-1}(x) = 2\tan h^{-1}(e^{-x})$ holds, so Expression (6) is represented with Expression (7).

[Expression 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

With a check node, the check node message $u_j$ corresponding to a certain edge connected to the check node thereof is obtained in accordance with Expression (7) using the variable node messages $v_1$, $v_2$, $v_3$, $v_4$, and $v_5$ from the remaining edges connected to the check node thereof. The check node message corresponding to another edge is also obtained in the same way.

Note that the function $\Phi(x)$ can also be represented as $\Phi(x)=\ln((e^x+1)/(e^x-1))$, with x>0, $\Phi(x)=\Phi^{-1}(x)$ holds. At the time of implementing the functions $\Phi(x)$ and $\Phi^{-1}(x)$ into the hardware, implementation may be made using an LUT (Look Up Table), but the LUTs of the functions $\Phi(x)$ and $\Phi-1(x)$ are the same LUT.

Incidentally, in the event that full serial decoding is employed wherein the calculations of messages (check node message, variable node message) are sequentially performed one node at a time as an implementation method for an LDPC decoding device for performing LDPC decoding according to the sum product algorithm, the calculations of messages can be performed by only one computing unit, and accordingly, reduction in size of the device can be realized.

However, with the full serial decoding, the calculation of a message is performed one node at a time, so it takes time for obtaining the messages of all of the nodes.

With the sum product algorithm, the more repetition (repetitive decoding) of the variable check node calculation and the check node calculation is performed, the more the precision (error correction performance) of LDPC decoding improves. Accordingly, in the event that it takes time for obtaining the messages of all of the nodes, the number of times of repetitive decoding decreases, and results in deterioration in the precision of LDPC decoding.

Note that there is a method wherein multiple computing units for performing the calculation of a message are prepared, the multiple computing units thereof are serially connected, thereby increasing the number of times of repetitive decoding. However, this method causes the LDPC decoding device to increase the scale of the device thereof.

Also, in order to increase the number of times of repetitive decoding without increasing the LDPC decoding device, there is a method for performing the calculation of a message at high speed.

However, with this method, in order to somewhat increase the number of times of repetitive decoding, a computing unit which operates with extremely high-speed frequency clock is needed.

On the other hand, in the event of employing the full parallel decoding for performing the calculation of a message regarding all the nodes at the same time (in parallel) as a method for implementing the LDPC decoding device for performing LDPC decoding according to the sum product algorithm, the messages of all the nodes can be obtained in a small amount of time. Accordingly, the precision of LDPC decoding can be improved by increasing the number of times of repetitive decoding.

However, with the full parallel decoding, the computing units of which the number is proportional to code length or the like are needed, and consequently, the LDPC decoding device increases in scale.

Therefore, an LDPC decoding device for performing LDPC decoding of which the number of times of repetitive decoding is great with a suitable device scale using a computing unit which operates with suitable frequency clock has been described in the above PTL 1, for example.

With the LDPC decoding device described in PTL 1, the calculation of a node (check node calculation and variable node calculation) is performed at the same time regarding not all of the nodes but multiple Q nodes. Here, hereafter, the Q that is the number of nodes for performing calculation at the same time will also be referred to as calculation units.

With the demodulating unit 12 in FIG. 1, the LDPC decoding device for performing the calculation of a node regarding the Q nodes at the same time is built thereinto.

Figure 3:
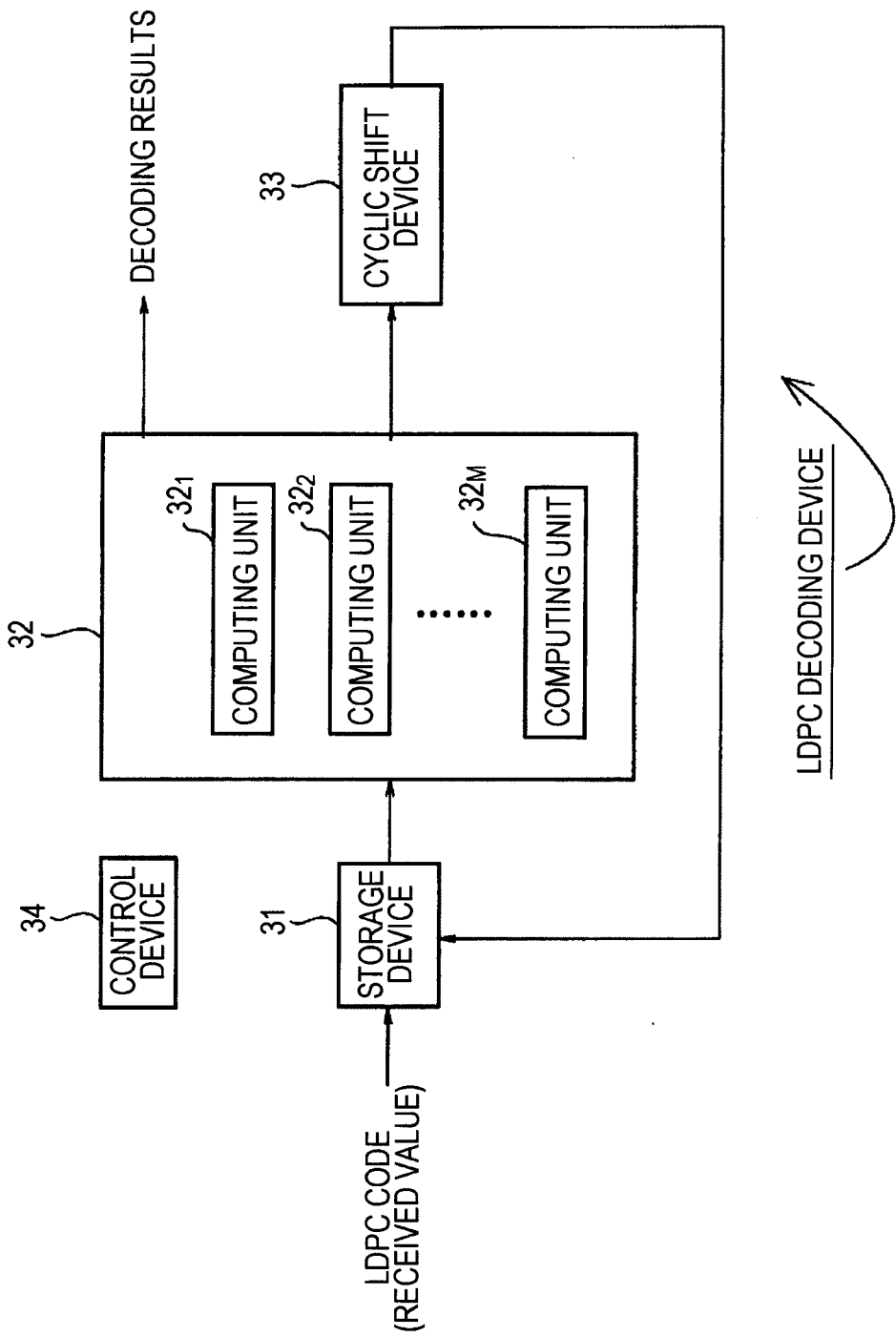
FIG. 3 is a block diagram illustrating a configuration example of an LDPC decoding device built into a demodulating unit 12.

FIG. 3 illustrates a configuration example of the LDPC decoding device which is built into the demodulating unit 12 in FIG. 1.

In FIG. 3, the LDPC decoding device is configured of a storage device 31, a computing device 32, a cyclic shift device 33, and a control device 34, and performs LDPC decoding of LDPC code included in the transmission data from the obtaining unit 11 (FIG. 1).

The storage device 31 is configured of, for example, semiconductor memory such as RAM (Random Access Memory) or the like. With the storage device 31, the received value of the LDPC code included in the transmission data from the obtaining unit 11 is supplied thereto, and also messages (variable node message, check node message) are supplied thereto from the cyclic shift device 33.

The storage device 31 temporarily storages the received value of the LDPC code and messages supplied thereto.

The received value of the LDPC code and messages stored in the storage device 31 are read out according to need, and supplied to the computing device 32.

The computing device 32 includes M (equal to or greater than Q) computing units $32_1$ through $32_M$, and one computing unit $32_m$ uses the messages and so forth from the storage device 31 to perform node calculations (check node calculation, variable node calculation) for obtaining the message regarding one node.

With the computing device 32, of the M computing units $32_1$ through $32_M$, according to the Q computing units $32_1$ through $32_Q$, a check node calculation or a variable node calculation is performed regarding the Q nodes at the same time.

With the computing device 32, upon a check node calculation or a variable node calculation being performed regarding the Q nodes at the same time, the Q messages (check node messages or variable node messages) corresponding to the Q edges are obtained.

The Q messages are supplied from the computing device 32 to the cyclic shift device 33 as one piece of parallel data.

Here, with the computing device 32, a check node calculation and a variable node calculation are alternately performed.

The cyclic shift device 33 subjects parallel data made up of the Q messages corresponding to the Q edges, obtained as results of one of the check node calculations of the Q check nodes, and the variable node calculations of the Q variable nodes, to cyclic shift for the other node calculations to be performed next. Subsequently, the cyclic shift device 33 supplies and stores the Q messages making up the parallel data after cyclic shift to the storage device 31.

The control device 34 controls the storage device 31, computing device 32, and cyclic shift device 33, which make up the LDPC decoding device in FIG. 3.

Specifically, the control device 34 performs control for specifying an address where reading/writing of a message or the like as to the storage device 31 is performed, and so forth. Also, the control device 34 performs control for specifying a node calculation (check node calculation or variable node calculation or the like) that (the computing unit 32m of) the computing device 32 should perform, and so forth. Further, the control device 34 performs control for specifying shift amount of cyclic shift performed by the cyclic shift device 33, and so forth.

With the LDPC decoding device thus configured, upon the received value of LDPC code of one code length included in the transmission data from the obtaining unit 11 being supplied to the storage device 31, the storage device 31 stores the received value of the LDPC code of one code length supplied thereto.

Upon the received value of the LDPC code of one code length being stored in the storage device 31, the received value of the LDPC code, and a check node message (that is 0 serving as the initial value, or the like at the time of start of LDPC decoding of the LDPC code of one code length) are read out as appropriate and supplied to the computing device 32.

With the computing device 32, according to the Q computing units $32_1$ through $32_Q$, the variable node calculation in Expression (1) is performed regarding the Q variable nodes at the same time using the received value and check node message from the storage device 31.

With the computing device 32, the Q variable node messages obtained by the variable node calculations being performed regarding the Q variable nodes at the same time are supplied from the computing device 32 to the cyclic shift device 33.

The cyclic shift device 33 takes the Q variable node messages from the computing device 32 as one piece of parallel data, and subjects the parallel data thereof to cyclic shift for the check node calculation to be performed next. Subsequently, the cyclic shift device 33 supplies and stores the Q variable node messages making up the parallel data after cyclic shift to the storage device 31.

As described above, by the variable node calculations being performed regarding every Q variable nodes, in the event that variable node messages are obtained regarding all the variable nodes (variable nodes of which the number is equivalent to the number of columns of the parity check matrix of LDPC code), and stored in the storage device 31, the variable node messages are read out from the storage device 31 as appropriate and supplied to the computing device 32.

With the computing device 32, according to the Q computing units $32_1$ through $32_Q$, the check node calculation in Expression (7) is performed regarding the Q check nodes at the same time using the variable node message from the storage device 31.

With the computing device 32, the Q check node messages obtained by the check node calculations being performed regarding the Q check nodes at the same time are supplied from the computing device 32 to the cyclic shift device 33.

The cyclic shift device 33 takes the Q check node messages from the computing device 32 as one piece of parallel data, and subjects the parallel data thereof to cyclic shift for the variable node calculation to be performed next. Subsequently, the cyclic shift device 33 supplies and stores the Q check node messages making up the parallel data after cyclic shift to the storage device 31.

As described above, by the check node calculations being performed regarding every Q check nodes, in the event that check node messages are obtained regarding all the check nodes (check nodes of which the number is equivalent to the number of rows of the parity check matrix of LDPC code), and stored in the storage device 31, the received value of the LDPC code, and the check node messages stored in the storage device 31 are read out as appropriate and supplied to the computing device 32.

Subsequently, hereafter, in the same way as with the above case, a variable node calculation and a check node calculation are alternately repeated.

With the LDPC decoding device, until the next received value of the LDPC code of one code length is supplied from the obtaining unit 11 (FIG. 1), the above repetitive decoding for alternately repeating a variable node calculation and a check node calculation is performed just a predetermined number of times.

Subsequently, upon repetitive decoding being performed just a predetermined number of times, the computing device 32 uses the received value of the LDPC code and the check node message stored in the storage device 31 to perform the calculation of Expression (5). Subsequently, with the computing device 32, the calculation result of the calculation of Expression (5), e.g., determination result of hard decision is output as the decoding result of the LDPC code of one code length stored in the storage device 31.

Subsequently, with the LDPC decoding device, the same processing is repeated awaiting the next received value of the LDPC code of one code length being supplied from the obtaining unit 11 (FIG. 1).

Figure 4:
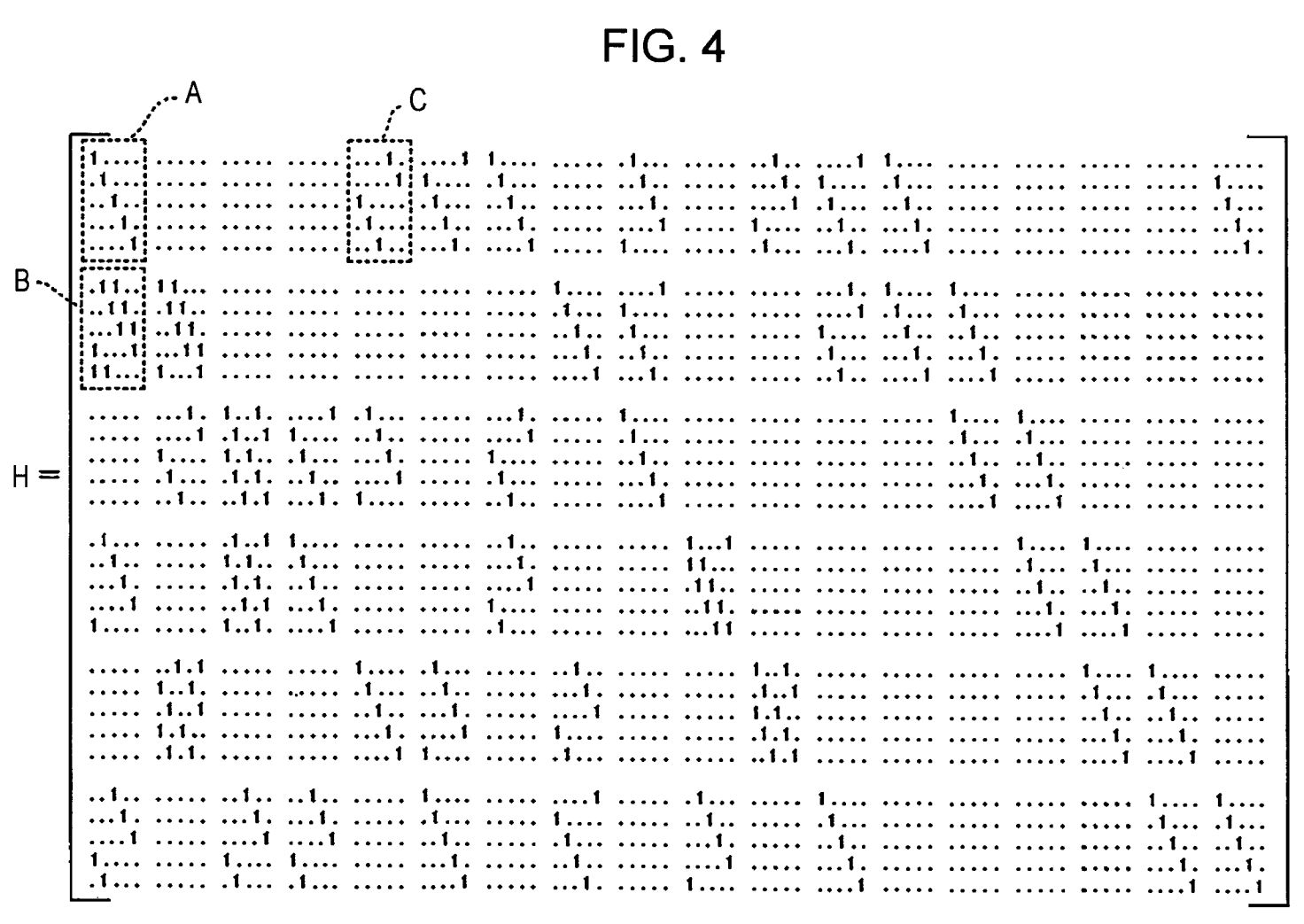

Next, FIG. 4 illustrates an example of the parity check matrix H of LDPC code that the LDPC decoding device in FIG. 3 takes as an object of LDPC decoding.

Note that the parity check matrix H in FIG. 4 is an example of a parity check matrix of which the rows×columns is 30×90 in the event that the number Q of nodes of which the messages are obtained by the computing device 32 (FIG. 3) at the same time is set to 5, and an interval is provided in increments of Q×Q, i.e., 5×5 matrices.

Also, with the parity check matrix H in FIG. 4, "0" is represented with a period (".").

In FIG. 4, the parity check matrix H is represented with a combination of a unit-based matrix of 5×5, a matrix where, of 1 of the unit-based matrix thereof, one or more is set to 0 (hereafter, referred to as "quasi-unit-based matrix"), a matrix obtained by subjecting a unit-based matrix or quasi-unit-based matrix to cyclic shift (in the row direction or column direction) (hereafter, referred to as "shift matrix" as appropriate), sum (hereafter, referred to as "sum matrix") of two or more (multiple) of a unit-based matrix, a quasi-unit-based matrix, or a shift matrix, and 0 matrix of 5×5. Note that, the LDPC code of the parity check matrix H in FIG. 4, is LDPC code of which the code rate is 2/3, and the code length is 90.

Now, if we will call the above unit-based matrix, quasi-unit-based matrix, shift matrix, sum matrix, and 0 matrix as configuration matrices, the parity check matrix H in FIG. 4 is made up of a configuration matrix.

The LDPC decoding device in FIG. 3 takes the LDPC code of the parity check matrix H made up of a configuration matrix as described above as an object for LDPC decoding. Accordingly, the LDPC code included in the transmission data that the obtaining unit 11 (FIG. 1) obtains is the LDPC code of the parity check matrix H made up of a configuration matrix.

With the LDPC decoding device in FIG. 3, messages are obtained regarding every five nodes at the same time, whereby the LDPC code of the parity check matrix H in FIG. 4 is decoded.

Specifically, for example, now, if we pay notice to five variable nodes nv#1 through nv#5 corresponding to the first column (first column from the left) through fifth column of the parity check matrix H, with the computing units $32_1$ of the computing device 32, the variable node message for the edge corresponding to "1" of the first column is obtained regarding the variable node nv#1 using the check node message from the edge corresponding to "1" of the first column.

Simultaneously, with each computing unit $32_q$ of other computing units $32_2$ through $32_5$, the variable node message for the edge corresponding to "1" of the q'th column is obtained regarding the variable node nv#q using the check node message from the edge corresponding to "1" of the q'th column.

More specifically, if we represent the j'th row the i'th column of the parity check matrix H as (j, i), with the computing units $32_1$ through $32_5$, first, five variable node messages for the edges corresponding to five "1"s of a unit-based matrix (configuration matrix) A of 5×5 of (1, 1) through (5, 5) of the parity check matrix H are obtained at the same time. Subsequently, the five variable node messages thereof are supplied to the storage device 31 via the cyclic shift device 33, and stored as one word.

Next, with the computing units $32_1$ through $32_5$, the variable node messages for the edges corresponding to "1" of a sum matrix (configuration matrix) B of 5×5 of (6, 1) through (10, 5) of the parity check matrix H are obtained at the same time.

Here, with the computing device 32, with regard to a configuration matrix of which the weight is two or more, when the configuration matrix thereof is expressed in a multiple-sum form of a unit-based matrix of Q×Q (here, 5×5), a quasi-unit-based matrix, or a shift matrix obtained by subjecting a unit-based matrix or quasi-unit-based matrix to cyclic shift, of which the weight is 1, a message is obtained for each unit-based matrix, quasi-unit-based matrix, or shift matrix, of which the weight is 1.

The sum matrix B is the sum between a first shift matrix with a weight of two, obtained by subjecting the unit-based matrix of 5×5 to cyclic shift to the right by one, and a second shift matrix obtained by subjecting to cyclic shift to the right by two.

Therefore, with the computing device 32, with regard to the sum matrix B, at the computing units $32_1$ through $32_5$, first, five variable node messages for the edges corresponding to five "1"s of the first shift matrix making up the sum matrix B are obtained at the same time. Subsequently, the five variable node messages thereof are supplied to the storage device 31 via the cyclic shift device 33 and stored as one word.

Subsequently, with the computing units $32_1$ through $32_5$, five variable node messages for the edges corresponding to five "1"s of the second shift matrix making up the sum matrix B are obtained at the same time. Subsequently, the five variable node messages thereof are supplied to the storage device 31 via the cyclic shift device 33 and stored as one word.

Hereafter, similarly, with the LDPC decoding device in FIG. 3, variable node messages for the edges corresponding to "1"s of the parity check matrix H are obtained five at a time at the same time in increments of five columns of the parity check matrix H. The five variable node messages are stored in the storage device 31 as one word.

In the way described above, upon the variable node messages for the edges corresponding to "1"s of each column being obtained regarding up to the variable node corresponding to the last five columns of the parity check matrix H (five columns of the right edge of the parity check matrix H), with the LDPC decoding device in FIG. 3, the check node messages for the edges corresponding to "1"s of the parity check matrix H are obtained five at a time at the same time in increments of five rows of the parity check matrix H using the variable node messages thereof, and the five check node messages are stored in the storage device 31 as one word.

Specifically, for example, now, if we pay notice to five check nodes nu#1 through nu#5 corresponding to the first row (first row from the top) through the fifth row of the parity check matrix H, with the computing unit $32_1$ of the computing device 32, the check node messages for the edges corresponding to "1"s of the first row are obtained regarding the check node nu#1 using the variable node messages from the edges corresponding to the "1"s of the first row.

Simultaneously, with each computing unit $32_q$ of other computing units $32_2$ through $32_5$, the check node message for the edge corresponding to "1" of the q'th row is obtained regarding the check node nu#q using the variable node message from the edge corresponding to "1" of the q'th row.

More specifically, with the computing units $32_1$ through $32_5$, first, five check node messages for the edges corresponding to five "1"s of the unit-based matrix A of 5×5 of (1, 1) through (5, 5) of the parity check matrix H are obtained at the same time. Subsequently, the five variable node messages thereof are supplied to the storage device 31 via the cyclic shift device 33, and stored as one word.

Next, with the computing units $32_1$ through $32_5$, the check node messages for the edges corresponding to "1"s of a shift matrix (configuration matrix) C from (1, 21) through (5, 25) of the parity check matrix H are obtained at the same time. Here, the shift matrix C is a matrix obtained by cyclically shifting a unit-based matrix of 5×5 to the right direction by three.

Hereafter, similarly, with the LDPC decoding device in FIG. 3, check node messages for the edges corresponding to "1"s of the parity check matrix H are obtained five at a time at the same time in increments of five rows of the parity check matrix H. The five check node messages are stored in the storage device 31 as one word.

In the way described above, upon the check node messages for the edges corresponding to "1"s of each column being obtained regarding up to the check node corresponding to the last five rows of the parity check matrix H (five rows of the lower edge of the parity check matrix H), with the LDPC decoding device in FIG. 3, variable node messages are obtained as described above using the check node messages thereof, and thereafter, the same processing is repeated by a predetermined number of times (the number of times of repetitive decoding that is determined beforehand).

Now, if we will represents a remainder γ at the time of dividing α by β as Expression γ=α mod β, the node calculation at the i'th node (the check node corresponding to the i'th row, the variable node corresponding to the i'th column) is performed at the computing unit 32q with q, represented with Expression q=(i mod Q)+1, as a suffix.

Of the LDPC decoding device in FIG. 3, with the computing device 32, as described above, messages are obtained at the same time in increments of a configuration matrix of Q×Q making up the parity check matrix H, i.e., Q messages for the edges corresponding to "1"s of the configuration matrix are obtained at the same time. Subsequently, the Q messages obtained at the same time are stored in the storage device 31 as one word.

The Q messages stored in the storage device 31 as one word are used for the next node calculation for obtaining a message, and accordingly are needed to be cyclically shifted based on "1"s of the parity check matrix H. With the LDPC decoding device in FIG. 3, the cyclic shift device 33 for cyclically shifting the Q messages obtained at the computing device 32 as parallel data, and then supplying to the storage device 31, is provided.

A reason why cyclic shift is needed will be described with reference to FIG. 5.

FIG. 5 is a diagram for describing a variable node calculation and a check node calculation regarding the parity check matrix H in FIG. 4.

Now, we will pay notice to check nodes nu#1 through nu#5 corresponding to the rows of a configuration matrix A of 5×5 of (1, 1) through (5, 5) of the parity check matrix H in FIG. 4, variable nodes nv#1 through nv#5 corresponding to the columns of the configuration matrix A thereof, and variable nodes nv#21 through nv#25 corresponding to the columns of a configuration matrix C of 5×5 of (1, 21) through (5, 25) in the same row as with the configuration matrix A of the parity check matrix H.

Here, a check node nu#j is a check node corresponding to the j'th row of the parity check matrix H, and a variable node nv#i is a variable node corresponding to the i'th column of the parity check matrix.

The check node calculation of the check node nu#j, and the variable node calculation of the variable node nv#i are performed at the computing unit $32_q$ of the computing device 32 (FIG. 3). However, q is represented with Expression q=(j mod 5)+1 regarding the check node calculation, and is represented with Expression q=(i mod 5)+1 regarding the variable node calculation.

For example, now, let us say that with the computing unit $32_1$ through $32_5$, the check node calculations of five check nodes nu#1 through nu#5 corresponding to the first row through the fifth row of the parity check matrix H has been performed, and check node messages for the edges corresponding to "1"s of the first row through fifth row have been obtained.

Now, the check node messages corresponding to "1" at the j'th row the i'th column is represented as $u_{j,i}$.

The configuration matrix A is a unit-based matrix, and check node messages for the edges corresponding to "1"s thereof are represented with $u_{1,1}$, $u_{2,2}$, $u_{3,3}$, $u_{4,4}$, and $u_{5,5}$.

Also, the configuration matrix C is a shift matrix obtained by the unit-based matrix being cyclically shifted to the right by three, the check node messages for the edges corresponding to the "1"s thereof are represented with $u_{1,24}$, $u_{2,25}$, $u_{3,21}$, $u_{4,22}$, and $u_{5,23}$.

When paying notice to the configuration matrices A and C alone, the computing unit $32_1$ performs the check node calculation of the check node nu#1 to obtain the check node message $u_{1,1}$ for the edge corresponding to "1" of the first row of the configuration matrix A, and the check node message $u_{1,24}$ for the edge corresponding to "1" of the first row of the configuration matrix C.

The computing unit $32_2$ performs the check node calculation of the check node nu#2 to obtain the check node message $u_{2,2}$ for the edge corresponding to "1" of the second row of the configuration matrix A, and the check node message $u_{2,25}$ for the edge corresponding to "1" of the second row of the configuration matrix C.

The computing unit $32_3$ performs the check node calculation of the check node nu#3 to obtain the check node message $u_{3,3}$ for the edge corresponding to "1" of the third row of the configuration matrix A, and the check node message $u_{3,21}$ for the edge corresponding to "1" of the third row of the configuration matrix C.

The computing unit $32_4$ performs the check node calculation of the check node nu#4 to obtain the check node message $u_{4,4}$ for the edge corresponding to "1" of the fourth row of the configuration matrix A, and the check node message $u_{4,22}$ for the edge corresponding to "1" of the fourth row of the configuration matrix C.

The computing unit $32_5$ performs the check node calculation of the check node nu#5 to obtain the check node message $u_{5,5}$ for the edge corresponding to "1" of the fifth row of the configuration matrix A, and the check node message $u_{5,23}$ for the edge corresponding to "1" of the fifth row of the configuration matrix C.

With the computing device 32 (FIG. 3), the check node messages $u_{1,1}$, $u_{2,2}$, $u_{3,3}$, $u_{4,4}$, and $u_{5,5}$ to the edge corresponding to "1" of the configuration matrix A are obtained by the computing units $32_1$ through $32_5$ at the same time, and stored in the storage device 31 via the cyclic shift device 33 (FIG. 3) as one word as described above.

Similarly, with the computing device 32, the check node massages $u_{1,24}$, $u_{2,25}$, $u_{3,21}$, $u_{4,22}$, and $u_{5,23}$ to the edge corresponding to "1" of the configuration matrix C are obtained by the computing units $32_1$ through $32_5$ at the same time, and stored in the storage device 31 via the cyclic shift device 33 as one word as described above.

Here, the alignment of the five check node messages $u_{1,1}$, $u_{2,2}$, $u_{3,3}$, $u_{4,4}$, and $u_{5,5}$ is represented with ($u_{1,1}$, $u_{2,2}$, $u_{3,3}$, $u_{4,4}$, and $u_{5,5}$). In this case, the alignment of the five check node messages $u_{1,24}$, $u_{2,25}$, $u_{3,21}$, $u_{4,22}$, and $u_{5,23}$ is represented with ($u_{1,24}$, $u_{2,25}$, $u_{3,21}$, $u_{4,22}$, and $u_{5,23}$).

After all of the check node messages for the edges corresponding to "1"s of the parity check matrix H are obtained, subsequently, variable node calculations for obtaining variable node messages are performed.

Specifically, now, when paying notice to the first column through the fifth column included in the configuration matrix A, the computing unit $32_1$ performs the variable node calculation of the variable node nv#1 using the check node messages from the edges corresponding to "1"s of the first column of the parity check matrix H.

Similarly, the computing unit $32_2$ performs the variable node calculation of the variable node nv#2 using the check node messages from the edges corresponding to "1"s of the second column of the parity check matrix H.

The computing unit $32_3$ performs the variable node calculation of the variable node nv#3 using the check node messages from the edges corresponding to "1"s of the third column of the parity check matrix H.

The computing unit $32_4$ performs the variable node calculation of the variable node nv#4 using the check node messages from the edges corresponding to "1"s of the fourth column of the parity check matrix H.

The computing unit $32_5$ performs the variable node calculation of the variable node nv#5 using the check node messages from the edges corresponding to "1"s of the fifth column of the parity check matrix H.

As described above, with the computing unit $32_q$ of which the suffix q is represented with Expression q=(i mod 5)+1, the variable node calculation is performed using the check node messages from the edges corresponding to "1"s of the i'th column of the parity check matrix H.

The check node messages used for a variable node calculation are stored in the storage device 31, as described above, with five check node messages as one word.

If we say that the alignment of check node messages serving as one word is represented with ($U_1$, $U_2$, $U_3$, $U_4$, $U_5$), and the computing unit $32_q$ performs a variable node calculation using the q'th check node message $U_q$ of the alignment ($U_1$, $U_2$, $U_3$, $U_4$, $U_5$) of the check node messages serving as one word, with alignment ($u_{1,1}$, $u_{2,2}$, $u_{3,3}$, $u_{4,4}$, $u_{5,5}$) of five check node messages for the edges corresponding to "1"s of the configuration matrix A serving as a unit-based matrix, as illustrated in FIG. 5, the check node message to be used for a variable node calculation at the computing unit $32_q$ is disposed at the q'th, and accordingly, the computing unit $32_q$ can perform a variable node calculation using the q'th check node of the alignment $(u_{1,1}, u_{2,2}, u_{3,3}, u_{4,4}, u_{5,5})$ of the check node messages serving as one word.

On the other hand, with alignment $(u_{1, 24}, u_{2, 25}, u_{3, 21}, u_{4, 22}, u_{5, 23})$ of five check node messages for the edges corresponding to "1"s of the configuration matrix C serving as a shift matrix obtained by cyclically shifting a unit-based matrix to the right direction by three, as illustrated in FIG. 5, check node messages to be used for a variable node calculation at the computing unit $32_q$ are disposed in a position cyclically shifted to the right direction (the last direction of the alignment $(u_{1, 24}, u_{2, 25}, u_{3, 21}, u_{4, 22}, u_{5, 23})$ of the check node messages) from the q'th by three.

Accordingly, when the computing unit $32_q$ performs a variable node calculation using the q'th check node message $U_q$ of the alignment $(U_1, U_2, U_3, U_4, U_5)$ of the check node messages serving as one word, the alignment $(u_{1, 24}, u_{2, 25}, u_{3, 21}, u_{4, 22}, u_{5, 23})$ of five check node messages for the edges corresponding to "1"s of the configuration matrix C needs to be cyclically shifted to the left direction (the head direction of the alignment $(u_{1, 24}, u_{2, 25}, u_{3, 21}, u_{4, 22}, u_{5, 23})$ of the check node messages) by three to obtain alignment $(u_{3, 21}, u_{4, 22}, u_{5, 23}, u_{1, 24}, u_{2, 25})$ of the five check node messages before the variable node calculation thereof.

In this way, so that the computing unit $32_q$ can perform a node calculation (check node calculation, variable node calculation) using the q'th message of the alignment of messages (variable node messages, check node messages) serving as one word, the cyclic shift device 33 cyclically shifts the alignment of five messages serving as one word, obtained at the computing unit $32_1$ through $32_5$ at the same time, based on "1"s of a configuration matrix (that are also "1"s of the parity check matrix H).

Incidentally, examples of the digital broadcasting specifications employing LDPC code include DVB (Digital Video Broadcasting)-S2, and the domestic next generation BS (Broadcasting Satellite) broadcasting specifications (hereafter, also referred to as "highly advanced BS").

FIG. 6 illustrates an example of LDPC code stipulated by DVB-S2 and highly advanced BS, and implementation of an LDPC decoding device for decoding each LDPC code.

Of the parity check matrix of LDPC code employed with DVB-S2 and highly advanced BS, a portion corresponding to information bits (hereafter, also referred to as information matrix) has a cyclic structure.

The cyclic structure is a structure where a certain column matches a column obtained by cyclically shifting another column, and also includes, for example, a structure where for every P columns, the positions of "1"s of each row of the P columns thereof are positions where the first (left edge) column of the P columns thereof is cyclically shifted to the column direction by a value proportional to a value obtained by dividing the parity length by the P. Hereafter, the P columns in a cyclic structure will be referred to as the number of columns serving as the units of the cyclic structure as appropriate.

Here, the parity check matrix of LDPC code employed with DVB-S2 and highly advanced BS can be taken as a matrix configured of a configuration matrix of P×P by performing replacement of rows or columns according to need.

Also, as for the number (computation units) Q of messages obtained at the computing device 32 (FIG. 3) at the same time, for example, the number P of columns serving as the units of a cyclic structure can be employed.

With regard to the number P of columns serving as the units of a cyclic structure, 360 is stipulated by DVB-S2, and 374 is stipulated by highly advanced BS.

Accordingly, in the event that the number P of columns serving as the units of a cyclic structure is employed as the computation unit Q, with the computing device 32, i.e., with the LDPC decoding device conforming to DVB-S2, 360 messages are obtained at the same time, and with the LDPC decoding device conforming to highly advanced BS, 374 messages are obtained at the same time.

The messages obtained at the computing device 32 at the same time are supplied to the storage device 31 (FIG. 3) via the cyclic shift device 33 and stored as one word.

Accordingly, for example, if five bits are employed as the number of bits of one message, with the LDPC decoding device conforming to DVB-S2, one word of the storage device 31 needs to be set to 1800 bits (=5 [bits]×Q (=P=360)). On the other hand, with the LDPC decoding device conforming to highly advanced BS, one word of the storage device 31 needs to be set to 1870 bits (=5 [bits]×Q (=P=374)).

Also, with DVB-S2, the maximum value (the maximum number of edges) of the number of edges (the number of "1"s) of a parity check matrix is P×792−1 (360×792−1), and with highly advanced BS, the maximum value of the number of edges of a parity check matrix is P×435−1 (374×435−1).

One word is Q (=P) messages worth of data, and accordingly, in the event that the LDPC code of a parity check matrix having the maximum number of edges is employed, with the LDPC decoding device conforming to DVB-S2, the number of words of all the messages obtained at an ordinary node calculation (check node calculation or variable node calculation) is 792 words.

That is to say, with the LDPC decoding device conforming to DVB-S2, 792 words are needed as the number of words for storing a message obtained from a node calculation at the storage device 31.

On the other hand, with the LDPC decoding device conforming to highly advanced BS, in the event that the LDPC code of a parity check matrix having the maximum number of edges is employed, the number of words of all the messages obtained at an ordinary node calculation is 435 words.

Accordingly, with the LDPC decoding device conforming to highly advanced BS, 435 words are needed as the number of words for storing a message obtained from a node calculation at the storage device 31.

With the storage device 31 (FIG. 3), in addition to messages obtained from a node calculation, the received value of one code length worth of LDPC code serving as a decoding object needs to be stored.

With DVB-S2, 64800 bits are stipulated as the maximum code length of LDPC code, and with highly advanced BS, 44880 bits are stipulated as the maximum code length of LDPC code.

Accordingly, with the LDPC decoding device conforming to DVB-S2, 180 words (=64800 [bits]×5 [bits]/1800 [bits/word]) are needed as the number of words for storing the received value of one code length worth of LDPC code.

Also, with the LDPC decoding device conforming to highly advanced BS, 120 words (=44880 [bits]×5 [bits]/1870 [bits/word]) are needed as the number of words for storing the received value of one code length worth of LDPC code.

According to the above, with the LDPC decoding device conforming to DVB-S2, 972 words in total of 792 words for storing a message obtained from a node calculation, and 180 words for storing the received value of LDPC code are needed as the number of words of the storage device 31, and the number of bits of one word is 1800 bits.

On the other hand, with the LDPC decoding device conforming to highly advanced BS, 555 words in total of 435 words for storing a message obtained from a node calculation, and 120 words for storing the received value of LDPC code are needed as the number of words of the storage device 31, and the number of bits of one word is 1870 bits.

In the event of performing implementation with the LDPC decoding device in FIG. 3 as for both of for DVB-S2 and for highly advanced BS, the storage device 31 and computing device 32 should make up the LDPC decoding device in accordance with greater (heavier) one of specifications necessary for each of the LDPC decoding devices conforming to DVB-S2 and highly advanced BS.

Accordingly, the storage device 31 should be configured of memory or the like which can store 972 words with one word as 1870 bits. Also, the computing unit 32 should be configured of 374 computing units $32_1$ through $32_{374}$ with the M in FIG. 3 as 374 so as to obtain 374 messages at the same time.

On the other hand, with the cyclic shift device 33, cyclic shift of 374 messages needs to be performed regarding highly advanced BS, and cyclic shift of 360 messages needs to be performed regarding DVB-S2.

Subsequently, in order to perform cyclic shift of 374 messages, a barrel shifter of 374 units is needed, and in order to perform cyclic shift of 360 messages, a barrel shifter of 360 units is needed.

Specifically, FIG. 7 illustrates a configuration example of the cyclic shift device 33 in the event that the LDPC decoding device in FIG. 3 is used for both of for DVB-S2 and for highly advanced BS.

In FIG. 7, the cyclic shift device 33 is configured of barrel shifters 51 and 52, and a selector 53.

Input data #1 through #374 serving as 374 messages obtained at the same time regarding the LDPC code conforming to highly advanced BS are supplied from the computing device 32 (FIG. 3) to the barrel shifter 51 as one piece of parallel data. Further, a control signal representing the shift amount k of cyclic shift is supplied from the control device 34 (FIG. 3) to the barrel shifter 51.

The barrel shifter 51 is a barrel shifter of 374 units, and cyclically shifts the input data #1 through #374 supplied from the computing device 32 by the shift amount k in a range of 0 through less than 374 that the control signal supplied from the control device 34 represents. Subsequently, the barrel shifter 51 supplies input data #1+k, #2+k, . . . , #374, #1, #2, . . . , #k after cyclic shift thereof to the selector 53 as shift data #1 #2, . . . , #374.

Input data #1 through #360 serving as 360 messages obtained at the same time regarding the LDPC code conforming to DVB-S2 are supplied from the computing device 32 (FIG. 3) to the barrel shifter 52 as one piece of parallel data. Further, a control signal representing the shift amount k of cyclic shift is supplied from the control device 34 (FIG. 3) to the barrel shifter 52.

The barrel shifter 52 is a barrel shifter of 360 units, and cyclically shifts the input data #1 through #360 supplied from the computing device 32 by the shift amount k in a range of 0 through less than 360 that the control signal supplied from the control device 34 represents. Subsequently, the barrel shifter 52 supplies input data #1+k, #2+k, . . . , #360, #1, #2, . . . , #k after cyclic shift thereof to the selector 53 as shift data #1 #2, . . . , #360.

With the selector 53, the shift data #1 through #374 from the barrel shifter 51, and the shift data #1 through #360 from the barrel shifter 52 are supplied thereto, and also the control signal serving as a selection signal representing selection of one of LDPC code decoding conforming to highly advanced BS and DVB-S2 (this is also a selection signal representing which cyclic shift of parallel data made up of the M (=374) pieces of input data #1 through #M, and parallel data made up of the N (=360) pieces of input data #1 through #N is performed at the cyclic shift device 33) is supplied thereto from the control device 34 (FIG. 3).

Specifically, in the event of performing decoding of the LDPC code conforming to highly advanced BS, the control device 34 supplies a selection signal representing selection of decoding of the LDPC code conforming to highly advanced BS to the selector 53. Also, in the event of performing decoding of the LDPC code conforming to DVB-S2, the control device 34 supplies a selection signal representing selection of decoding of the LDPC code conforming to DVB-S2 to the selector 53.

In the event that the selection signal from the control device 34 represents selection of decoding of the LDPC code conforming to highly advanced BS, the selector 53 selects the shift data #1 through #374 supplied from the barrel shifter 51, and outputs as output data #1 through #374 that are cyclic shift results at the cyclic shift device 33. The output data #1 through #374 are supplied to the storage device 31 (FIG. 3) as one word and stored therein.

Also, in the event that the selection signal from the control device 34 represents selection of decoding of the LDPC code conforming to DVB-S2, the selector 53 selects the shift data #1 through #360 supplied from the barrel shifter 52, and outputs as output data #1 through #360 that are cyclic shift results at the cyclic shift device 33. The output data #1 through #360 are supplied to the storage device 31 (FIG. 3) as one word and stored therein.

As described above, in the event that the cyclic shift device 33 is configured by providing the two barrel shifters 51 and 52, the cyclic shift device 33, and consequently, the LDPC decoding device in FIG. 3 increases in size.

Figure 8:
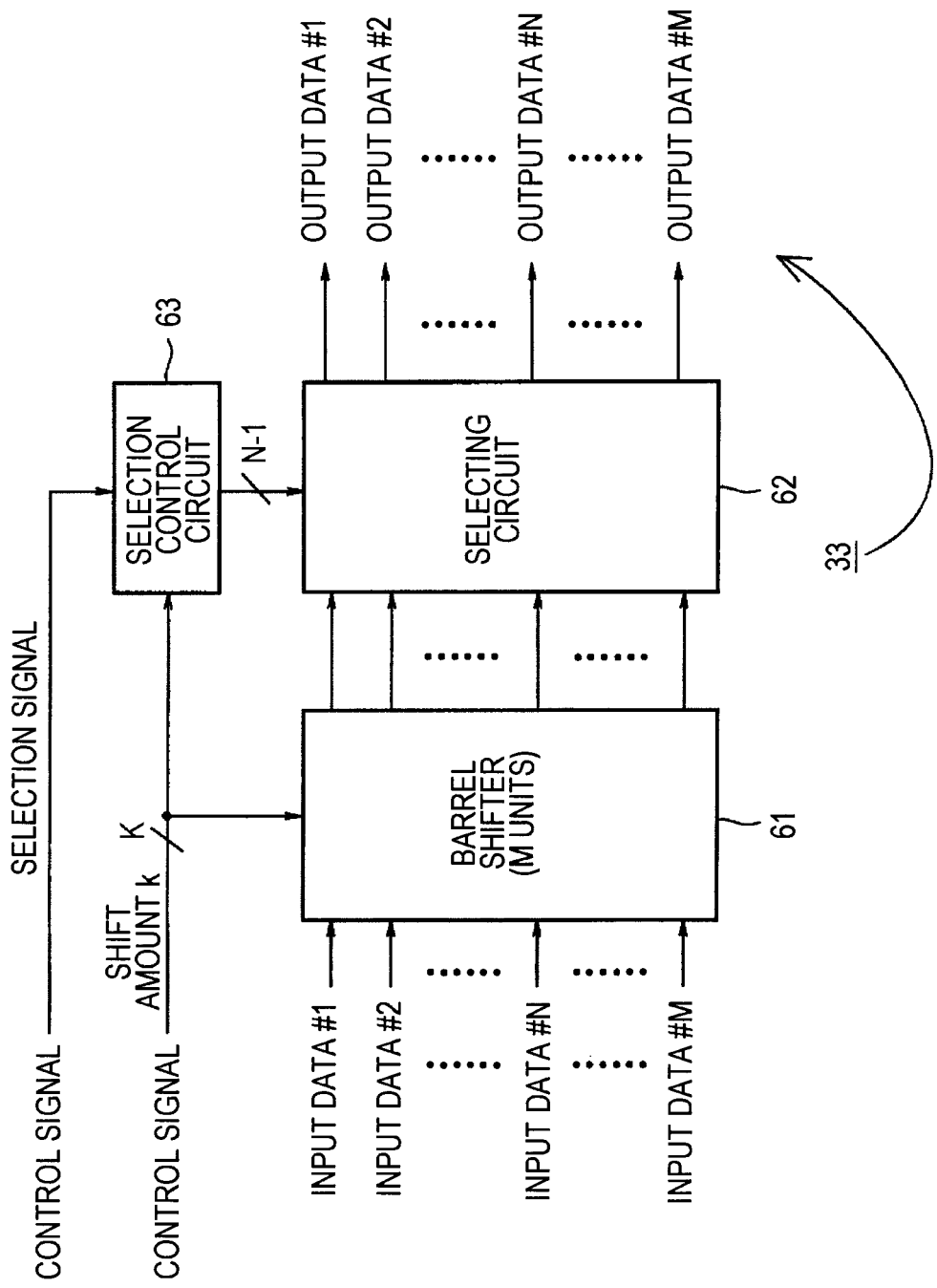
FIG. 8 is a block diagram illustrating a second configuration example of the cyclic shift device 33.

Therefore, FIG. 8 illustrates another configuration example of the cyclic shift device 33 in the event that the LDPC decoding device in FIG. 3 is used for both of for DVB-S2 and for highly advanced BS.

In FIG. 8, the cyclic shift device 33 is configured of one barrel shifter 61, a selecting circuit 62, and a selection control circuit 63.

A control signal representing the shift amount k is supplied from the control device 34 (FIG. 3) to the barrel shifter 61. Further, parallel data made up of the M pieces of input data #1 through #M is supplied form the computing device 32 to the barrel shifter 61.

The barrel shifter 61 is a barrel shifter of M units, and cyclically shifts the input data #1 through #M supplied from the computing device 32 by the shift amount k in a range of 0 through less than M that the control signal supplied from the control device 34 represents. Subsequently, the barrel shifter 61 supplies input data #1+k, #2+k, . . . , #M, #1, #2, . . . , #k after cyclic shift thereof to the selecting circuit 62 as shift data #1 #2, . . . , #M.

Note that if we say that the minimum integer equal to or greater than $\log_2 M$ is represented by K, the shift amount k is represented with K bits.

Also, in the event that the number P of columns of the units of a cyclic structure as described above is employed as the computation unit Q for example, of 374 and 360 serving as the number P of columns of the units of a cyclic structure that is the computation unit Q, greater one, i.e., 374 is employed as the value M.

With the LDPC decoding conforming to highly advanced BS, 374 (=M) messages are obtained at the computing device 32 at the same time, and the 374 messages thereof are supplied to the barrel shifter 61 as the input data #1 through #M.

Subsequently, with the barrel shifter 61, the input data #1 through #M are cyclically shifted by the shift amount k from the control device 34.

Here, with the LDPC decoding conforming to highly advanced BS, the shift amount k is an integer in a range of 0 through less than M (=374).

On the other hand, with the LDPC decoding conforming to DVB-S2, 360, which is N (<M) smaller than 374 (=M), messages are obtained at the computing device 32 at the same time, and the 360 messages thereof are supplied to the barrel shifter 61 as the input data #1 through #N of the input data #1 through #M.

Further, in this case, for example, indefinite data (invalid data) is supplied to the barrel shifter 61 as the input data #N+1, #N+2, . . . , M (here, input data #361, #362, . . . , #374).

Subsequently, with the barrel shifter 61, the input data #1 through #M are cyclically shifted by the shift amount k from the control device 34.

Here, with the LDPC decoding conforming to DVB-S2, the shift amount k is an integer in a range of 0 through less than N (=360).

Also, with the LDPC decoding conforming to DVB-S2, as described above, of the input data #1 through #M supplied to the barrel shifter 61, the last M-N pieces of input data #N+1 through M are invalid data, and with the barrel shifter 61, the M pieces of the input data #1 through #M including such invalid input data #N+1 through M are cyclically shifted, whereby the input data #1 through #N serving as the N messages obtained at the computing device 32 at the same time included in the M pieces of the input data #1 through #M are cyclically shifted.

With the selecting circuit 62, in accordance with the selection control signal of N−1 bits from the selection control circuit 63, for example, all of the shift data #1 through #M supplied from the barrel shifter 61 (that the barrel shifter 61 outputs) are selected and output as M pieces of output data #1 through #M that are cyclic shift results with the M pieces of the input data #1 through #M as one piece of parallel data.

Also, with the selecting circuit 62, in accordance with the selection control signal of N−1 bits from the selection control circuit 63, for example, the N pieces of the shift data #1 through #M supplied from the barrel shifter 61 are selected and output as N pieces of output data #1 through #N that are cyclic shift results with the N pieces of the input data #1 through #N as one piece of parallel data.

Specifically, with the LDPC decoding conforming to highly advanced BS, at the selecting circuit 62, the results obtained by cyclically shifting M (=374) messages obtained at the computing device 32 at the same time by the shift amount k as the input data #1 through #M need to be output as the M pieces of the output data #1 through #M.

In this case, with the selecting circuit 62, in accordance with the selection control signal of N−1 bits from the selection control circuit 63, the shift data #1 through #M from the barrel shifter 61 are selected and output as the M pieces of the output data #1 through #M.

On the other hand, with the LDPC decoding conforming to DVB-S2, at the selecting circuit 62, the results obtained by cyclically shifting N(=360), which is smaller than the M, messages obtained at the computing device 32 at the same time by the shift amount k as the input data #1 through #N need to be output as the N pieces of the output data #1 through #N.

In this case, with the selecting circuit 62, in accordance with the selection control signal of N−1 bits from the selection control circuit 63, the first through the N−k'th shift data #1 through #N−k from the head in the direction of cyclic shift that the barrel shifter 61 performs are selected and output as the first through the N−k'th output data. Further, with the selecting circuit 62, the N−k+1+(M−N) through N+(M−N)'th shift data #N−k+1+(M−N) through #N+(M−N) from the head in the direction of cyclic shift that the barrel shifter 61 performs are selected and output as the N−k+1 through the N'th output data #N−k+1 through #N.

Note that, here, as described above, the barrel shifter 61 cyclically shifts the input data #1 through #M by the shift amount k, and takes input data #1+k, #2+k, . . . , #M, #1, #2, . . . , #k after the cyclic shift thereof as shift data #1 through #M.

Accordingly, here, the direction of cyclic shift that the barrel shifter 61 performs is the direction of the head of the input data #1 through #M (direction from the input data #M toward the input data #1 of the alignment of the input data #1 through #M).

The control signal representing the shift amount k, and the selection signal representing selection of decoding of the LDPC code conforming to highly advanced BS or DVB-S2 are supplied form the control device 34 (FIG. 3) to the selection control circuit 63.

The selection control circuit 63 generates a selection control signal of N−1 bits based on the selection signal and further the shift amount k from the control device 34 (FIG. 3) in a way which will be described later, and supplies to the selecting circuit 62.

Figure 9:
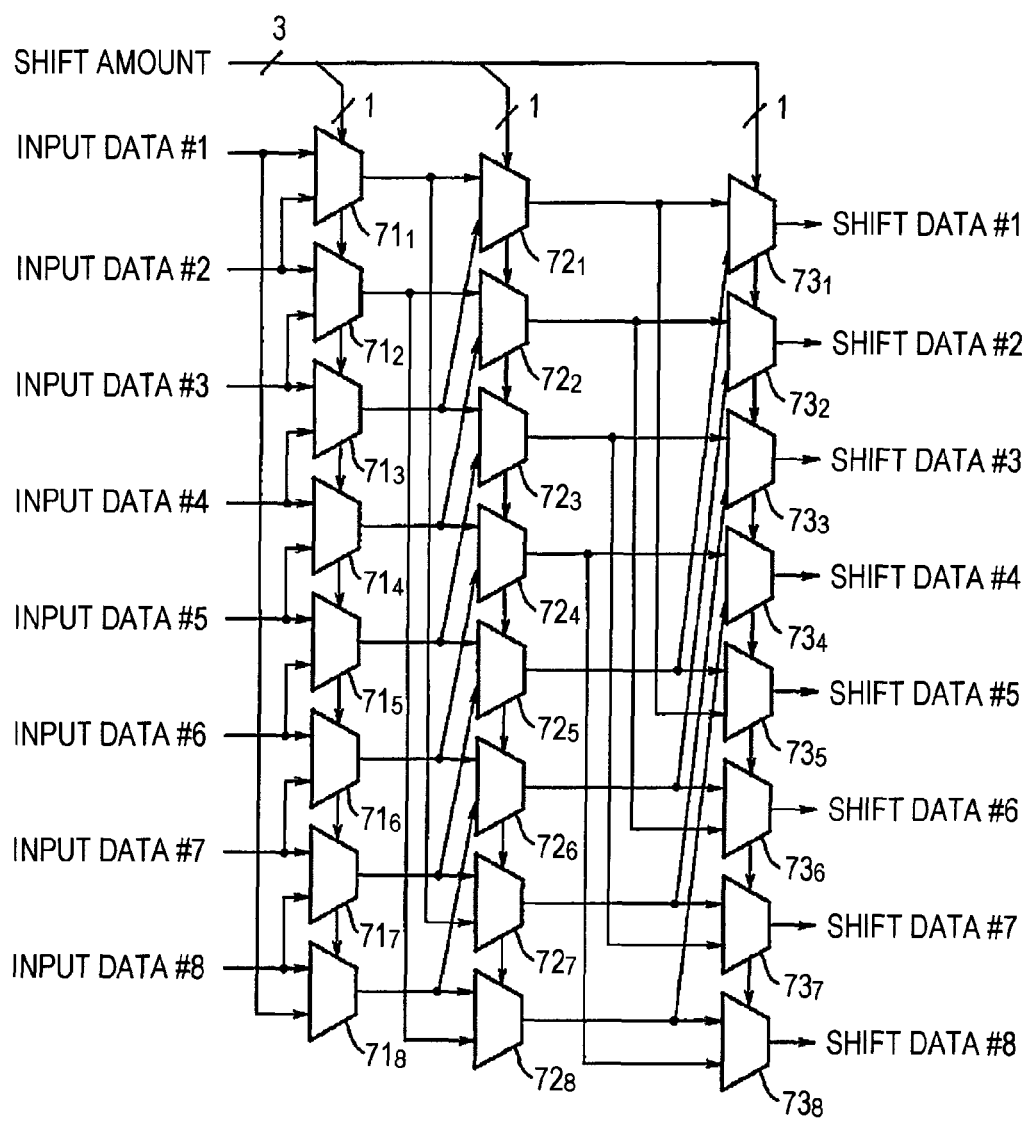
FIG. 9 is a block diagram illustrating a configuration example of a barrel shifter 61.

Next, FIG. 9 is a block diagram illustrating a configuration example of the barrel shifter 61 in FIG. 8.

Note that, in FIG. 9, in order to simplify description, the value M is set to 8, and accordingly, the barrel shifter 61 in FIG. 9 is a barrel shifter of 8 units.

The barrel shifter 61 is configured of M selectors with two inputs and one output being disposed by K steps (K is, as described above, the minimum integer equal to or greater than $\log_2 M$).

In this case, the value M is 8, so the value K is 3, and accordingly, the barrel shifter 61 is configured of eight selectors $71_1$ through $71_8$ of a first step, eight selectors $72_1$ through $72_8$ of a second step, and eight selectors $73_1$ through $73_8$ of a third step.

Input data #1 through #8 serving as an object of cyclic shift of 8 (=M) units are supplied to the selectors $71_1$ through $71_8$ of the first step.

Specifically, input data #h is supplied to one of the input terminals of the selector $71_h$ of the first step. Also, input data #h' is supplied to the other input terminal of the selector $71_h$ of the first step.

Here, the input data #h' is input data of which one (=) $2^0$) piece alone is in the inverse direction as to the direction of cyclic shift from the input data #h, and the value h' is represented with Expression h'=((h+1) mod M).

Further, the first bit (the first bit from the LSB (Least Significant Bit)) of the shift amount k represented with 3 (=K) bits is supplied to the selector $71_h$ of the first step.

The selector $71_h$ selects the input data #h supplied to one of the input terminals in the event that the first bit of the shift amount k is "0", and outputs as the first selection data #h.

Also, the selector $71_h$ selects the input data #h' supplied to the other input terminal in the event that the first bit of the shift amount k is "1", and outputs as the first selection data #h.

The first selection data #h that the selectors $71_1$ through $71_8$ of the first step output is supplied to the selectors $72_1$ through $72_8$ of the second step.

Specifically, the first selection data #i is supplied from the selector $71_i$ of the first step to one of the input terminals of the selector $72_i$ of the second step. Also, first selection data #i' is supplied from the selector $71_i'$ of the first step to the other input terminal of the selector $72_i$ of the second step.

Here, the first selection data #i' is input data of which two ($=2^1$) pieces alone are in the inverse direction as to the direction of cyclic shift from the first selection data #i, and the value i' is represented with Expression i'=((i+2) mod M).

Further, the second bit of the shift amount k represented with 3 (=K) bits is supplied to the selector $72_i$ of the second step.

The selector $72_i$ selects the first selection data #i supplied to one of the input terminals in the event that the second bit of the shift amount k is "0", and outputs as the second selection data #i.

Also, the selector $72_i$ selects the first selection data #i' supplied to the other input terminal in the event that the second bit of the shift amount k is "1", and outputs as the second selection data #i.

The second selection data #i that the selectors $72_1$ through $72_8$ of the second step output is supplied to the selectors $73_1$ through $73_8$ of the third step.

Specifically, second selection data #j is supplied from the selector $72_j$ of the second step to one of the input terminals of the selector $73_j$ of the third step. Also, second selection data #j' is supplied from the selector $72_{j'}$ of the second step to the other input terminal of the selector $73_j$ of the third step.

Here, the second selection data #j' is input data of which four ($=2^2$) pieces alone are in the inverse direction as to the direction of cyclic shift from the second selection data #j, and the value j' is represented with Expression j'=((j+4) mod M).

Further, the third bit of the shift amount k represented with 3 (=K) bits is supplied to the selector $73_i$ of the third step.

The selector $73_j$ selects the second selection data #j supplied to one of the input terminals in the event that the third bit of the shift amount k is "0", and outputs as shift data #j.

Also, the selector $73_j$ selects the second selection data #j' supplied to the other input terminal in the event that the third bit of the shift amount k is "1", and outputs as the shift data #j.

Next, description will be made regarding processing that the selecting circuit 62 performs, for example, with the M being set to 8 and also the N being set to 6 in FIG. 8.

In the event that eight pieces of input data #1 through #8 are supplied to the barrel shifter 61 of 8 (=M) units, and cyclic shift of the eight pieces of the input data #1 through #8 thereof is performed, the eight pieces of shift data #1 through #8 that the barrel shifter 61 outputs should be output as output data #1 through #8 as is.

On the other hand, in the event that six (=N) pieces of input data #1 through #6 are supplied to the barrel shifter 61 of 8 (=M) units, and cyclic shift of the six pieces of the input data #1 through #6 thereof is performed, the eight pieces of shift data #1 through #8 that the barrel shifter 61 outputs include two (=M−N) pieces of invalid data, and accordingly, the invalid data thereof needs to be handled.

Figure 10:
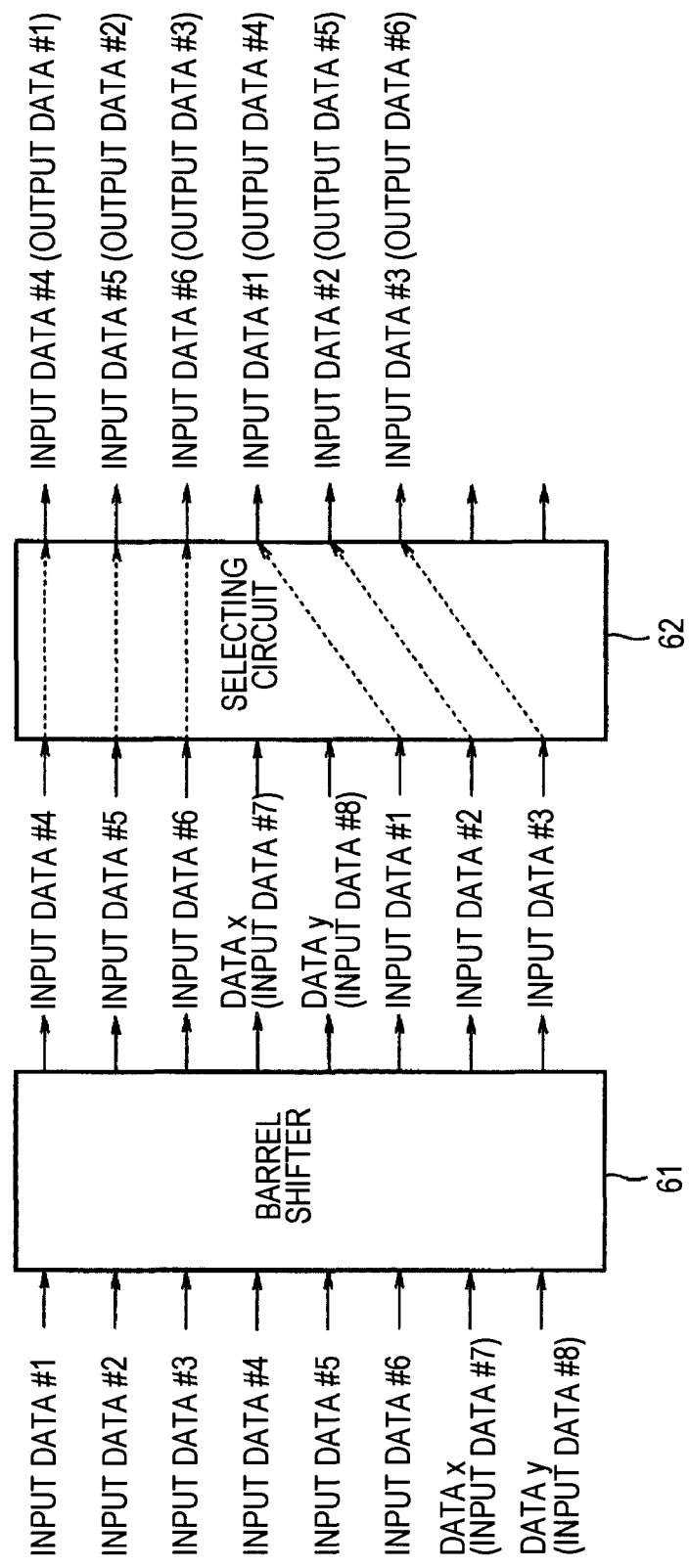
FIG. 10 is a diagram illustrating an example of cycle shift of six pieces of input data #1 through #6, which is performed at the barrel shifter 61 of eight units.

FIG. 10 illustrates an example of cyclic shift of six pieces of the input data #1 through #6 that is performed at the barrel shifter 61 of 8 units.

In FIG. 10, with the barrel shifter 61 of 8 units, six (=N) pieces of the input data #1 through #6 are attempted to be cyclically shifted by three (=k) pieces in the head direction.

However, the barrel shifter 61 is a barrel shifter of 8 units for performing cyclic shift with the eight pieces of the input data #1 through #8 as an object, and accordingly, cyclic shift of eight pieces of the input data #1 through #8 obtained by adding invalid data x and y serving as the input data #7 and #8 respectively to the six pieces of the input data #1 through #6, is performed.

Specifically, in FIG. 10, with the barrel shifter 61, the alignment of the input data #1, #2, . . . #6, x, and y are cyclically shifted by three pieces. Accordingly, the output (shift data #1 through #8) of the barrel shifter 61 becomes the alignment of input data #4 (=k+1), #5, #6 (=N), x, y, #1, #2, and #3 (=k).

The results of the six pieces of the input data #1 through #6 being cyclically shifted by three pieces (in the head (left)) direction) are input data #4, #5, #6, #1, #2, and #3, and accordingly, with the selecting circuit 62, of the input data #4, #5, #6, x, y, #1, #2, and #3 that the barrel shifter 61 outputs, three (=N−k) pieces of the input data #4, #5, and #6 from the head in the direction of cyclic shift are selected as output data #1, #2, and #3 as is, and then three (=k) pieces of the input data #1, #2, and #3 in positions shifted downward by two (=M−N) pieces are selected as output data #4, #5, and #6, whereby the alignment of the input data #4, #5, #6, #1, #2, and #3 obtained by cyclically shifting the six pieces of the input data #1 through #6 by three pieces can be obtained as six pieces of output data #1 through #6.

Figure 11:
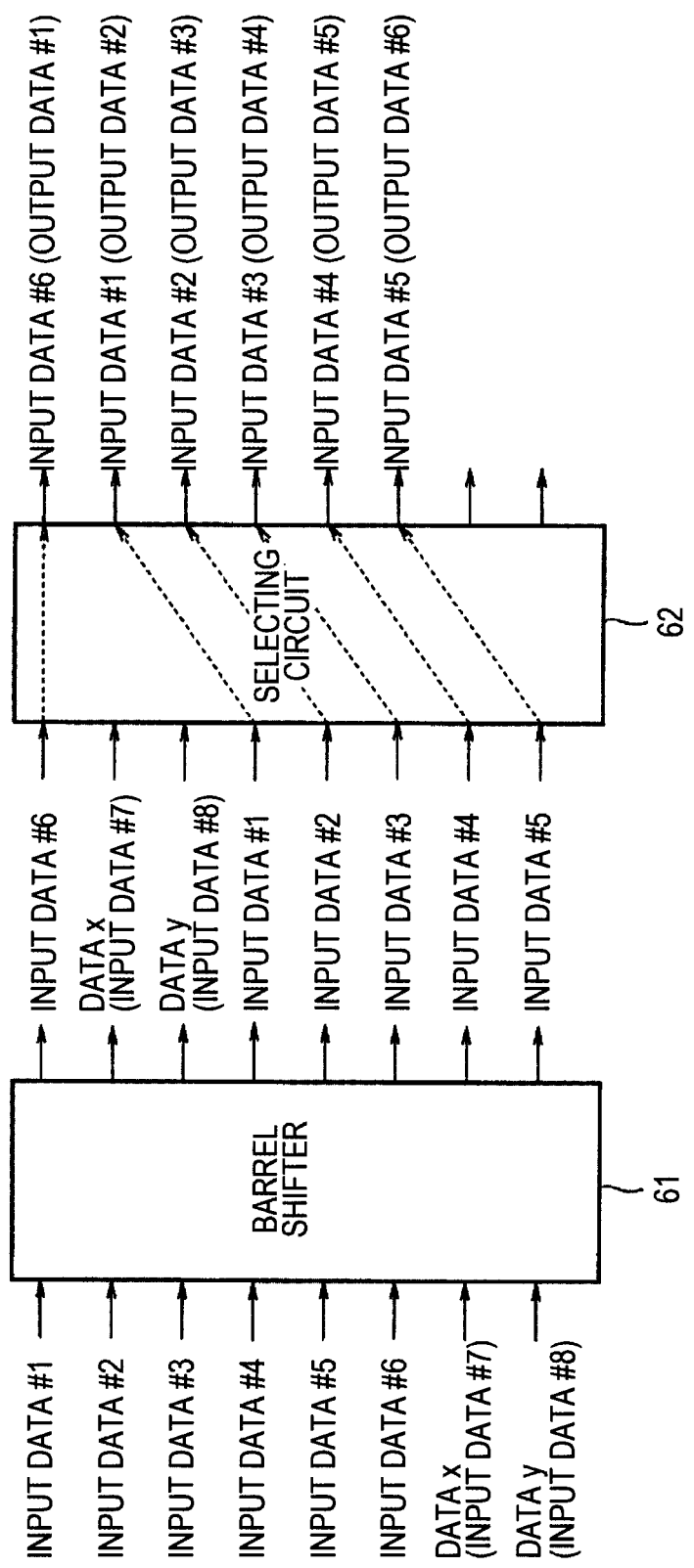
FIG. 11 is a diagram illustrating another example of cycle shift of the six pieces of input data #1 through #6, which is performed at the barrel shifter 61 of eight units.

FIG. 11 illustrates another example of cyclic shift of the six pieces of the input data #1 through #6 that is performed at the barrel shifter 61 of 8 units.

In FIG. 11, with the barrel shifter 61 of 8 units, six pieces of input data #1 through #6 are attempted to be cyclically shifted by five (=k) pieces.

However, in FIG. 11, in the same way as with the case of FIG. 10, with the barrel shifter 61, the alignment of the input data #1, #2, . . . , #6, x, and y is cyclically shifted by five pieces, and accordingly, the output (shift data #1 through #8) of the barrel shifter 61 becomes the alignment of the input data #6 (=k+1), x, y, #1, #2, #3, #4, and #5 (=k).

The results of the six pieces of the input data #1 through #6 being cyclically shifted by five pieces are the input data #6, #1, #2, #3, #4, and #5, so with the selecting circuit 62, of the input data #6, x, y, #1, #2, #3, #4, and #5 output from the barrel shifter 61, the one (=N−k) piece of the input data #6 from the head in the direction of cyclic shift is selected as output data #1 as is, and thereafter, five (=k) pieces of the input data #1, #2, #3, #4, and #5 positioned in a position shifted downward by two (=M−N) pieces are selected as output data #2, #3, #4, #5, and #6, whereby the alignment of the input data #6, #1, #2, #3, #4, and #5 obtained by cyclically shifting the six pieces of the input data #1 through #4 by five pieces can be obtained as six pieces of output data #1 through #6.

According to the above, with the barrel shifter 61 of M units, in the event of performing k pieces of cyclic shift being performed regarding N pieces smaller than the M of the input data #1 through #N, with the selecting circuit 62, of the M pieces of shift data #1 through #M output from the barrel shifter 61 of M units, N−k pieces of the shift data #1 through #N−k from the head in the direction of cyclic shift are selected as output data #1 through #N−k as is, and thereafter, k pieces of shift data #N−k+(M−N)+1, . . . , #M positioned downward (backward) by M-N pieces are selected as output data #N−k+1 through #N, whereby correct results obtained by cyclically shifting the N pieces of the input data #1 through #N by k pieces can be obtained.

Figure 12:
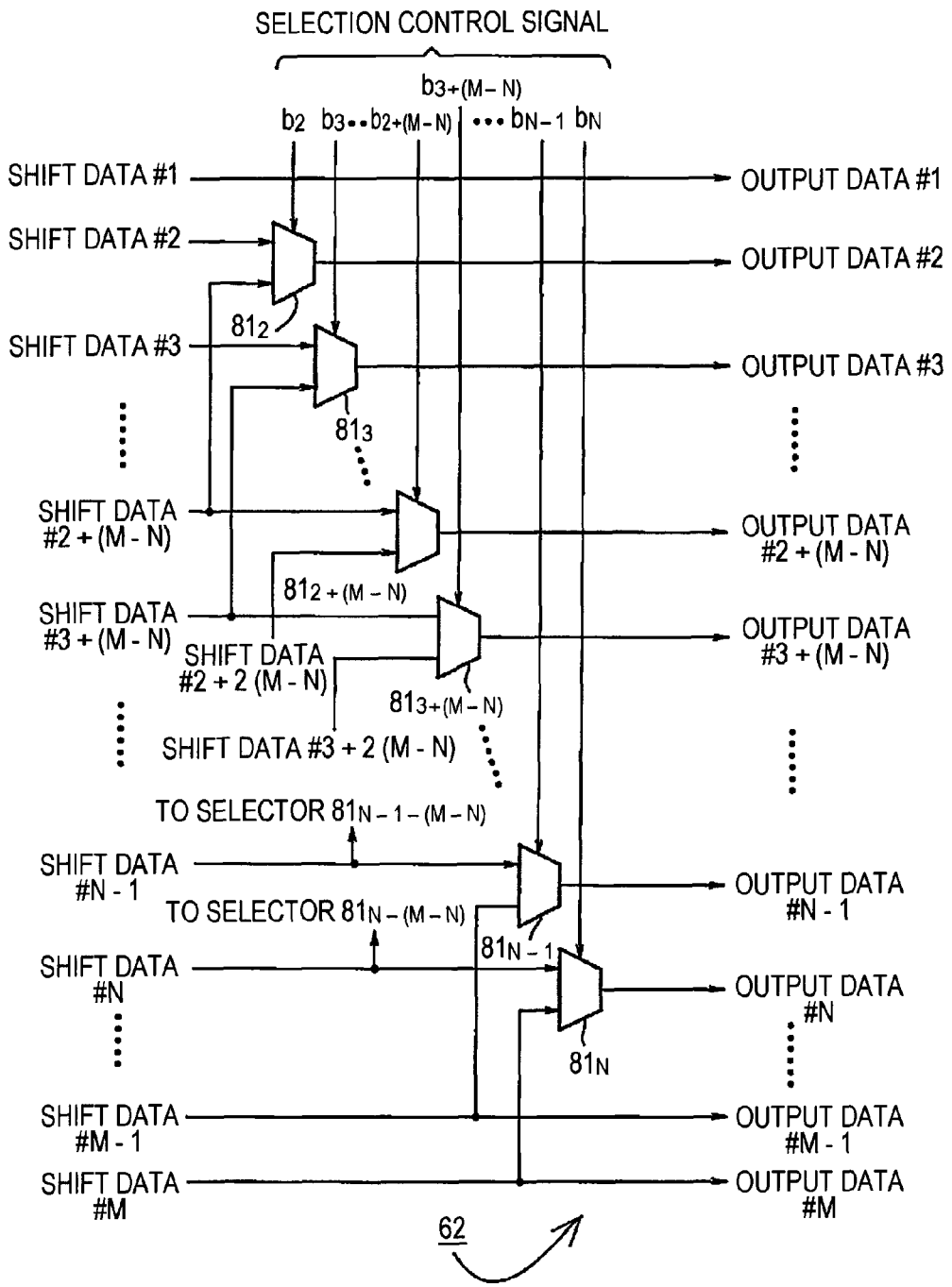
FIG. 12 is a block diagram illustrating a configuration example of a selecting circuit 62.

FIG. 12 illustrates a configuration example of the selecting circuit 62 in FIG. 8.

As described above, the selecting circuit 62 is configured of N−1 selectors $81_2$ through $81_N$ of two inputs and one output so as to select, of the M pieces of shift data #1 through #M that the barrel shifter 61 of M units outputs, the N−k pieces of the shift data #1 through #N−k from the head in the direction of cyclic shift as output data #1 through #N−k as is, and thereafter so as to select k pieces of shift data #N−k+(M−N)+1, . . . , #M positioned downward (backward) by M−N pieces as output data #N−k+1 through #N.

With a selector $81_n$, shift data #n that the barrel shifter 61 (FIG. 8) outputs is supplied to one of the input terminals thereof, and shift data #n+(M−N) backward by M−N pieces is supplied from the shift data #n to the other input terminal.

The selector $81_n$ selects, regarding the n that is an integer in a range of 2 through N, the shift data #n (n'th shift data) supplied to one of the input terminals, or the shift data #n+(M−N) (n+(M−N)'th shift data) supplied to the other input terminal, and outputs as output data #n (n'th output data).

That is to say, in addition to the shift data #n through #n+(M−N) that the barrel shifter 61 (FIG. 8) outputs, the n−1'th bit (the bit at the n−1'th from the head) $b_n$ of selection control signals $b_2, b_3, \ldots, b_N$ of N−1 bits from the selection control circuit 63 (FIG. 8) is supplied to the selector $81_n$.

In the event that the n−1'th bit $b_n$ of the selection control signal from the selection control circuit 63 is "0", the selector $81_n$ selects the shift data #n supplied to one of the input terminals, and outputs as output data #n.

Also, in the event that the n−1'th bit $b_n$ of the selection control signal from the selection control circuit 63 is "1", the selector $81_n$ selects the shift data #n+(M−N) supplied to the other input terminal, and outputs as output data #n.

As described above, with the selecting circuit 62 including the N−1 selectors $81_2$ through $81_N$, in the event that the barrel shifter 61 (FIG. 8) cyclically shifts parallel data made up of the M pieces of the input data #1 through #M, and outputs, as results of cyclic shift thereof, M pieces of the shift data #1 through #M, the first shift data #1 is output as the first output data #1, and with the selector $81_n$, the n'th shift data #n is selected as the n'th output data #n and output, the N+1 through M'th shift data #N+1 through #M are output as the N+1 through M'th output data #N+1 through #M.

On the other hand, in the event that the barrel shifter 61 (FIG. 8) cyclically shifts parallel data made up of the N smaller than the M pieces of the input data #1 through #N, and outputs, as results of cyclic shift thereof, M pieces of the shift data #1 through #M, with the selecting circuit 62, the first shift data #1 is output as the first output data #1, and with the first through N−k−1'th selectors $81_2$ through $81_{N−k}$, the n'th shift data #n is selected as the n'th output data #n and output, and with the N−k through N−1'th selectors $81_{N−k+1}$ through $81_N$, the n+(M−N)'th shift data #n+(M−N) is selected as the n'th output data #n and output.

The selection control circuit 63 generates the selection control signals $b_2$ through $b_N$ of N−1 bits for operating the selecting circuit 62 as described above based on the selection signal and shift amount K supplied from the control device 34 (FIG. 3), and supplies to the selecting circuit 62, thereby controlling selection of the shift data according to the selectors $81_2$ through $81_N$ of the selecting circuit 62.

Specifically, in the event that the selection signal from the control device 34 represents selection of decoding of the LDPC code conforming to highly advanced BS, and cyclic shift of parallel data made up of M (=374) pieces of input data #1 through #M is performed at the cyclic shift device 33, the selection control circuit 63 generates the selection control signals $b_2$ through $b_N$ of which the values are all "0", and supplies to the selecting circuit 62.

Also, in the event that the selection signal from the control device 34 represents selection of decoding of the LDPC code conforming to highly advanced BS, and cyclic shift of parallel data made up of N (=360) pieces of input data #1 through #N is performed at the cyclic shift device 33, the selection control circuit 63 generates the selection control signals $b_2$ through $b_N$ with reference to a conversion table for converting the shift amount k from the control device 34 into the selection control signals $b_2$ through $b_N$, and supplies to the selecting circuit 62.

FIG. 13 schematically illustrates the conversion table.

According to the conversion table in FIG. 13, with regard to the shift amount k, the selection control signals $b_2$ through $b_N$ are generated wherein the lower k bits $b_{M−k+1}$ through $b_M$ are "1", and the upper N−k−1 bits $b_2$ through $b_{N−k}$ are "0".

Figure 14:
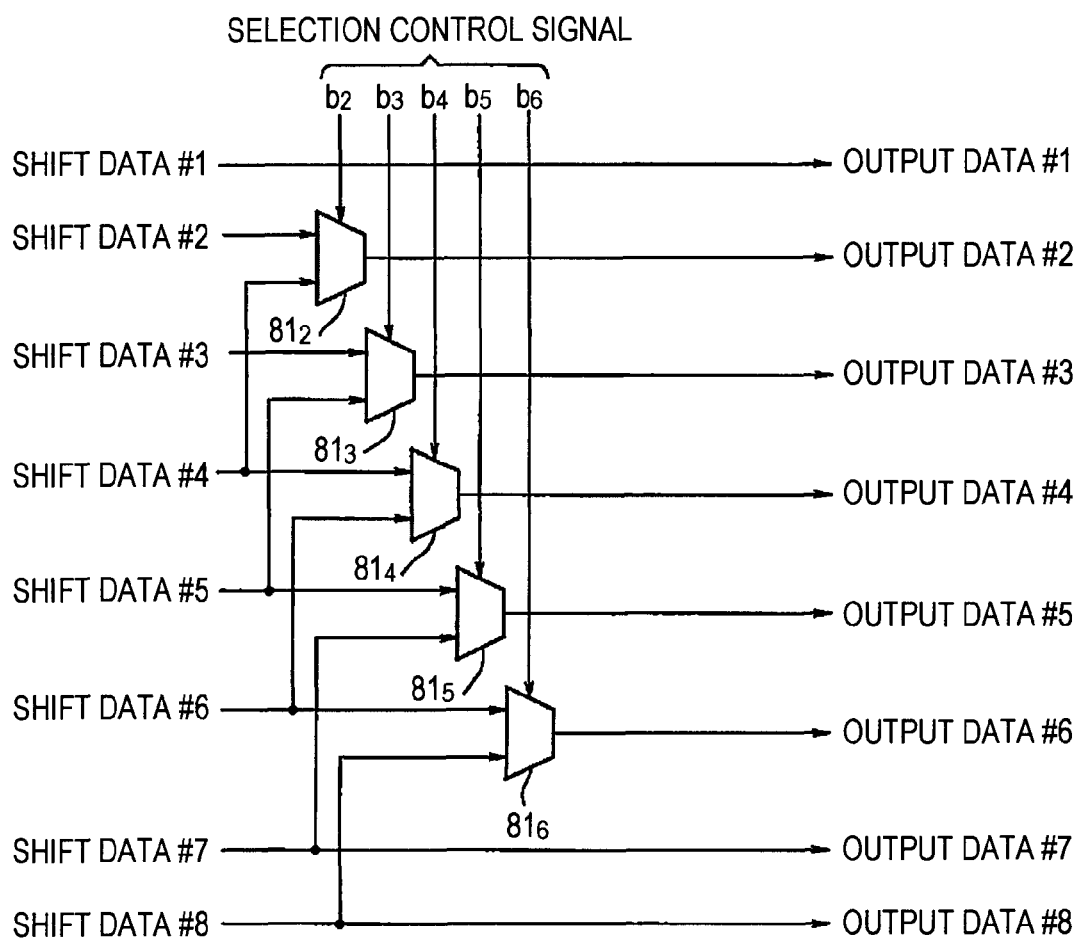
FIG. 14 is a block diagram illustrating a configuration example of the selecting circuit 62 in the event that M is 8, and N is 6.
Figure 15:
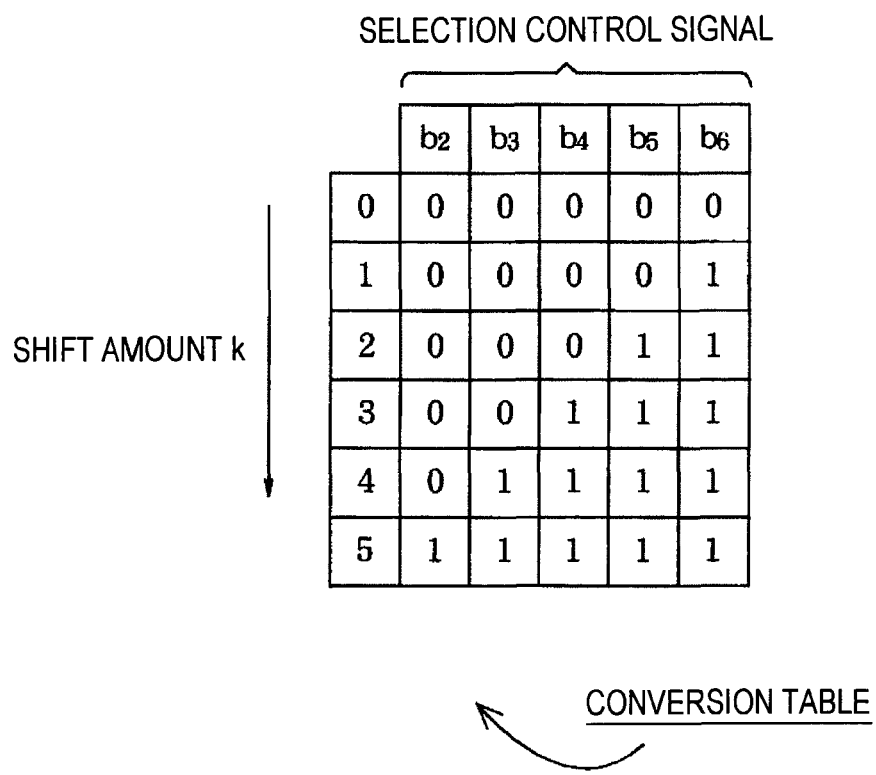
FIG. 15 is a diagram illustrating a conversion table in the event that the N is 6.

FIG. 14 illustrates a configuration example of the selecting circuit 62 in the event that the M is 8, and the N is 6, and FIG. 15 illustrates a conversion table used at the selection control circuit 63.

In the event that the M is 8, and the N is 6, the selecting circuit 62 is made up of five (=N−1) selectors $81_2$ through $81_6$.

With the selector $81_n$, shift data #n that the barrel shifter 61 (FIG. 8) outputs is supplied to one of the input terminals thereof, and shift data #n+2 backward by two (=M−N) pieces is supplied from the shift data #n to the other input terminal.

Further, the n−1'th bit (the bit at the n−1'th from the head) $b_n$ of selection control signals $b_2, b_3, b_4, b_5,$ and $b_6$ of five (=N−1) bits from the selection circuit 63 (FIG. 8) is supplied to the selector $81_n$.

In the event that the n−1'th bit $b_n$ of the selection control signal from the selection control circuit 63 is "0", the selector $81_n$ selects the shift data #n supplied to one of the input terminals, and outputs as output data #n.

Also, in the event that the n−1'th bit $b_n$ of the selection control signal from the selection control circuit 63 is "1", the selector $81_n$ selects the shift data #n+2 supplied to the other input terminal, and outputs as output data #n.

Note that the selecting circuit 62 is configured so as to output the shift data #1, and #N+1, #N+2, . . . , #M from the barrel shifter 61 as output data #1, and #N+1, #N+2, . . . , #M as is.

Specifically, in FIG. 14, with the selecting circuit 62, the shift data #1, #7, and #8 are output as output data #1, #7, and #8 as is.

In the event that the barrel shifter 61 (FIG. 8) cyclically shifts parallel data made up of eight (=M) pieces of input data #1 through #8, and outputs, as results of the cyclic shift thereof, eight pieces of the shift data #1 through #8, the selection control circuit 63 (FIG. 8) generates selection control signals $b_2$ through $b_6$ of which the values are all "0", and supplies to the selecting circuit 62.

In this case, with the selecting circuit 62, the shift data #1 from the barrel shifter 61 is output as output data #1. Also, with the selecting circuit 62, in accordance with the selection control signals $b_2$ through $b_6$, the shift data #2 through #6 from the barrel shifter 61 are selected as output data #2 through #6 and output at the selectors $81_2$ through $81_6$, respectively. Further, with the selecting circuit 62, the shift data #7 and #8 from the barrel shifter 61 are output as output data #7 and #8, respectively.

On the other hand, in the event that the barrel shifter 61 (FIG. 8) cyclically shifts parallel data made up of six (=N) smaller than 8 (=M) pieces of input data #1 through #6, and outputs, as results of the cyclic shift thereof, eight pieces of the shift data #1 through #8 (where, of these, two (=M−N) pieces of shift data are invalid data), the selection control circuit 63 generates selection control signals $b_2$ through $b_6$ with reference to the conversion table described in FIG. 13 based on the shift amount k for cyclically shifting the six pieces of the input data #1 through #6, and supplies to the selecting circuit 62.

FIG. 15 illustrates the conversion table in the event that the N is 6.

In the event that the shift amount k is, for example, 3 as described in FIG. 10, the selection control circuit 63 refers to the conversion table in FIG. 15 to generate 0, 0, 1, 1, 1 as the selection control signals $b_2$ through $b_6$, and supplies to the selecting circuit 62.

In this case, with the selecting circuit 62, the shift data #1, #7, and #8 from the barrel shifter 61 are output as output data #1, #7, and #8, respectively. However, the output data #7 and #8 that are the last M−N pieces of output data are not handled as the results of the cyclic shift and are discarded.

Also, with the selecting circuit 62, the shift data #2 and #3 from the barrel shifter 61 are selected as output data #2 and #3 at the selectors $81_2$ and $81_3$ in accordance with the selection control signals $b_2$ and $b_3$ of which the values are "0" and output, respectively.

Further, with the selecting circuit 62, the shift data #6 through #8 from the barrel shifter 61 are selected as output data #4 and #6 at the selectors $81_4$ and $81_6$ in accordance with the selection control signals $b_4$ through $b_6$ of which the values are "1" and output, respectively.

As described above, with the selecting circuit 62, the shift data #1, #2, #3, and #6 through #8 from the barrel shifter 61 are output as output data #1 through #6, respectively.

In the event that the shift amount k is 3, as described in FIG. 10, the shift data #1 through #8 that the barrel shifter 61 outputs become the alignment of the input data #4, #5, #6, x, y, #1, #2, and #3 as to the input data #1 through #6.

Accordingly, as described above, with the selecting circuit 62, the shift data #1, #2, #3, and #6 through #8 from the barrel shifter 61 are output as output data #1 through #6 respectively, whereby the output data #1 through #6 thereof become the alignment of input data #4, #5, #6, #1, #2, and #3 obtained by cyclically shifting the input data #1 through #6 by the shift amount k=3.

Also, in the event that the shift amount k is, for example, 5 as described in FIG. 11, the selection control circuit 63 refers to the conversion table in FIG. 15 to generate 1, 1, 1, 1, 1 as the selection control signals $b_2$ through $b_6$, and supplies to the selecting circuit 62.

In this case, with the selecting circuit 62, the shift data #1, #7, and #8 from the barrel shifter 61 are output as output data #1, #7, and #8, respectively.

Also, with the selecting circuit 62, the shift data #4 through #8 from the barrel shifter 61 are selected as output data #2 and #6 at the selectors $81_2$ through $81_6$ in accordance with the selection control signals $b_2$ through $b_6$ of which the values are "1" and output, respectively.

As described above, with the selecting circuit 62, the shift data #1, and #4 through #8 from the barrel shifter 61 are output as output data #1 through #6, respectively.

In the event that the shift amount k is 5, as described in FIG. 11, the shift data #1 through #8 that the barrel shifter 61 outputs become the alignment of the input data #6, x, y, #1, #2, #3, #4, and #5 as to the input data #1 through #6.

Accordingly, as described above, with the selecting circuit 62, the shift data #1, and #4 through #8 from the barrel shifter 61 are output as output data #1 through #6 respectively, whereby the output data #1 through #6 thereof become the alignment of input data #6, #1, #2, #3, #4, and #5 obtained by cyclically shifting the input data #1 through #6 by the shift amount k=5.

Figure 16:
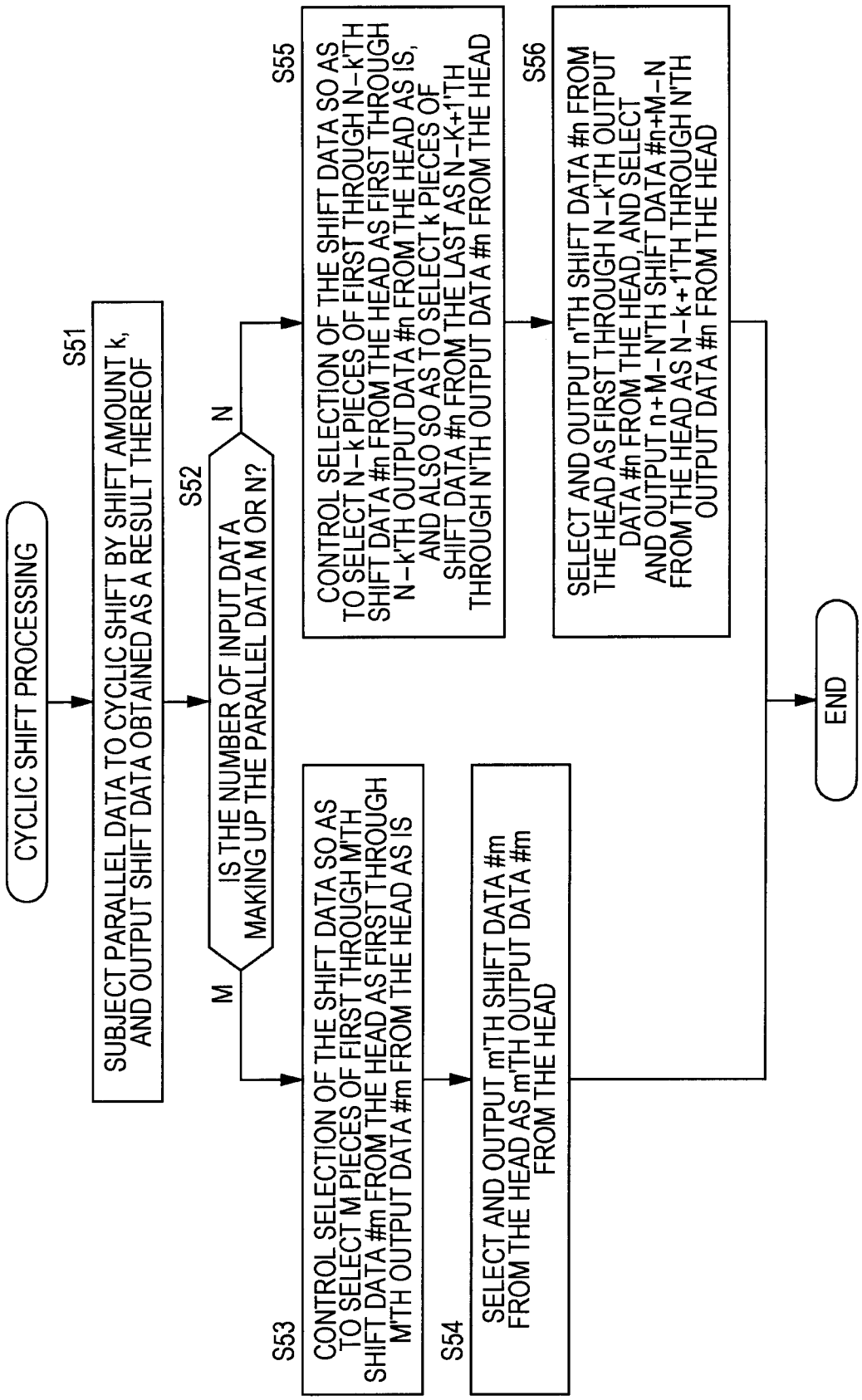
FIG. 16 is a flowchart for describing cyclic shift processing that the cyclic shift device 33 performs.

Next, processing of the cyclic shift device 33 in FIG. 8 (cyclic shift processing) will be described with reference to FIG. 16.

The barrel shifter 61 of M units awaits Q messages obtained at the same time being supplied from the computing device 32 (FIG. 3) to receive the Q messages as a plurality of input data. Subsequently, in step S51, the barrel shifter 61 cyclically shifts parallel data made up of the plurality of input data by the shift amount k supplied from the control device 34, and outputs M pieces of shift data #1 through #M obtained as a result thereof to the selecting circuit 62, and the processing proceeds to step S52.

In step S52, the selection control circuit 63 determines, based on the selection signal supplied from the control device 34, whether the number of input data making up the parallel data cyclically shifted at the barrel shifter 61 is the M pieces or N pieces smaller than the M.

In the event that determination is made in step S52 that the number of input data making up the parallel data cyclically shifted at the barrel shifter 61 is the M pieces, the processing proceeds to step S53, where the selection control circuit 63 controls selection of the shift data #1 through #M according to the selecting circuit 63 so as to select the first through M'th shift data #1 through #M that the barrel shifter 61 outputs as the first through M'th output data #1 through #M as is, respectively.

Specifically, the selection control circuit 63 generates selection control signals $b_2$ through $b_N$ of which the values are all "0", and supplies to the selecting circuit 62.

Subsequently, the processing proceeds from step S53 to step S54, where the selecting circuit 62 selects shift data #m (m=1, 2, ..., M) from the barrel shifter 61 as output data #m in accordance with the selection control signals $b_2$ through $b_N$ from the selection control circuit 63 respectively and output, and the cyclic shift processing ends.

Also, in the event that determination is made in step S52 that the number of input data making up the parallel data cyclically shifted at the barrel shifter 61 is the N smaller than the M pieces, the processing proceeds to step S55, where the selection control circuit 63 controls selection of the shift data #1 through #M according to the selecting circuit 63 so as to select N−k pieces of the first through N−k'th shift data #1 through #N−k of the first through M'th shift data #1 through #M that the barrel shifter 61 outputs as the first through N−k'th output data #1 through #N−k as is, respectively, and also so as to select k pieces from the last of the shift data #M−k+1 through #M as output data N−k+1 through #N respectively.

Specifically, the selection control circuit 63 generates selection control signals $b_2$ through $b_N$ in which the lower k bits are "1", and the remaining upper bits are "0", as to the shift amount k supplied from the control device 34 (FIG. 3) in accordance with the conversion table in FIG. 13, and supplies to the selecting circuit 62.

Subsequently, the processing proceeds from step S55 to step S56, where the selecting circuit 62 selects the shift data #1 through #N−k of the shift data #1 through #M from the barrel shifter 61 as output data #1 through #N−k in accordance with the selection control signals $b_2$ through $b_N$ from the selection control circuit 63 respectively, and also selects the shift data #M−k+1 through #M as output data N−k+1 through #N respectively and output, and the cyclic shift processing ends.

As described above, in the event of cyclically shifting parallel data made up of the N pieces smaller than the M pieces of the input data by the shift amount k less than the N at the cyclic shift device 33 including the barrel shifter 61 of M units, the selecting circuit 62 selects and outputs the first through N−k'th shift data #1 through #N−k from the head in the direction of cyclic shift that the barrel shifter 61 performs as the first through N−k'th output data #1 through #N−k, and selects and outputs the N−k+1+(M−N) through N+(M−N) shift data #M−k+1 through #M from the head in the direction of cyclic shift that the barrel shifter 61 performs as the N−k+1 through N'th output data #N−k+1 through #N, whereby cyclic shift of the N pieces smaller than the M pieces of the input data can be performed taking advantage of the barrel shifter 61 of M units in addition to cyclic shift of the M pieces of the input data.

Accordingly, in addition to the barrel shifter 61 of M units, both of cyclic shift of the M pieces of the input data, and cyclic shift of the N pieces smaller than the M pieces of the input data can be performed without providing the barrel shifter of N units.

As a result thereof, in the event that there is a need to perform cyclic shift of the M pieces of the input data, and cyclic shift of the N pieces smaller than the M pieces of the input data, two barrel shifters which require a great number of selectors do not need to be provided (cyclic shift can be performed with one barrel shifter alone), whereby the device can be configured with a small size.

Note that in the event that the LDPC decoding device in FIG. 3 is used for both of for DVB-S2 and for highly advanced BS, of 360 that is a computation unit Q equal to the number P of columns of the units of the cyclic structure of DVB-S2, and 374 that is a computation unit Q equal to the number P of columns of the units of the cyclic structure of highly advanced BS, the value M is 374 equal to the greater one, and the value N is 360 equal to the smaller one.

Subsequently, with the TV in FIG. 1, in the event of receiving the transmission data conforming to highly advanced BS, the control device 34 (FIG. 3) generates a selection signal representing selection of decoding of the LDPC code conforming to highly advanced BS (that cyclic shift of the parallel data made up of 360 (=N) pieces of the input data is performed at the barrel shifter 61), and supplies to the cyclic shift device 33.

Further, the control device 34 determines the shift amount k, as described in FIG. 5, based on a configuration matrix of Q×Q (=P×P=N×N) making up the parity check matrix of the LDPC code conforming to highly advanced BS, and supplies to the cyclic shift device 33.

On the other hand, with the TV in FIG. 1, in the event of receiving the transmission data conforming to highly advanced BS, the control device 34 (FIG. 3) generates a selection signal representing selection of decoding of the LDPC code conforming to highly advanced BS (that cyclic shift of the parallel data made up of 374 (=M) pieces of the input data is performed at the barrel shifter 61), and supplies to the cyclic shift device 33.

Further, the control device 34 determines the shift amount k, as described in FIG. 5, based on a configuration matrix of Q×Q (=P×P=M×M) making up the parity check matrix of the LDPC code conforming to highly advanced BS, and supplies to the cyclic shift device 33.

Note that, with the above embodiment, the M and N have been set to 374 and 360, or 8 and 6, but the M and N are not restricted to these values. However, in the event that a barrel shifter of M units is employed as the barrel shifter 61 (FIG. 8), the N needs to be a value smaller than the M.

Figure 17:
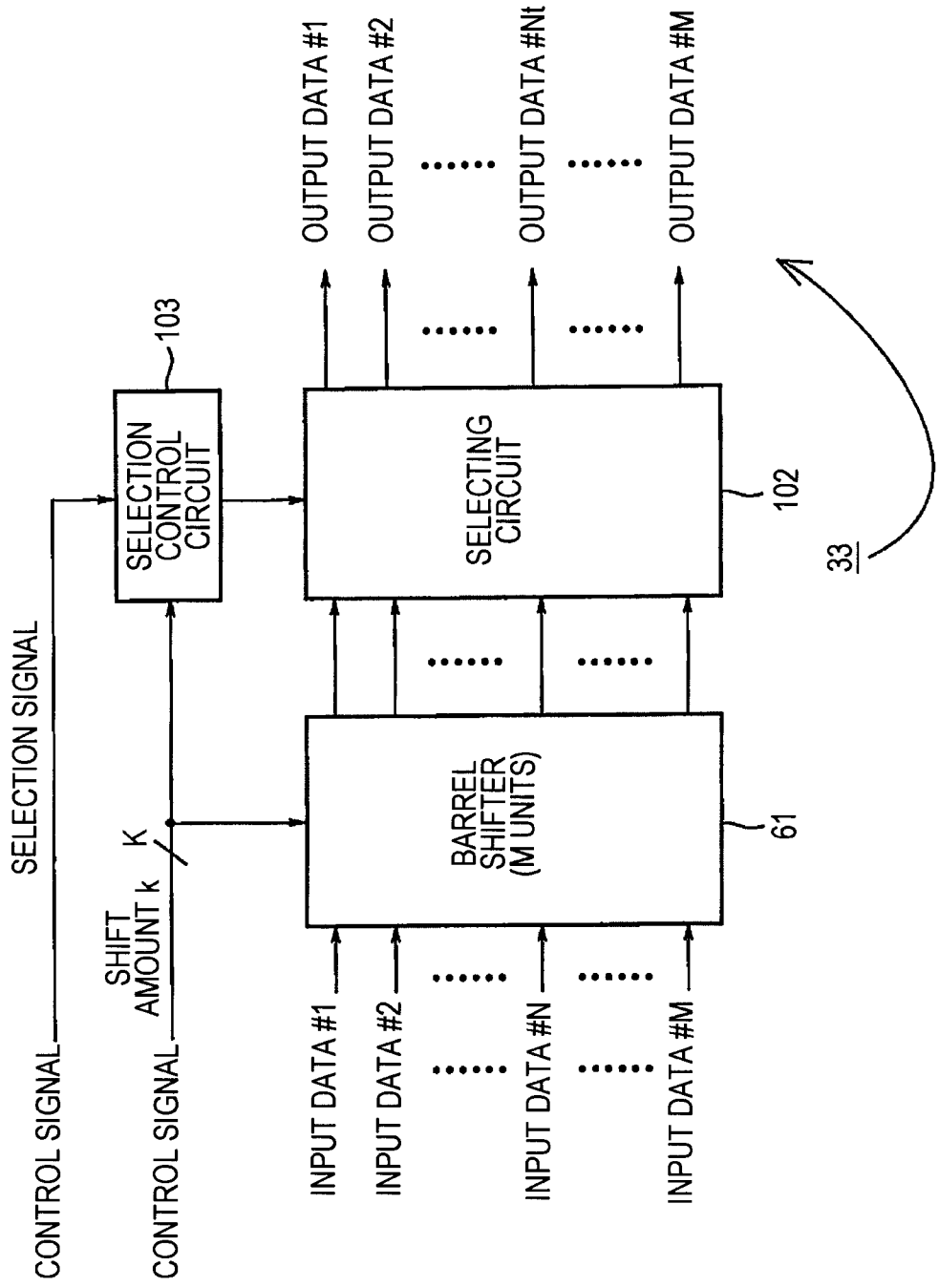
FIG. 17 is a block diagram illustrating a third configuration example of the cyclic shift device 33.

FIG. 17 illustrates another configuration example of the cyclic shift device 33 in FIG. 3.

Note that, portions corresponding to the case in FIG. 8 are denoted with the same reference numerals, and hereafter, description thereof will be omitted as appropriate.

Specifically, the cyclic shift device 33 in FIG. 17 matches the case of FIG. 8 in that the barrel shifter 61 is included, but differs from the case in FIG. 8 in that a selecting circuit 102 and a selection control circuit 103 are provided instead of the selecting circuit 62 and selection control circuit 63.

In FIG. 8, the N smaller than the M is taken as one integer value, but T multiple integer values may be employed as the N.

Now, let us say that T integer values employed as the N are represented as $N_1, N_2, \ldots, N_T$. Note that $N_t$ is, of the $N_1$ through $N_T$, the t'th integer value in descending order, and is a value in a range of two or more but less than the M.

With the cyclic shift device 33 in FIG. 17, cyclic shift of T+1 types of units in total of cyclic shift of M units, and cyclic shift of each of the $N_1$ through $N_T$, can be performed.

A control signal representing the shift amount k less than the M (equal to or greater than 0) is supplied from the control device 34 (FIG. 3) to the barrel shifter 61. Further, parallel data made up of the M pieces of the input data #1 through #M is supplied from the computing device 32 to the barrel shifter 61.

The barrel shifter 61 is a barrel shifter of M units, and cyclically shifts the input data #1 through #M supplied from the computing device 32 by the shift amount k in a range of 0 or more but less than the M that the control signal supplied from the control device 34 represents. Subsequently, the barrel shifter 61 supplies input data #1+k, #2+k, . . . , #M, #1, #2, . . . , #k after the cyclic shift thereof to the selecting circuit 102 as shift data #1, #2, . . . , #M.

Note that, in the event of performing cyclic shift of $N_t$ units at the cyclic shift device 33 in FIG. 17, of the M pieces of the input data #1 through #M supplied to the barrel shifter 61, other than the input data #1 through #N that are intended to be subjected to cyclic shift, i.e., the input data #$N_t$+1, #$N_t$+2, . . . , M are invalid data.

Also, in the event of performing cyclic shift of $N_t$ units at the cyclic shift device 33 in FIG. 17, the shift amount k is an integer value of less than $N_t$ (equal to or greater than 0).

The selecting circuit 102 selects and outputs, for example, all of the shift data #1 through #M supplied from the barrel shifter 61 (that the barrel shifter 61 outputs) as the M pieces of the output data #1 through #M that are the results of cyclic shift with the M pieces of the input data #1 through #M as one parallel data, in accordance with the selection control signal from the selection control circuit 103.

Also, the selecting circuit 102 selects and outputs the $N_t$ pieces of the shift data #1 through #M supplied from the barrel shifter 61 as the $N_t$ pieces of the output data #1 through #$N_t$ that are the results of cyclic shift (cyclic shift of $N_t$ units) with the $N_t$ pieces of the input data #1 through #$N_t$ as one parallel data, in accordance with the selection control signal from the selection control circuit 103.

Specifically, in the event of performing cyclic shift of M units at the cyclic shift device 33 in FIG. 17 (in the event that the results of cyclic shift of M units being performed are intended to be obtained), the selecting circuit 102 selects and outputs the shift data #1 through #M from the barrel shifter 61 as the M pieces of output data #1 through #M in accordance with the selection control signal from the selection control circuit 103.

Also, in the event of performing cyclic shift of $N_t$ units at the cyclic shift device 33 in FIG. 17 (in the event that the results of cyclic shift of $N_t$ units being performed are intended to be obtained), the selecting circuit 102 selects and outputs the first through $N_t$-k'th shift data #1 through #$N_t$-k from the head in the direction of the cyclic shift that the barrel shifter 61 performs as the first through $N_t$-k'th output data in accordance with the selection control signal from the selection control circuit 103. Further, the selecting circuit 102 selects and outputs the $N_t$-k+1+(M-$N_t$) through $N_t$+(M-$N_t$)'th shift data #$N_t$-k+1+(M-$N_t$) through #$N_t$+(M-$N_t$) from the head in the direction of the cyclic shift that the barrel shifter 61 performs as the $N_t$-k+1 through N'th output data #$N_t$-k+1 through #$N_t$.

The control signal representing the shift amount k, and the selection signal representing which units (M units, or $N_1$, $N_2$, ..., $N_{T-1}$, or otherwise $N_T$ units) of cyclic shift is performed, are supplied from the control device 34 (FIG. 3) to the selection control circuit 103.

The selection control circuit 103 generates a selection control signal based on the selection signal and further the shift amount k from the control device 34 (FIG. 3), which will be described later, and supplies to the selecting circuit 102.

Figure 18:
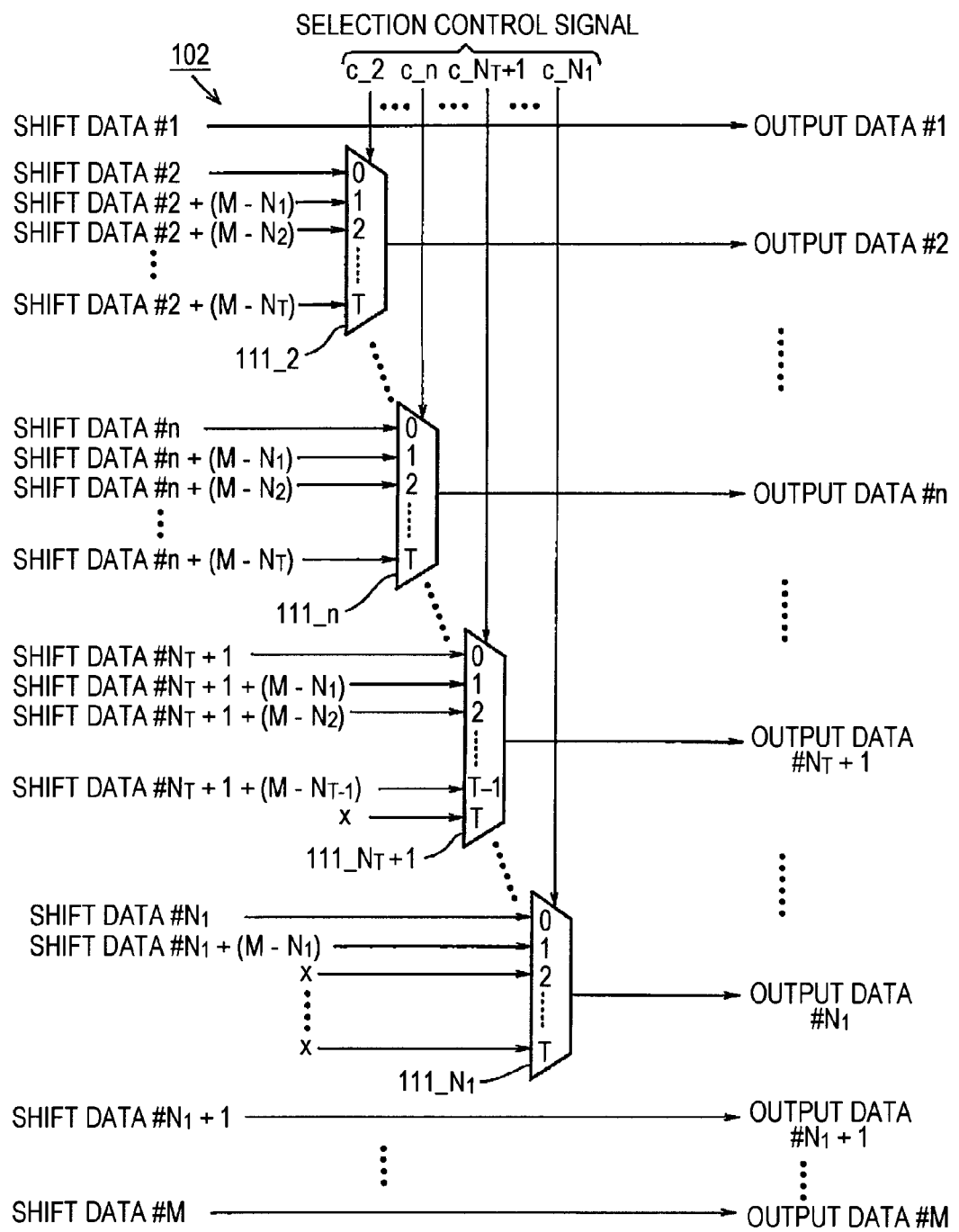
FIG. 18 is a block diagram illustrating a configuration example of a selecting circuit 102.

FIG. 18 illustrates a configuration example of the selecting circuit 102 in FIG. 17.

The selecting circuit 102 is configured of $N_1$-1 selectors 111_2 through 111_$N_1$ with T+1 inputs and one output so as to select the $N_t$-k pieces of the shift data #1 through #$N_t$-k from the head in the direction of cyclic shift of the M pieces of the shift data #1 through #M that the barrel shifter 61 of M units outputs as output data #1 through #$N_t$-k as is, and then so as to select k pieces of the shift data #$N_t$-k+(M-$N_t$)+1, ..., #M positioned downward (backward) by M-$N_t$ pieces as output data #$N_t$-k+1 through #$N_t$.

With the selector 111_$n$ (n=2, 3, ..., $N_1$), the shift data #n that the barrel shifter 61 (FIG. 17) outputs is supplied to the first input terminal #0 of the T+1 input terminals. Further, of the second through T+1'th input terminals #1 through #T, the shift data #n+(M-$N_t$) positioned backward from the shift data #n by M-$N_t$ pieces is supplied to the t+1'th input terminal #t.

However, in the event that there is no shift data #n+(M-$N_t$) positioned backward from the shift data #n by M-$N_t$ pieces, no data is supplied to the t+1'th input terminal #t (invalid data is supplied thereto).

Specifically, for example, with regard to the selector 111_$N_T$+1, there is no shift data backward from the shift data #$N_T$+1 by M-$N_T$ pieces, #$N_T$+1+(M-$N_T$) ($N_T$+1+(M-$N_T$)>M holds), and accordingly, no data is supplied to the T+1'th input terminal #T thereof.

Also, for example, with regard to the selector 111_$N_1$, there is shift data #$N_1$+(M-$N_1$) backward from the shift data #$N_1$ by M-$N_1$ pieces, but with regard to a range where the t is 2 through T, there is no shift data #$N_1$+(M-$N_t$) backward from the shift data #$N_1$ by M-$N_t$ pieces ($N_1$+(M-$N_t$)>M holds), and accordingly, no data is supplied to the third through T+1'th input terminal #2 through #T thereof.

The selector 111_$n$ selects, with regard to n that is an integer in a range of 2 through $N_t$, the shift data #n (n'th shift data) supplied to the first input terminal #0, or the shift data #n+(M-$N_t$)(n+(M-$N_t$)'th shift data) supplied to the t+1'th input terminal #t, and outputs as output data #n (n'th output data).

Specifically, in addition to the shift data #n and #n+(M-$N_1$), #n+(M-$N_2$), ..., #n+(M-$N_T$) that the barrel shifter 61 (FIG. 17) outputs, the n-1'th c_n (from the head) of the selection control signals c_2, c_3, ..., c_$N_1$ from the selection control circuit 103 (FIG. 17) is supplied to the selector 111_$n$.

In the event that the n-1'th c_n of the selection control signals from the selection control circuit 103 is "0", the selector 111_$n$ selects the shift data #n supplied to the first input terminal #0, and outputs as output data #n.

Also, in the event that the n-1'th c_n of the selection control signals from the selection control circuit 103 is t, the selector 111_$n$ selects the shift data #n+(M-$N_t$) supplied to the t+1'th input terminal #t, and outputs as output data #n.

As described above, with the selecting circuit 102 including the $N_t$-1 selectors 111_2 through 111_$N_1$, the barrel shifter 61 (FIG. 17) cyclically shifts parallel data made up of the M pieces of the input data #1 through #M, and as results of cyclic shift thereof, in the event of outputting the M pieces of the shift data #1 through #M, outputs the first shift data #1 as first output data #1, and with the selector 111_$n$, the n'th shift data #n is selected and output as n'th output data #n, and the $N_1$+1 through M'th shift data #$N_1$+1 through #M are selected and output as $N_1$+1 through M'th output data #$N_1$+1 through #M.

On the other hand, in the event that the barrel shifter 61 (FIG. 17) cyclically shifts parallel data made up of the $N_t$ pieces smaller than the M pieces of the input data #1 through #$N_t$, and as results of cyclic shift thereof, outputs the M pieces of the shift data #1 through #M, with the selecting circuit 102, the first shift data #1 is output as the first output data #1, and with the first through $N_t$-k-1'th selectors 111_2 through 111_$N_t$-k, the n'th shift data #n is selected and output as the n'th output data #n, and with the $N_t$-k through $N_t$-1'th selectors 111_$N_t$-k+1 through 111_$N_t$, the n+(M-$N_t$)'th shift data #n+(M-$N_t$) is selected and output as the n'th output data #n.

The selection control circuit 103 generates selection control signals c_2 through c_$N_1$ for operating the selecting circuit 102 as described above, based on the selection signal and shift amount k supplied from the control device 34 (FIG. 3), and supplies to the selecting circuit 102, thereby controlling selection of shift data by the selectors 111_2 through 111_$N_1$ of the selecting circuit 102.

Specifically, as to the cyclic shift device 33 in FIG. 17, the control device 34 supplies the selection signal representing cyclic shift of one of the M units, or $N_1$, $N_2$, ..., $N_{T-1}$, or otherwise $N_T$ units.

In the event that the selection signal from the control device 34 represents cyclic shift of the M units, the selection control circuit 103 generates selection control signals c_2 through c_$N_1$ of which the values are all "0", and supplies to the selecting circuit 102.

Also, in the event that the selection signal from the control device 34 represents cyclic shift of $N_t$ units, the selection control circuit 103 refers to a conversion table for converting the shift amount k from the control device 34 into selection control signals c_2 through c_$N_1$ to generate the selection control signals c_2 through c_$N_1$, and supplies to the selecting circuit 102.

The conversion table to which the selection control circuit 103 refers will be described later.

Figure 19:
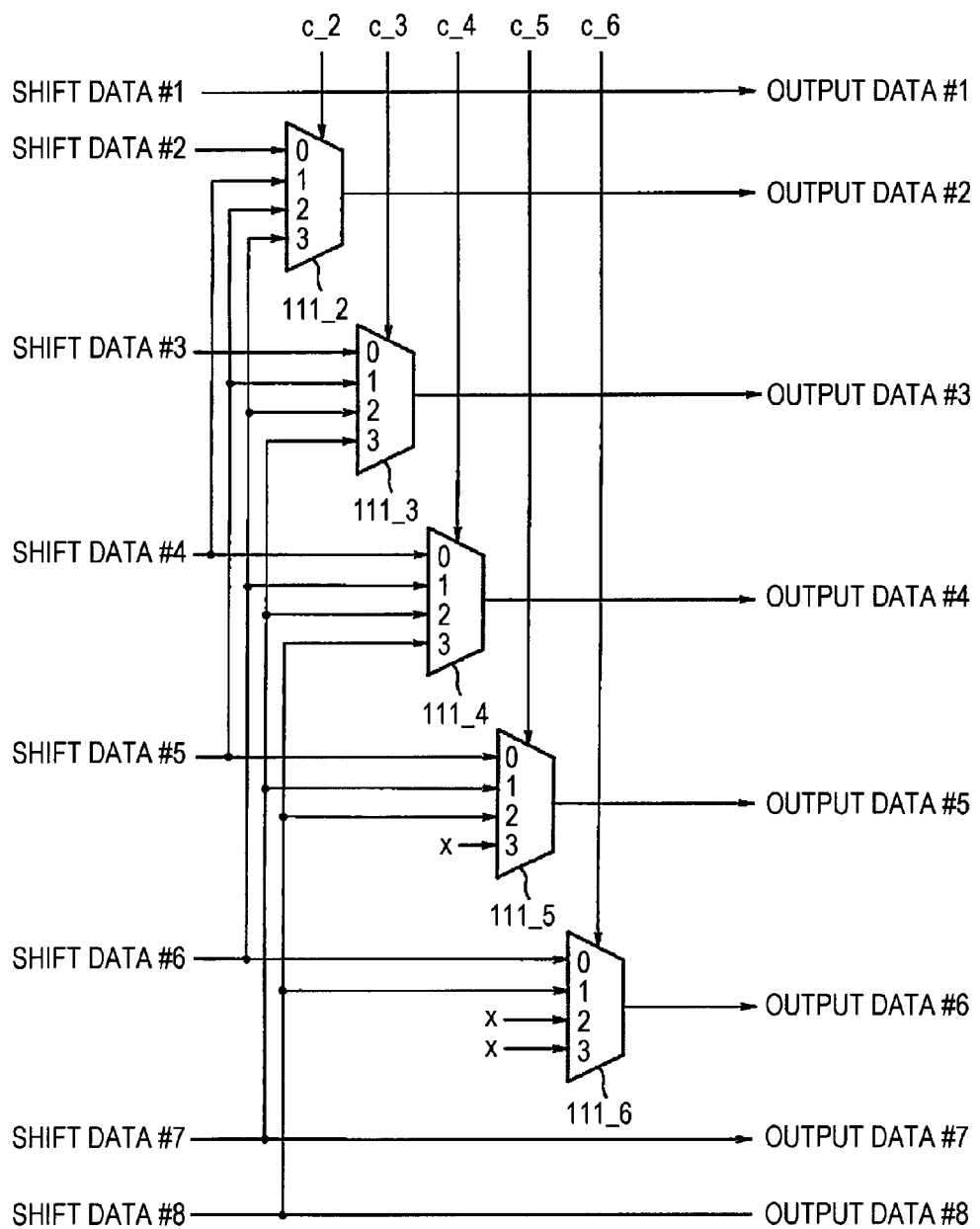
FIG. 19 is a block diagram illustrating a configuration example of the selecting circuit 102 in the event that the M is 8, and $N_1$, $N_2$, and $N_3$ are 6, 5, and 4 respectively.

FIG. 19 illustrates a configuration example of the selecting circuit 102 in the event that the M is 8, and the N can take three (=T) integer values $N_1$=6, $N_2$=5, and $N_3$=4.

In the event that the M is 8, and the $N_1$ is 6, the selecting circuit 102 is configured of five (=$N_1$-1) selectors 111_2 through 111_6.

The selector 111_$n$ includes four (=T+1) input terminals #0 through #3. Subsequently, the shift data #n that the barrel shifter 61 (FIG. 17) outputs is supplied to the first input terminal #0, and the shift data #n+(M-$N_t$) backward from the shift data #n by M-$N_t$ pieces is supplied to the t+1'th input terminal #t.

Specifically, with regard to the selector 111_2, the shift data #2 is supplied to the first input terminal #0, the shift data

4 is supplied to the second input terminal #1, the shift data #5 is supplied to the third input terminal #2, and the shift data #6 is supplied to the fourth input terminal #3, respectively.

With regard to the selector 111_3, the shift data #3 is supplied to the first input terminal #0, the shift data #5 is supplied to the second input terminal #1, the shift data #6 is supplied to the third input terminal #2, and the shift data #7 is supplied to the fourth input terminal #3, respectively.

With regard to the selector 111_4, the shift data #4 is supplied to the first input terminal #0, the shift data #6 is supplied to the second input terminal #1, the shift data #7 is supplied to the third input terminal #2, and the shift data #8 is supplied to the fourth input terminal #3, respectively.

With regard to the selector 111_5, the shift data #5 is supplied to the first input terminal #0, the shift data #7 is supplied to the second input terminal #1, and the shift data #8 is supplied to the third input terminal #2, respectively. Note that, with regard to the selector 111_5, no data is supplied to the fourth input terminal #3.

With regard to the selector 111_6, the shift data #6 is supplied to the first input terminal #0, and the shift data #8 is supplied to the second input terminal #1. Note that, with regard to the selector 111_5, no data is supplied to the third input terminal #2 and the fourth input terminal #3.

Further, the n−1'th (n−1'th from the head) c_n of the selection control signals c_2, c_3, c_4, c_5, and c_6 from the selection control circuit 103 (FIG. 17) is supplied to the selector 111_n.

In the event that the n−1'th c_n of the selection control signals from the selection control circuit 103 is "0", the selector 111_n selects the shift data #n supplied to the first input terminal #0, and outputs as output data #n.

Also, in the event that the n−1'th c_n of the selection control signals from the selection control circuit 103 is t, the selector 111_n selects the shift data #n+(M−$N_t$) supplied to the t+1'th input terminal #t, and outputs as the output data #n.

Note that the selecting circuit 102 is configured so as to output the shift data #1, and #$N_1$+1, #$N_1$+2, ..., #M from the barrel shifter 61 as output data #1, and #$N_1$+1, #$N_1$+2, ..., #M as is.

Specifically, in FIG. 19, with the selecting circuit 102, the shift data #1, #7, and #8 are output as output data #1, #7, and #8 as is.

In the event that the barrel shifter 61 (FIG. 17) cyclically shifts parallel data made up of eight (=M) pieces of input data #1 through #8, and outputs, as results of cyclic shift thereof, eight pieces of the shift data #1 through #8, the selection control circuit 103 (FIG. 17) generates selection control signals c_2 through c_6 of which the values are all "0", and supplies to the selecting circuit 102.

In this case, with the selecting circuit 102, the shift data #1 from the barrel shifter 61 is output as output data #1. Also, with the selecting circuit 102, the shift data #2 through #6 from the barrel shifter 61 are selected and output as output data #2 through #6 at the selectors 111_2 through 111_6 in accordance with the selection control signals c_2 through c_6, respectively. Further, with the selecting circuit 102, the shift data #7 and #8 from the barrel shifter 61 are output as output data #7 and #8, respectively.

On the other hand, in the event that the barrel shifter 61 (FIG. 17) cyclically shifts parallel data made up of $N_t$ pieces smaller than eight (=M) pieces of input data #1 through #$N_t$ (here, one of the $N_1$=6, $N_2$=5, and $N_3$=4), and outputs, as results of cyclic shift thereof, eight pieces of the shift data #1 through #8 (where, of these, the M−$N_t$ pieces of shift data are invalid data), the selection control circuit 103 refers to the conversion table to generate selection control signals c_2 through c_6 based on the shift amount K for cyclically shifting the $N_t$ pieces of the input data #1 through #$N_t$, and supplies to the selecting circuit 102.

FIG. 20 illustrates the conversion table to which the selection control circuit 103 refers in the event that the selecting circuit 102 is configured as illustrated in FIG. 19.

In the event that the conversion table is configured as a table wherein the horizontal axis represents the selection control signal c_n, and also the vertical axis represents the shift amount k as illustrated in FIG. 20, the conversion table to be referred at the time of performing cyclic shift of $N_t$ units is a matrix of which the width×length is ($N_t$−1)×$N_t$ (matrix of which the row×column is $N_t$ row×($N_t$−1) column), and is a matrix wherein the component of a triangular portion on the upper left side including a component on diagonal lines is 0, and the component of a triangular portion on the lower right side is t.

Specifically, A in FIG. 20 illustrates the conversion table in the event of performing cyclic shift of $N_1$ units, i.e., six (=$N_1$) units.

According to the conversion table in A in FIG. 20, in the event that the shift amount k is, for example, as described in FIG. 10, 3, the selection control circuit 103 generates 0, 0, 1, 1, 1 as selection control signals c_2 through c_6, and supplies to the selecting circuit 102.

In this case, with the selecting circuit 102, the shift data #1, #7, and #8 from the barrel shifter 61 are output as output data #1, #7, and #8, respectively. However, the output data #7 and #8 that are the last M−$N_1$ pieces of output data are not handled as results of cyclic shift, and discarded for example. Note that the output data #7 and #8 may be output as is.

Also, with the selecting circuit 102, the shift data #2 and #3 from the barrel shifter 61 are selected and output at the selectors 111_2 and 111_3 as output data #2 and #3 in accordance with the selection control signals c_2 and c_3 of which the values are "0", respectively.

Further, with the selecting circuit 102, the shift data #6 through #8 from the barrel shifter 61 are selected and output at the selectors 111_4 through 111_6 as output data #4 and #6 in accordance with the selection control signals c_4 through c_6 of which the values are "1", respectively.

As described above, with the selecting circuit 102, the shift data #1, #2, #3, and #6 through #8 from the barrel shifter are output as output data #1 through #6, respectively.

In the event that the shift amount k is 3, as described above in FIG. 10, as to the input data #1 through #6, the shift data #1 through #8 that the barrel shifter 61 outputs become the alignment of the input data #4, #5, #6, x, y, #1, #2, and #3.

Accordingly, as described above, with the selecting circuit 102, the shift data #1, #2, #3, and #6 through #8 from the barrel shifter 61 are output as output data #1 through #6, respectively, whereby the output data #1 through #6 thereof become the alignment of the input data #4, #5, #6, #1, #2, and #3 obtained by cyclically shifting the input data #1 through #6 by the shift amount k=3.

B in FIG. 20 illustrates a conversion table in the event of performing cyclic shift of $N_2$ units, i.e., five (=$N_2$) units.

According to the conversion table in B in FIG. 20, in the event that the shift amount k is, for example, 3, the selection control circuit 103 generates 0, 2, 2, 2 as selection control signals c_2 through c_5, and supplies to the selecting circuit 102.

In this case, with the selecting circuit 102, the shift data #1 from the barrel shifter 61 is output as output data #1.

Also, with the selecting circuit 102, the shift data #2 from the barrel shifter 61 is selected and output at the selector 111_2 as output data #2 in accordance with the selection control signal c_2 of which the value is "0".

Further, with the selecting circuit 102, the shift data #6 through #8 from the barrel shifter 61 are selected and output at the selector 111_3 through 111_5 as output data #3 and #5 in accordance with the selection control signal c_3 through c_5 of which the values are "2".

As described above, with the selecting circuit 102, the shift data #1, #2, and #6 through #8 from the barrel shifter 61 are output as output data #1 through #5, respectively.

In the event that the shift amount k is 3, as to the input data #1 through #5, the shift data #1 through #8 that the barrel shifter 61 outputs become the alignment of the input data #4, #5, x, x, x, #1, #2, and #3. Here, cross marks (x marks) represent invalid data.

Accordingly, as described above, with the selecting circuit 102, the shift data #1, #2, and #6 through #8 from the barrel shifter 61 are output as output data #1 through #5 respectively, whereby the output data #1 through #5 thereof become the alignment of the input data #4, #5, #1, #2, and #3 obtained by cyclically shifting the input data #1 through #5 by the shift amount k=3.

Note that, in this case, the output data #6 through #8 are invalid data and discarded at the selecting circuit 102 for example. However, the output data #6 through #8 may be output as is.

C in FIG. 20 illustrates a conversion table in the event of performing cyclic shift of $N_3$ units, i.e., four (=$N_3$) units.

According to the conversion table in C in FIG. 20, in the event that the shift amount k is, for example, 3, the selection control circuit 103 generates 3, 3, 3 as selection control signals c_2 through c_4, and supplies to the selecting circuit 102.

In this case, with the selecting circuit 102, the shift data #1 from the barrel shifter 61 is output as output data #1.

Also, with the selecting circuit 102, the shift data #6 through #8 from the barrel shifter 61 are selected and output at the selectors 111_2 through 111_4 as output data #2 and #4 in accordance with the selection control signals c_2 through c_4 of which the values are "3", respectively.

As described above, with the selecting circuit 102, the shift data #1, and #6 through #8 from the barrel shifter 61 are output as output data #1 through #4, respectively.

In the event that the shift amount k is 3, as to the input data #1 through #4, the shift data #1 through #8 that the barrel shifter 61 outputs become the alignment of the input data #4, x, x, x, x, #1, #2, and #3.

Accordingly, as described above, with the selecting circuit 102, the shift data #1, and #6 through #8 from the barrel shifter 61 are output as output data #1 through #4 respectively, whereby the output data #1 through #4 thereof become the alignment of the input data #4, #1, #2, and #3 obtained by cyclically shifting the input data #1 through #4 by the shift amount k=3.

Note that, in this case, the output data #5 through #8 are invalid data and discarded at the selecting circuit 102 for example. However, the output data #5 through #8 may be output as is.

As described above, with the cyclic shift device 33 including the barrel shifter 61 of M units, in the event of cyclically shifting parallel data made up of $N_t$ pieces smaller than the M pieces of input data by the shift amount k less than the $N_t$, the selecting circuit 102 selects and outputs the first through $N_t$-k'th shift data #1 through #$N_t$-k from the head in the direction of cyclic shift that the barrel shifter 61 performs as first through $N_t$-k'th output data #1 through #$N_t$-k, and selects and outputs the $N_t$-k+1+(M-$N_t$)'th through $N_t$+(M-$N_t$)'th shift data #M-k+1 through #M from the head in the direction of cyclic shift that the barrel shifter 61 performs as $N_t$-k+1'th through $N_t$'th output data #$N_t$-k+1'th through #$N_t$, whereby cyclic shift of $N_t$ pieces smaller than the M pieces of input data, i.e., cyclic shift of $N_1$, $N_2$, ..., $N_{T-1}$, and $N_T$ units can be performed taking advantage of the barrel shifter 61 of M units in addition to cyclic shift of the M pieces of input data.

Accordingly, cyclic shift of T+1 types of units in total of the M units, and T types less than the M (two or more) of units can be performed without providing a barrel shifter in addition to the barrel shifter 61 of M units, and the cyclic shift device 33 can be configured in a small size.

As described above, T multiple integer values $N_1$, $N_2$, ..., $N_T$ are employed as the N smaller than the M, whereby the LDPC decoding device in FIG. 3 can be shared in three types or more broadcasting methods.

Specifically, as described above, with DVB-S2, the number P of columns of the units of a cyclic structure is 360, and with highly advanced BS, the number P of columns of the units of a cyclic structure is 374.

Also, for example, with the DTMB (Digital Terrestrial Multimedia Broadcast) that is China's terrestrial digital broadcast specifications, 127 is employed as the number P of columns of the units of a cyclic structure.

Further, with new broadcast specifications which will newly be designed (or according to a modification of existing broadcast specifications), a value different from 374, 360, and 127, for example, such as 256 or the like, may be employed as the number P of columns of the units of a cyclic structure.

Accordingly, for example, three integer values $N_1$, $N_2$, and $N_3$ are employed as the N, and the M is set to 374, and also the $N_1$, $N_2$, and $N_3$ are set to 360, 256, and 127 respectively, whereby the LDPC decoding device in FIG. 3 can be shared by four broadcasting methods (specifications) of DVB-S2, highly advanced BS, DTMB, and new broadcast specifications.

Next, in the above case, the number P of columns of the units of a cyclic structure is employed as the computation unit Q of the LDPC decoding device in FIG. 3, but in addition thereto, a divisor P' other than 1 and P of the number P of columns of the units of a cyclic structure may be employed as the computation unit Q, for example.

Specifically, in the event that a parity check matrix is structured of a configuration matrix of P×P, the configuration matrix of P×P thereof may be divided into, as if it were, configuration matrices of P'×P' that are divisors of the P by replacement of rows or columns being performed according to need.

Accordingly, in the event that the divisor P' of the number P of columns of the units of a cyclic structure is employed as the computation unit Q, decoding of LDPC code can also be performed in the same way as with the case of employing the number P of columns of the units of a cyclic structure as the computation unit Q.

FIG. 21 illustrates a configuration matrix of P×P, and configuration matrices of P'×P' obtained by dividing the configuration matrix thereof.

Specifically, A in FIG. 21 illustrates a configuration matrix of 6×6 serving as the configuration matrix of P×P.

The configuration matrix in A in FIG. 21 is a shift matrix obtained by cyclically shifting a unit matrix 6×6 to the right by one column.

B in FIG. 21 illustrates a state in which the configuration matrix of 6×6 in A in FIG. 21 is divided into four configuration matrices of 3×3 that is a divisor of 6.

The configuration matrix of 6×6 in A in FIG. 21 can be divided into four configuration matrices of 3×3 as illustrated in B in FIG. 21 by performing row replacement wherein the first row (first line) thereof is replaced by the first row, the third row is replaced by the second row, the fifth row by the third row, the second row by the fourth row, the fourth row by the fifth row, and the sixth row by the sixth row respectively, and also column replacement wherein the first column (first column) is replaced by the first column, the third column is replaced by the second column, the fifth column by the third column, the second column by the fourth column, the fourth column by the fifth column, and the sixth column by the sixth column respectively.

C in FIG. 21 illustrates a state in which the configuration matrix of 6×6 in A in FIG. 21 is divided into nine configuration matrices of 2×2 that is a divisor of 6.

The configuration matrix of 6×6 in A in FIG. 21 can be divided into nine configuration matrices of 2×2 as illustrated in C in FIG. 21 by performing row replacement wherein the first row thereof is replaced by the first row, the fourth row is replaced by the second row, the second row by the third row, the fifth row by the fourth row, the third row by the fifth row, and the sixth row by the sixth row respectively, and also column replacement wherein the first column is replaced by the first column, the fourth column is replaced by the second column, the second column by the third column, the fifth column by the fourth column, the third column by the fifth column, and the sixth column by the sixth column respectively.

According to division of a configuration matrix as described above, the divisor P' of the number P of columns of the units of a cyclic structure may be employed as the computation unit Q, and accordingly, the LDPC decoding device in FIG. 3 can further be reduced in size, and also increase in efficiency can be attained.

Specifically, for example, with the DTMB that is China's terrestrial digital broadcast specifications, as described above, 127 is employed as the number P of columns of the units of a cyclic structure.

Now, if we say that the LDPC decoding device in FIG. 3 is shared between DVB-S2 and the DTMB, and the number P of columns of the units of a cyclic structure is employed, the computation unit Q regarding DVB-S2 is 360 (=P), and the computation unit Q regarding DTMB is 127 (=P).

In this case, with the cyclic shift device 33 in FIG. 8, the M is 360, and the N is 127.

In the event that the M is 360, the minimum integer K of $\log_2 M$ or more is 9, and accordingly, a barrel shifter is needed as the barrel shifter 61 wherein nine (=K) steps of selectors with two inputs and one output are disposed.

However, with cyclic shift of 127 units, of nine steps of selectors, only selectors from the first step through the seventh step (the minimum integer of $\log_2 M$ or more) are needed (not used).

Accordingly, in the event that the M is 360, and the N is 127, a barrel shifter where nine steps of selectors are disposed is needed to be employed as the barrel shifter 61, which is not effective, and increases the cyclic shift device 33 in size.

Therefore, for example, 180 that is the divisor P' of the number P of columns (=360) of the units of a cyclic structure is employed as the computation unit Q regarding DVB-S2, whereby a barrel shifter where a small number of steps of selectors are disposed can be employed as the barrel shifter 61, and as a result thereof, reduction in size of the cyclic shift device 33 in FIG. 8 (consequently, the LDPC decoding device in FIG. 3), and efficiency can be realized.

Specifically, in the event that 180 that is the divisor P' of the number P of columns (=360) of the units of a cyclic structure is employed as the computation unit Q regarding DVB-S2, the M is 180, and the N is 127.

In the event that the M is 180, the minimum integer K of $\log_2 M$ or more is 8, and the barrel shifter 61 becomes a barrel shifter where 180 (=M) selectors with two inputs and one output are disposed by eight (=K) steps.

Accordingly, in the event that the M is 180, the barrel shifter 61 can be configured of a small size as compared to a case where the M is 360, and can further effectively be used.

Note that, in the event that T integer values $N_1$ through $N_T$ are employed as the N, the divisor P' of the number P of columns of the units of a cyclic structure can also be employed as the computation unit Q according to need.

Specifically, in the event that the LDPC decoding device in FIG. 3 is shared for, for example, four broadcasting methods of DVB-S2, highly advanced BS, DTMB, and new broadcast specifications, for example, 180 that is the divisor P' of the number P of columns (=360) of the units of a cyclic structure is employed as the computation unit Q regarding DVB-S2, 187 that is the divisor P' of the number P of columns (=374) of the units of a cyclic structure is employed as the computation unit Q regarding highly advanced BS, 127 that is the number P of columns of the units of a cyclic structure is employed as the computation unit Q regarding the DTMB, and 128 that is the divisor P' of the number P of columns (=256) of the units of a cyclic structure is employed as the computation unit Q regarding the new broadcast specifications, respectively.

Subsequently, the LDPC decoding device in FIG. 3 can be shared for four broadcasting methods of DVB-S2, highly advanced BS, DTMB, and new broadcast specifications by setting the M to 187, and also setting the $N_1$, $N_2$, and $N_3$ to 180, 128, and 127.

As described above, the barrel shifter 61 can effectively be used in the event that the value of the M approximates to the value of the N ($N_r$).

Figure 22:
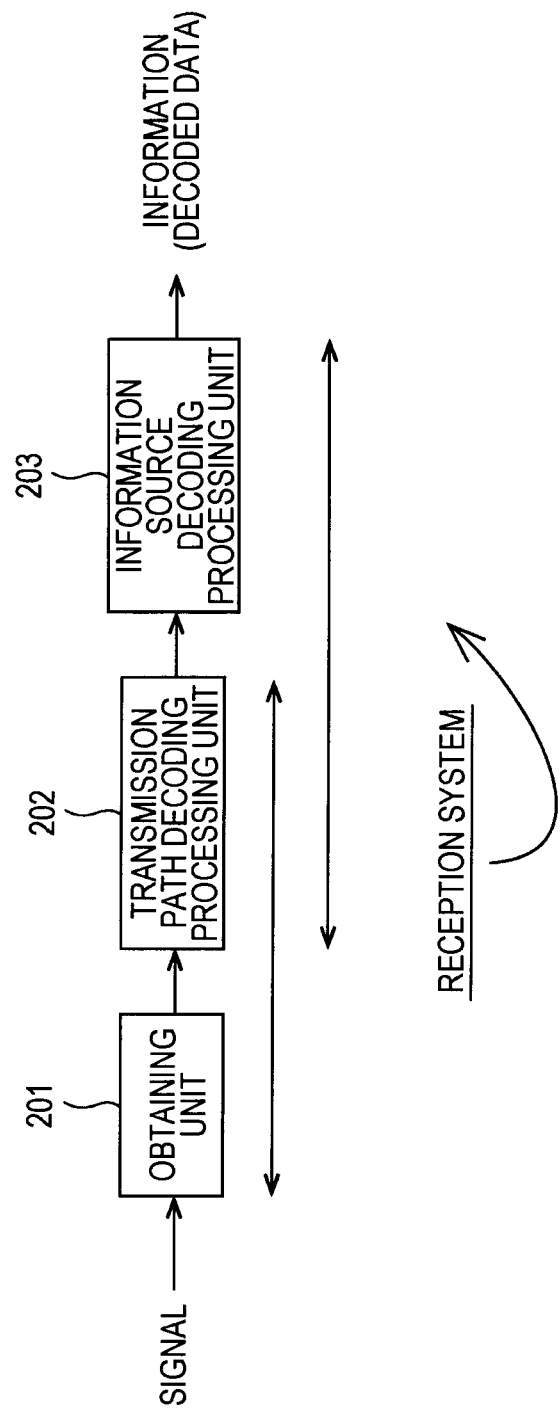
FIG. 22 is a block diagram illustrating a configuration example of a first embodiment of the reception system to which the present invention has been applied.

Next, FIG. 22 is a block diagram illustrating a configuration example of a first embodiment of the reception system to which the present invention has been applied.

In FIG. 22, the reception system is configured of an obtaining unit 201, a transmission path decoding processing unit 202, and an information source decoding processing unit 203.

The obtaining unit 201 is configured, for example, in the same way as the obtaining unit 11 in FIG. 1, and obtains a signal via an unshown transmission path, for example, such as terrestrial digital broadcast, satellite digital broadcast, CATV network, Internet, another network, or the like, and supplies to the transmission path decoding processing unit 202.

The transmission path processing unit 202 subjects the signal that the obtaining unit 201 obtained via the transmission path to transmission path decoding processing including at least processing for correcting an error caused on the transmission path, and supplies a signal obtained as a result thereof to the information source decoding processing unit 203.

Specifically, the signal that the obtaining unit 201 obtained via the transmission path is a signal obtained by performing at least error correction encoding for correcting an error caused on the transmission path, and the transmission path decoding processing unit 202 subjects such a signal to transmission path decoding processing, for example, such as error correction processing or the like.

Here, examples of the error correction encoding include LDPC coding, and Reed-Solomon coding. Here, at least LDPC coding is performed as error correction encoding.

Also, the transmission path decoding processing may include demodulation of a modulated signal, or the like.

The information source decoding processing unit 203 subjects the signal subjected to the transmission path decoding processing to information source decoding processing including at least processing for decompressing the compressed information to obtain the original information.

Specifically, the signal that the obtaining unit 201 obtained via the transmission path might have been subjected to compression encoding for compressing information to reduce the data amount such as an image or audio serving as information, and in this case, the information source decoding processing unit 203 subjects the signal subjected to the transmission path decoding processing to information source decoding processing such as processing for decompressing compressed information to obtain the original information (decompression processing), or the like.

Note that, in the event that the signal that the obtaining unit 201 obtained via the transmission path has not been subjected to compression encoding, the processing for decompressing compressed information to obtain the original information is not performed at the information source decoding processing unit 203.

Here, examples of the decompression processing include, for example, MPEG decoding. Also, the transmission path decoding processing may include descrambling or the like in addition to the decompression processing.

With the reception system thus configured, at the obtaining unit 201, for example, data such as an image or audio is subjected to compression encoding such as MPEG coding or the like, and further, a signal subjected to error correction encoding such as LDPC coding or the like is obtained via the transmission path, and supplied to the transmission path decoding processing unit 202.

With the transmission path decoding processing unit 202, the signal from the obtaining unit 201 is subjected to the same processing as with the demodulating unit 12 in FIG. 1 as the transmission path decoding processing, and the signal obtained as a result thereof is supplied to the information source decoding processing unit 203.

With the information source decoding processing unit 203, the signal from the transmission path decoding processing unit 202 is subjected to the same processing as with the decoder 14 in FIG. 1 as the information source decoding processing, and an image or audio obtained as a result thereof is output.

The reception system in FIG. 22 as described above can be applied to, for example, a television tuner for receiving television broadcast serving as digital broadcast, or the like.

Note that the obtaining unit 201, transmission path decoding processing unit 202, and information source decoding processing unit 203 may be configured as a standalone device (hardware (IC (Integrated Circuit) or the like))) or a software module).

Also, with regard to the obtaining unit 201, transmission path decoding processing unit 202, and information source decoding processing unit 203, a set of the obtaining unit 201 and the transmission path decoding processing unit 202, a set of the transmission path decoding processing unit 202, and information source decoding processing unit 203, and a set of the obtaining unit 201, transmission path decoding processing unit 202, and information source decoding processing unit 203 may be configured as a standalone device.

Figure 23:
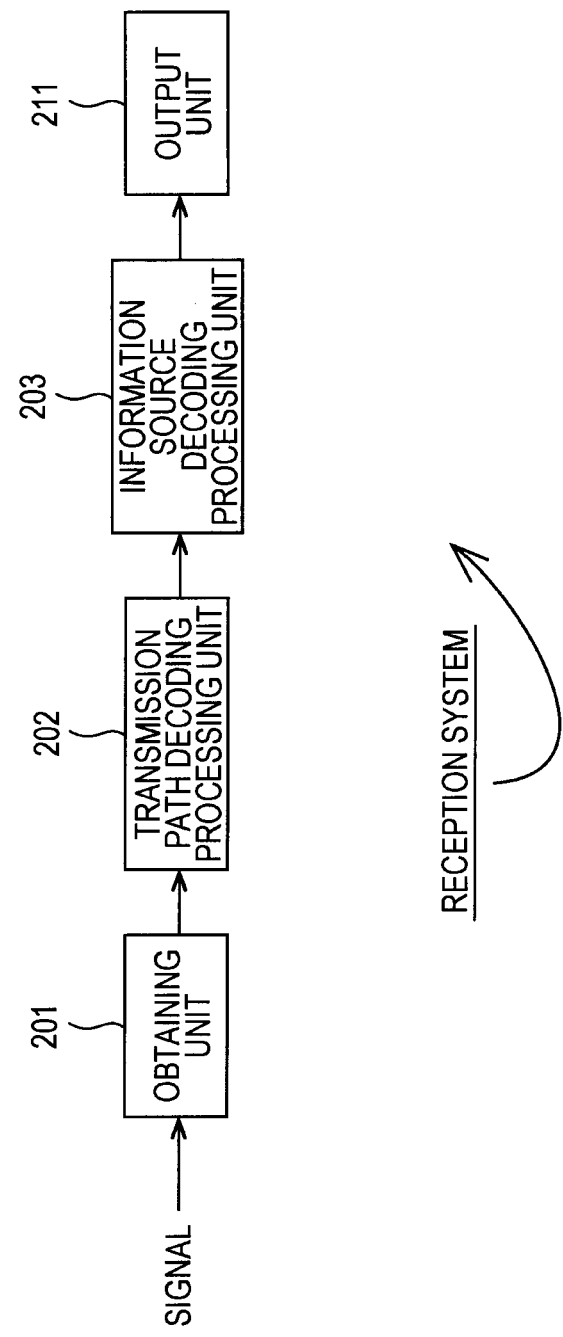
FIG. 23 is a block diagram illustrating a configuration example of a second embodiment of the reception system to which the present invention has been applied.

FIG. 23 is a block diagram illustrating a configuration example of a second embodiment of the reception system to which the present invention has been applied.

Note that portions corresponding to the case in FIG. 22 are denoted with the same reference numerals, and hereafter, description thereof will be omitted as appropriate.

The reception system in FIG. 23 is common to the case in FIG. 22 in that the obtaining unit 201, transmission path decoding processing unit 202, and information source decoding processing unit 203 are included, and differs from the case in FIG. 22 in that an output unit 211 is newly provided.

The output unit 211 is, for example, a display device for displaying an image, or a speaker for outputting audio, and outputs an image or audio or the like serving the signal output from the information source decoding processing unit 203. Specifically, the output unit 211 displays an image or outputs audio.

The reception system in FIG. 23 as described above can be applied to, for example, a television for receiving television broadcast serving as digital broadcast, a radio receiver for receiving radio broadcast, and so forth.

Note that, in the event that the signal obtained at the obtaining unit 201 has not been subjected to compression encoding, the signal that the transmission path decoding processing unit 202 outputs is supplied to the output unit 211.

Figure 24:
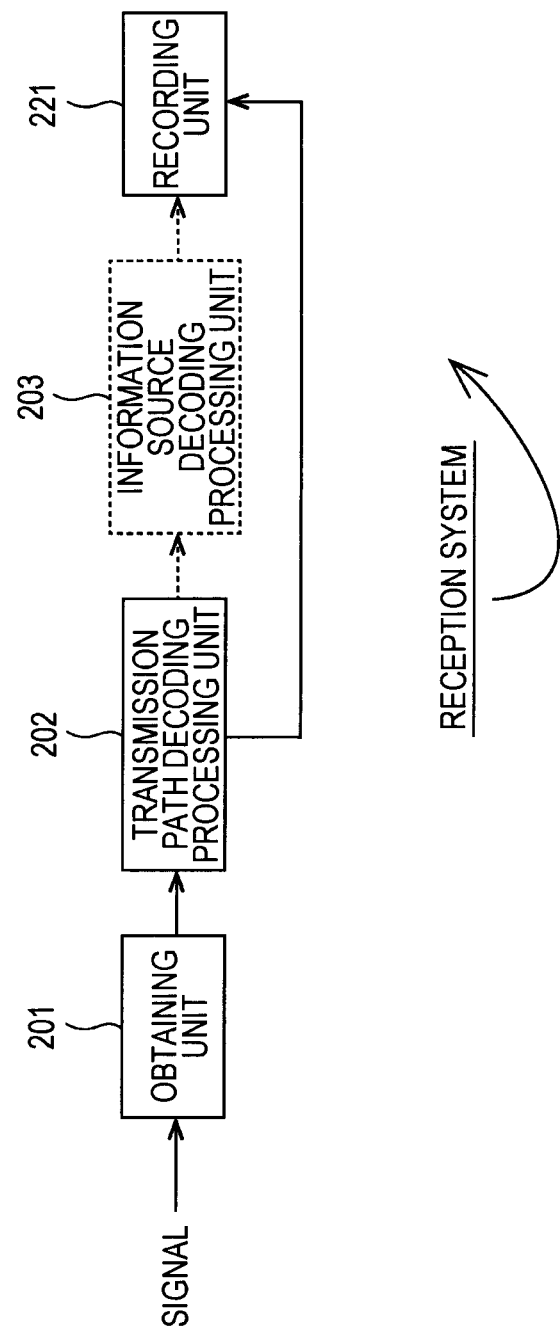
FIG. 24 is a block diagram illustrating a configuration example of a third embodiment of the reception system to which the present invention has been applied.

FIG. 24 is a block diagram illustrating a configuration example of a third embodiment of the reception system to which the present invention has been applied.

Note that portions corresponding to the case in FIG. 22 are denoted with the same reference numerals, and hereafter, description thereof will be omitted as appropriate.

The reception system in FIG. 24 is common to the case in FIG. 22 in that the obtaining unit 201 and transmission path decoding processing unit 202 are included.

However, the reception system in FIG. 24 differs from the case in FIG. 22 in that the information source decoding processing unit 203 is not provided, and a recoding unit 221 is newly provided.

The recording unit 221 records (stores) the signal that the transmission path decoding processing unit 202 outputs (e.g., a TS packet of TS of MPEG) in a recording (storage) medium such as an optical disc, hard disk (magnetic disk), flash memory, or the like.

The reception system in FIG. 24 as described above can be applied to a recorder for recording television broadcast, and so forth.

Note that, in FIG. 24, the reception system is configured by providing the information source decoding processing unit 203, and the signal subjected to the information source decoding processing at the information source decoding processing unit 203, i.e., an image or audio obtained by decoding can be recorded at the recording unit 221.

Description has been made so far regarding a case where the present invention has been applied to the LDPC decoding device for performing LDPC decoding, but in addition to this, the present invention may be applied to a device for performing variable length decoding, and other devices which require cyclic shift.

Note that an embodiment of the present invention is not restricted to the above embodiments, and various changes can be made without departing from the essence and spirit of the present invention.

REFERENCE SIGNS LIST

11 obtaining unit, 12 demodulating unit, 13 demultiplexer, 14 decoder, 15 display unit, 31 storage device, 32 computing device, $32_1$ through $32_M$ computing units, 33 cyclic shift device, 34 control device, 51, 52 barrel shifter, 53 selector, 61 barrel shifter, 62 selecting circuit, 63 selection control circuit, $71_1$ through $71_8$, $72_1$ through $72_8$, $73_1$ through $73_8$, $81_1$ through $81_N$ selectors, 102 selecting circuit, 103 selection control circuit, 111_2 through 111_$N_1$ selectors, 201 obtaining unit, 201 transmission path decoding processing unit, 203 information source decoding processing unit, 211 output unit, 221 recording unit

The invention claimed is:
1. A cyclic shift device comprising:
a barrel shifter configured to perform cyclic shift of M units for cyclically shifting parallel data made up of M pieces of input data to output M pieces of shift data; and
a selecting circuit configured to select said M pieces of shift data that said barrel shifter outputs, as M pieces of output data obtained by cyclically shifting said M pieces of input data;
wherein in the event of cyclically shifting said parallel data made up of N pieces of said input data smaller than said M pieces of input data by shift amount k less than said N,
said selecting circuit selects and outputs said first through N−k'th shift data from the head in the direction of cyclic shift that said barrel shifter performs, as said first through N−k'th output data,
and selects and outputs said N−k+1+(M−N) through N+(M−N)'th shift data from the head in the direction of cyclic shift that said barrel shifter performs, as N−k+1 through N'th output data.

2. The cyclic shift device according to claim 1, wherein said selecting circuit includes
N−1 selectors configured to select said n'th or n+(M−N)'th shift data regarding n that is an integer in a range of 2 through N and to output as said n'th output data,
and in the event that said barrel shifter cyclically shifts said parallel data made up of M pieces of said input data,
outputs said first shift data as said first output data, and with said n−1'th selector which selects said n'th or n+(M−N)'th shift data,
selects and outputs said n'th shift data as said n'th output data,
and outputs said N+1 through M'th shift data as said N+1 through M'th output data,
and in the event that said barrel shifter cyclically shifts said parallel data made up of N pieces of said input data by said shift amount k,
outputs said first shift data as said first output data,
and with said first through N−k−1'th selectors,
selects and outputs said n'th shift data as said n'th output data,
and with said N−k through N−1'th selectors,
selects and outputs said n+(M−N)'th shift data as said n'th output data.

3. The cyclic shift device according to claim 2, further comprising:
a selection control circuit configured to control selection of said shift data according to said selector based on a selection signal representing whether to perform cyclic shift of either said parallel data made up of said M pieces of said input data or said parallel data made up of said N pieces of said input data, and said shift amount k.

4. The cyclic shift device according to claim 1, wherein said M pieces are 374,
and wherein said N pieces are 360.

5. The cyclic shift device according to claim 1, wherein said N takes T multiple integer values $N_1, N_2, \ldots, N_T$ in a range of two or more but less than M,
and when of said T integer values $N_1, N_2, \ldots, N_T$, the t'th integer value in descending order is represented as $N_t$,
said selection circuit includes
$N_t-1$ selectors with T+1 inputs and 1 output configured to select said n, $n+(M-N_1), n+(M-N_2), \ldots, n+(M-N_{T-1})$ or $n+(M-N_T)$'th shift data regarding n that is an integer in a range of 2 through $N_1$ and to output as said n'th output data,
and in the event that said barrel shifter cyclically shifts said parallel data made up of M pieces of said input data,
outputs said first shift data as said first output data,
and with said n−1'th selector which selects said n, $n+(M-N_1), n+(M-N_2), \ldots, n+(M-N_{T-1})$ or $n+(M-N_T)$'th shift data,
selects and outputs said n'th shift data as said n'th output data,
and outputs said $N_1+1$ through M'th shift data as said $N_1+1$ through M'th output data,
and in the event that said barrel shifter cyclically shifts said parallel data made up of $N_t$ pieces of said input data by said shift amount k less than $N_t$,
outputs said first shift data as said first output data,
and with said first through $N_t-k-1$'th selectors,
selects and outputs said n'th shift data as said n'th output data,
and with said $N_t-k$ through $N_t-1$'th selectors,
selects and outputs said $n+(M-N_t)$'th shift data as said n'th output data.

6. A cyclic shift method, wherein in the event that a cyclic shift device including
a barrel shifter configured to perform cyclic shift of M units for cyclically shifting parallel data made up of M pieces of input data to output M pieces of shift data, and
a selecting circuit configured to select said M pieces of shift data that said barrel shifter outputs, as M pieces of output data obtained by cyclically shifting said M pieces of input data
cyclically shifts said parallel data made up of N pieces of said input data smaller than said M pieces of input data by shift amount k less than said N,
said selecting circuit selects and outputs said first through N−k'th shift data from the head in the direction of cyclic shift that said barrel shifter performs, as said first through N−k'th output data,
and selects and outputs said N−k+1+(M−N) through N+(M−N)'th shift data from the head in the direction of cyclic shift that said barrel shifter performs, as N−k+1 through N'th output data.

7. An LDPC decoding device comprising:
M computing means configured to simultaneously perform, regarding Q multiple nodes with said M being equal to or greater than said Q, the computation of a check node and the computation of a variable node for decoding LDPC (Low Density Parity Check) code; and
cyclic shift means configured to cyclically shift said Q messages corresponding said Q branches obtained as a result of one of the computation of said Q check nodes, and the computation of said Q variable nodes for the other computation to be performed next;
wherein said cyclic shift means include
a barrel shifter configured to perform cyclic shift of M units for cyclically shifting parallel data made up of M pieces of input data to output M pieces of shift data, and
a selecting circuit configured to select said M pieces of shift data that said barrel shifter outputs, as M pieces of output data obtained by cyclically shifting said M pieces of input data;
and wherein in the event that said Q is equal to said M, said computing means output said M messages, and said parallel data made up of said M pieces of said input data is cyclically shifted with said M messages as said M pieces of said input data, said selecting circuit selects and outputs said first through M'th shift data from the head in the direction of cyclic shift that said barrel shifter performs, as said first through M'th output data;

and wherein in the event that said Q is equal to N smaller than said M, said computing means output said N messages, and said parallel data made up of said N pieces of said input data is cyclically shifted by shift amount k less than N as said N pieces of said input data, said selecting circuit selects and outputs said first through N−k'th shift data from the head in the direction of cyclic shift that said barrel shifter performs, as said first through N−k'th output data, and selects and outputs said N−k+1+(M−N) through N+(M−N)'th shift data from the head in the direction of cyclic shift that said barrel shifter performs, as N−k+1 through N'th output data.

8. A television receiver comprising:

obtaining means configured to obtain transmission data including LDPC code obtained by subjecting the data of a program to at least LDPC (Low Density Parity Check) coding; and LDPC decoding means configured to decode LDPC code included in said transmission data;

wherein said LDPC decoding means include

M computing means configured to simultaneously perform, regarding Q multiple nodes with said M being equal to or greater than said Q, the computation of a check node and the computation of a variable node for decoding LDPC code, and cyclic shift means configured to cyclically shift said Q messages corresponding said Q branches obtained as a result of one of the computation of said Q check nodes, and the computation of said Q variable nodes for the other computation to be performed next;

and wherein said cyclic shift means include a barrel shifter configured to perform cyclic shift of M units for cyclically shifting parallel data made up of M pieces of input data to output M pieces of shift data, and a selecting circuit configured to select said M pieces of shift data that said barrel shifter outputs, as M pieces of output data obtained by cyclically shifting said M pieces of input data;

and wherein in the event that said Q is equal to said M, said computing means output said M messages, and said parallel data made up of said M pieces of said input data is cyclically shifted with said M messages as said M pieces of said input data, said selecting circuit selects and outputs said first through M'th shift data from the head in the direction of cyclic shift that said barrel shifter performs, as said first through M'th output data;

and wherein in the event that said Q is equal to N smaller than said M, said computing means output said N messages, and said parallel data made up of said N pieces of said input data is cyclically shifted by shift amount k less than N as said N pieces of said input data, said selecting circuit selects and outputs said first through N−k'th shift data from the head in the direction of cyclic shift that said barrel shifter performs, as said first through N−k'th output data, and selects and outputs said N−k+1+(M−N) through N+(M−N)'th shift data from the head in the direction of cyclic shift that said barrel shifter performs, as N−k+1 through N'th output data.

9. A reception system comprising:

a transmission path decoding processing unit configured to subject a signal obtained via a transmission path to transmission path decoding processing including at least processing for correcting an error caused at said transmission path; and an information source decoding processing unit configured to subject a signal subjected to said transmission path decoding processing to information source decoding processing including at least processing for decompressing compressed information to obtain the original information;

wherein the signal obtained via said transmission path is a signal obtained by performing at least compression encoding for compressing information, and error correction encoding for correcting an error caused at said transmission path;

and wherein said error correction encoding includes LDPC (Low Density Parity Check) coding;

and wherein said transmission path decoding processing unit includes

M computing means configured to simultaneously perform, regarding Q multiple nodes with said M being equal to or greater than said Q, the computation of a check node and the computation of a variable node for decoding LDPC code, and cyclic shift means configured to cyclically shift said Q messages corresponding said Q branches obtained as a result of one of the computation of said Q check nodes, and the computation of said Q variable nodes for the other computation to be performed next;

and wherein said cyclic shift means include a barrel shifter configured to perform cyclic shift of M units for cyclically shifting parallel data made up of M pieces of input data to output M pieces of shift data, and a selecting circuit configured to select said M pieces of shift data that said barrel shifter outputs, as M pieces of output data obtained by cyclically shifting said M pieces of input data;

and wherein in the event that said Q is equal to said M, said computing means output said M messages, and said parallel data made up of said M pieces of said input data is cyclically shifted with said M messages as said M pieces of said input data, said selecting circuit selects and outputs said first through M'th shift data from the head in the direction of cyclic shift that said barrel shifter performs, as said first through M'th output data;

and wherein in the event that said Q is equal to N smaller than said M, said computing means output said N messages, and said parallel data made up of said N pieces of said input data is cyclically shifted by shift amount k less than N as said N pieces of said input data, said selecting circuit selects and outputs said first through N−k'th shift data from the head in the direction of cyclic shift that said barrel shifter performs, as said first through N−k'th output data, and selects and outputs said N−k+1+(M−N) through N+(M−N)'th shift data from the head in the direction of cyclic shift that said barrel shifter performs, as N−k+1 through N'th output data.

10. A reception system comprising:
a transmission path decoding processing unit configured to subject a signal obtained via a transmission path to transmission path decoding processing including at least processing for correcting an error caused at said transmission path; and
an output unit configured to output an image or audio based on the signal subjected to said transmission path decoding processing;
wherein the signal obtained via said transmission path is a signal obtained by performing at least error correction encoding for correcting an error caused at said transmission path;
and wherein said error correction encoding includes LDPC (Low Density Parity Check) coding;
and wherein said transmission path decoding processing unit includes
M computing means configured to simultaneously perform, regarding Q multiple nodes with said M being equal to or greater than said Q, the computation of a check node and the computation of a variable node for decoding LDPC code, and
cyclic shift means configured to cyclically shift said Q messages corresponding said Q branches obtained as a result of one of the computation of said Q check nodes, and the computation of said Q variable nodes for the other computation to be performed next;
and wherein said cyclic shift means include
a barrel shifter configured to perform cyclic shift of M units for cyclically shifting parallel data made up of M pieces of input data to output M pieces of shift data, and
a selecting circuit configured to select said M pieces of shift data that said barrel shifter outputs, as M pieces of output data obtained by cyclically shifting said M pieces of input data;
and wherein in the event that said Q is equal to said M, said computing means output said M messages,
and said parallel data made up of said M pieces of said input data is cyclically shifted with said M messages as said M pieces of said input data,
said selecting circuit selects and outputs said first through M'th shift data from the head in the direction of cyclic shift that said barrel shifter performs, as said first through M'th output data;
and wherein in the event that said Q is equal to N smaller than said M,
said computing means output said N messages,
and said parallel data made up of said N pieces of said input data is cyclically shifted by shift amount k less than N as said N pieces of said input data,
said selecting circuit selects and outputs said first through N−k'th shift data from the head in the direction of cyclic shift that said barrel shifter performs, as said first through N−k'th output data,
and selects and outputs said N−k+1+(M−N) through N+(M−N)'th shift data from the head in the direction of cyclic shift that said barrel shifter performs, as N−k+1 through N'th output data.

11. A reception system comprising:
a transmission path decoding processing unit configured to subject a signal obtained via a transmission path to transmission path decoding processing including at least processing for correcting an error caused at said transmission path; and
a recording unit configured to record the signal subjected to said transmission path decoding processing;
wherein the signal obtained via said transmission path is a signal obtained by performing at least error correction encoding for correcting an error caused at said transmission path;
and wherein said error correction encoding includes LDPC (Low Density Parity Check) coding;
and wherein said transmission path decoding processing unit includes
M computing means configured to simultaneously perform, regarding Q multiple nodes with said M being equal to or greater than said Q, the computation of a check node and the computation of a variable node for decoding LDPC code, and
cyclic shift means configured to cyclically shift said Q messages corresponding said Q branches obtained as a result of one of the computation of said Q check nodes, and the computation of said Q variable nodes for the other computation to be performed next;
and wherein said cyclic shift means include
a barrel shifter configured to perform cyclic shift of M units for cyclically shifting parallel data made up of M pieces of input data to output M pieces of shift data, and
a selecting circuit configured to select said M pieces of shift data that said barrel shifter outputs, as M pieces of output data obtained by cyclically shifting said M pieces of input data;
and wherein in the event that said Q is equal to said M, said computing means output said M messages,
and said parallel data made up of said M pieces of said input data is cyclically shifted with said M messages as said M pieces of said input data,
said selecting circuit selects and outputs said first through M'th shift data from the head in the direction of cyclic shift that said barrel shifter performs, as said first through M'th output data;
and wherein in the event that said Q is equal to N smaller than said M,
said computing means output said N messages,
and said parallel data made up of said N pieces of said input data is cyclically shifted by shift amount k less than N as said N pieces of said input data,
said selecting circuit selects and outputs said first through N−k'th shift data from the head in the direction of cyclic shift that said barrel shifter performs, as said first through N−k'th output data,
and selects and outputs said N−k+1+(M−N) through N+(M−N)'th shift data from the head in the direction of cyclic shift that said barrel shifter performs, as N−k+1 through N'th output data.

12. A reception system comprising:
obtaining means configured to obtain a signal via a transmission path; and
a transmission path decoding processing unit configured to subject a signal obtained via said transmission path to transmission path decoding processing including at least processing for correcting an error caused at said transmission path;
wherein the signal obtained via said transmission path is a signal obtained by performing at least error correction encoding for correcting an error caused at said transmission path;
and wherein said error correction encoding includes LDPC (Low Density Parity Check) coding;

and wherein said transmission path decoding processing unit includes
- M computing means configured to simultaneously perform, regarding Q multiple nodes with said M being equal to or greater than said Q, the computation of a check node and the computation of a variable node for decoding LDPC code, and
- cyclic shift means configured to cyclically shift said Q messages corresponding said Q branches obtained as a result of one of the computation of said Q check nodes, and the computation of said Q variable nodes for the other computation to be performed next;

and wherein said cyclic shift means include
- a barrel shifter configured to perform cyclic shift of M units for cyclically shifting parallel data made up of M pieces of input data to output M pieces of shift data, and
- a selecting circuit configured to select said M pieces of shift data that said barrel shifter outputs, as M pieces of output data obtained by cyclically shifting said M pieces of input data;

and wherein in the event that said Q is equal to said M, said computing means output said M messages, and said parallel data made up of said M pieces of said input data is cyclically shifted with said M messages as said M pieces of said input data,
- said selecting circuit selects and outputs said first through M'th shift data from the head in the direction of cyclic shift that said barrel shifter performs, as said first through M'th output data;

and wherein in the event that said Q is equal to N smaller than said M,
said computing means output said N messages,
and said parallel data made up of said N pieces of said input data is cyclically shifted by shift amount k less than N as said N pieces of said input data,
- said selecting circuit selects and outputs said first through N−k'th shift data from the head in the direction of cyclic shift that said barrel shifter performs, as said first through N−k'th output data,
- and selects and outputs said N−k+1+(M−N) through N+(M−N)'th shift data from the head in the direction of cyclic shift that said barrel shifter performs, as N−k+1 through N'th output data.

* * * * *